(12) United States Patent
Martinez et al.

(10) Patent No.: US 11,727,225 B2
(45) Date of Patent: Aug. 15, 2023

(54) SYSTEMS AND METHODS FOR ENCODING AND DECODING DATA

(71) Applicant: Hand Held Products, Inc., Charlotte, NC (US)

(72) Inventors: Rene Martinez, Seattle, WA (US); Shashidhar Ramamurthy, Seattle, WA (US); James Peternel, Edmonds, WA (US)

(73) Assignee: HAND HELD PRODUCTS, INC., Charlotte, NC (US)

( * ) Notice: Subject to any disclaimer, the term of this patent is extended or adjusted under 35 U.S.C. 154(b) by 0 days.

(21) Appl. No.: 17/563,639

(22) Filed: Dec. 28, 2021

(65) Prior Publication Data
US 2022/0121830 A1 Apr. 21, 2022

Related U.S. Application Data

(63) Continuation of application No. 16/720,625, filed on Dec. 19, 2019, now Pat. No. 11,244,126.

(51) Int. Cl.
*G06K 7/10* (2006.01)
(52) U.S. Cl.
CPC ................. *G06K 7/10198* (2013.01)
(58) Field of Classification Search
CPC .................................................. G06K 7/10198
See application file for complete search history.

(56) References Cited

U.S. PATENT DOCUMENTS 6,196,466 B1 * 3/2001 Schuessler .............. H03M 7/30
235/494
8,188,839 B2 5/2012 Schuessler et al.
(Continued)

FOREIGN PATENT DOCUMENTS

WO 98/47101 A2 10/1998

OTHER PUBLICATIONS

"Bar Code Compression Decompression", IBM Technical Disclosure Bulletin, International Business Machines Corp. (Thornwood), US, vol. 32, No. 12, May 1, 1990 (May 1, 1990), pp. 288-290, XP000105365.
(Continued)

*Primary Examiner* — Rafferty D Kelly
(74) *Attorney, Agent, or Firm* — Alston & Bird LLP

(57) ABSTRACT

An encoding method is illustrated. The method includes receiving data to be encoded onto a storage media, wherein the data corresponds to an item and is assigned to a data category. Further, the method includes parsing data into a plurality of data portions, based on one or more first characteristics associated with each of one or more characters in the data. The method further includes encoding, by the processor, the plurality of data portions using a plurality of encoding schemes, to generate a data packet, such that a first data portion of the plurality of data portions is encoded using a first encoding scheme of the plurality of encoding schemes and a second data portion of the plurality of data portions is encoded using a second encoding scheme of the plurality of encoding schemes, wherein the first encoding scheme is different from the second encoding scheme. Furthermore, the method includes transmitting the data packet, wherein the data packet is configured to be stored in the storage media.

20 Claims, 27 Drawing Sheets

(56) References Cited

U.S. PATENT DOCUMENTS

| | | | |
|---|---|---|---|
| 8,698,603 | B2 | 4/2014 | Jett et al. |
| 2004/0028049 | A1 | 2/2004 | Wan |
| 2010/0065636 | A1* | 3/2010 | Byun .................... G06Q 10/08 |
| | | | 341/1 |
| 2010/0302078 | A1 | 12/2010 | Schuessler |
| 2016/0134682 | A1 | 5/2016 | Bolling |
| 2016/0371825 | A1 | 12/2016 | Kurkure et al. |

OTHER PUBLICATIONS

Advisory Action (PTOL-303) dated Feb. 25, 2021 for U.S. Appl. No. 16/720,625.
European Search Report and Search Opinion Received for EP Application No. 20211384.1, dated May 25, 2021, 9 pages.
Final Rejection dated Dec. 21, 2020 for U.S. Appl. No. 16/720,625.
GS1 EPC Tag Date Standard 1.7, 2013 [online] retrieved on Mar. 18, 2020] retrieved from the Internet URL: https://www.gs1.org/sites/default/files/docs/epc/tds_1_7-Std.pdf, 226 pages.
International Post Corporation: "IPC RFID Standard for Indentifying Postal Items Based on the UPU S10 Code, Using the ISO/IEC 18000-63 PROTOCOL", Feb. 22, 2017 (Feb. 22, 2017), XP055802812.
IPC RFID Standard For Indentifying Postal Items Based on the UPUS10 Code, Using the ISO/IEC 18000-63 Protocol, 2017 [online] [retrieved Mar. 18, 2020] retrieved from the Internet URL: https://www.google.com/search?q=IPC+RFID+Standard+For+Indentifying+Postal+Items+Based+On+The+UPUS10+Code+Using+The+ISO IEC+18000-63+Protocol&rlz, 42 pages.
Non-Final Rejection dated Jul. 20, 2020 for U.S. Appl. No. 16/720,625.
Non-Final Rejection dated Mar. 29, 2021 for U.S. Appl. No. 16/720,625.
Notice of Allowance received for U.S. Appl. No. 16/720,625, dated Sep. 29, 2021, 8 pages.
Notice of the Amendment issued in Chinese Application No. 202011396771.9 dated Jan. 8, 2021, 1 page.
Panagiotis Nasiopoulos: "Adaptive Compression Coding", Master's thesis, Aug. 1, 1988 (Aug. 1, 1988), XP055109353.
Teskey, Turning RFID Data Into Information [online] [retrieved Mar. 18, 2020] retrieved from the Internet URL: http://www.devx.com/enterprise/Article/32251, 2 pages.

* cited by examiner

SYSTEMS AND METHODS FOR ENCODING AND DECODING DATA

CROSS-REFERENCE TO RELATED APPLICATIONS

This application is a continuation of U.S. patent application Ser. No. 16/720,625, filed Dec. 19, 2019, which is hereby incorporated herein by reference in its entirety.

TECHNOLOGICAL FIELD

Exemplary embodiments of the present disclosure relate generally to encoding and decoding data and, more particularly, to methods and systems for encoding and decoding data to/from a storage medium.

BACKGROUND

Typically, an amount of storage space required to store data on a storage medium such as, but not limited to, an RFID tag and a print media may be dependent on a size of the data. For example, a string of 100 characters may require more storage space in comparison to a string of 50 characters. In some scenarios, the storage space available in such storage media may be limited, which, in turn, limits, in some examples, the amount of data that can be stored on such storage media.

Applicant has identified a number of deficiencies and problems associated with conventional systems and methods for encoding and decoding data. Through applied effort, ingenuity, and innovation, many of these identified problems have been solved by developing solutions that are included in embodiments of the present disclosure, many examples of which are described in detail herein.

BRIEF SUMMARY

Various embodiments illustrated herein disclose a method that includes receiving, by a processor, data to be encoded onto a storage media, wherein the data corresponds to an item and is assigned to a data category. The method further includes parsing, by the processor, data into a plurality of data portions, based on one or more first characteristics associated with each of one or more characters in the data, wherein the one or more first characteristics include at least a position of the one or more characters in the data. the method further includes encoding, by the processor, the plurality of data portions using a plurality of encoding schemes, to generate a data packet, such that a first data portion of the plurality of data portions is encoded using a first encoding scheme of the plurality of encoding schemes and a second data portion of the plurality of data portions is encoded using a second encoding scheme of the plurality of encoding schemes, wherein the first encoding scheme is different from the second encoding scheme. Furthermore, the method includes transmitting the data packet to a storage media for storage of the data packet on the storage media.

Various embodiments illustrated herein disclose an encoder apparatus that includes a memory device comprising a set of executable instructions. Further encoder apparatus includes a processor communicatively coupled to the memory device. The processor is configured to receive data to be encoded onto a storage media, wherein the data corresponds to an item and is assigned to a data category. The processor is further configured to parse data into a plurality of data portions, based on one or more first characteristics associated with each of one or more characters in the data, wherein the one or more first characteristics include at least a position of the one or more characters in the data and a semantic information associated with the position of the one or more characters in the data. further, the processor is configured to select a plurality of encoding schemes to encode the plurality of data portions based on one or more second characteristics associated with each data portion of the plurality of data portions, wherein the one or more second characteristics comprises at least a count of a set of characters in each data portions of the plurality of data portions. furthermore, the processor is configured to encode the plurality of data portions using a plurality of encoding schemes, to generate encoded data, such that a first data portion of the plurality of data portions is encoded using a first encoding scheme of the plurality of encoding schemes and a second data portion of the plurality of data portions is encoded using a second encoding scheme of the plurality of encoding schemes, wherein the first encoding scheme is different from the second encoding scheme; Additionally, the processor is configured to generate a data packet based on the encoded data. Finally, the processor is configured to transmit the data packet to the storage media.

Various embodiment illustrated herein disclose a computer-readable medium, comprising a memory that stores computer-executable instructions and a processor that executes the computer-executable instructions to perform operations, comprising parsing data into a plurality of data portions, based on a characteristic associated with a character in the data, wherein the characteristic comprises at least a position of the character in the data. the operation further comprises encoding the plurality of data portions using a plurality of encoding schemes, to generate a data packet, such that a first data portion of the plurality of data portions is encoded using a first encoding scheme of the plurality of encoding schemes and a second data portion of the plurality of data portions is encoded using a second encoding scheme of the plurality of encoding schemes, wherein the first encoding scheme is different from the second encoding scheme. The operation further comprises transmitting the data packet to a device comprising storage media to facilitate storage of the data packet in the storage media.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
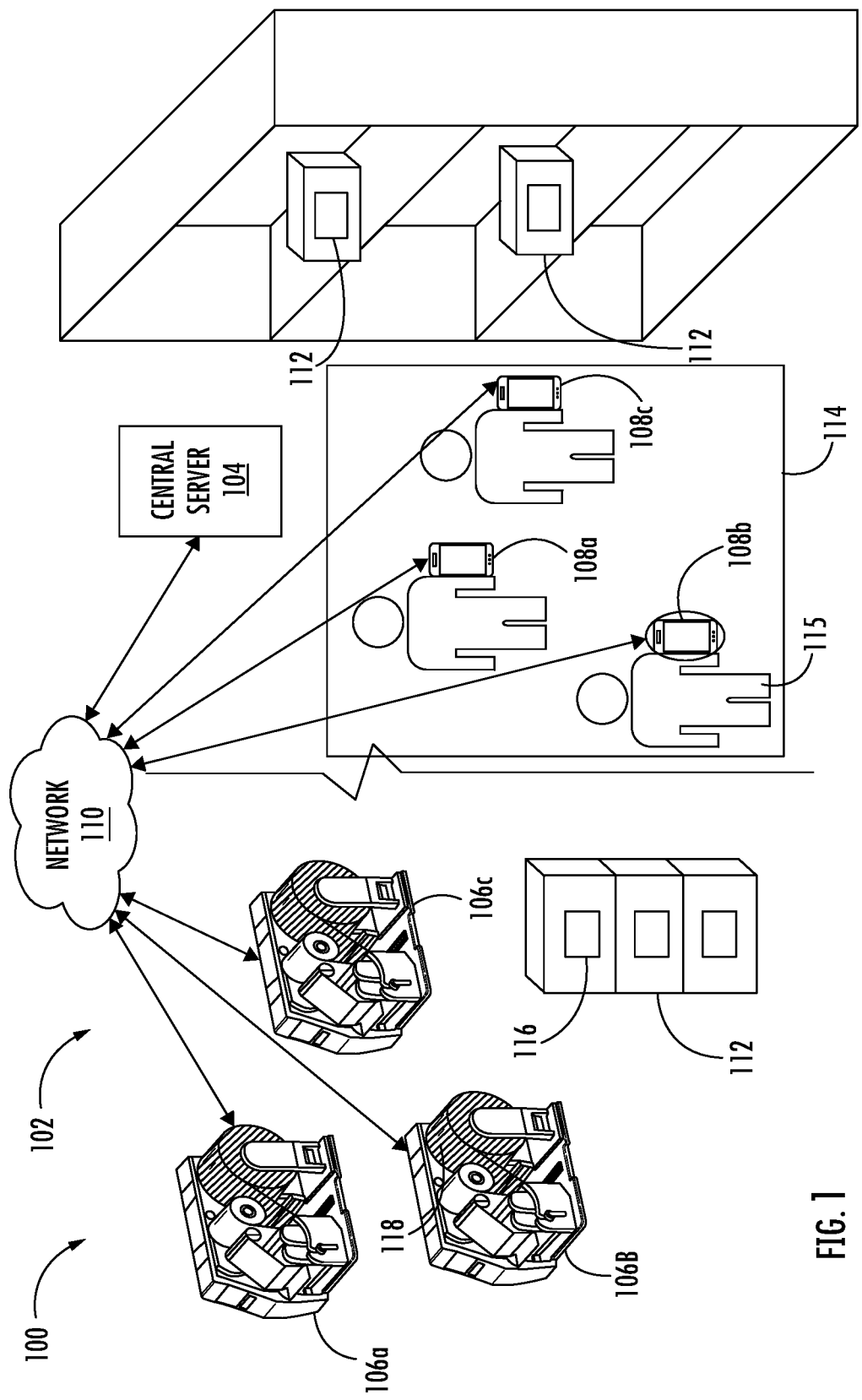
FIG. 1 illustrates an exemplary environment depicting a warehouse, according to one or more embodiments described herein.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout. Terminology used in this patent is not meant to be limiting insofar as devices described herein, or portions thereof, may be attached or utilized in other orientations.

The term "comprising" means including but not limited to, and should be interpreted in the manner it is typically used in the patent context. Use of broader terms such as "comprises," "includes," and "having" should be understood to provide support for narrower terms such as "consisting of," "consisting essentially of," and "comprised substantially of."

The phrases "in one embodiment," "according to one embodiment," and the like generally mean that the particular feature, structure, or characteristic following the phrase may be included in at least one embodiment of the present disclosure, or may be included in more than one embodiment of the present disclosure (importantly, such phrases do not necessarily refer to the same embodiment).

The word "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

The term "radio frequency (RF) tag" is used herein to correspond to an electronic component that transmits or receives information or date via an antenna. In some examples, the RF tag includes an integrated circuit (IC), an antenna element, and a substrate. In an example embodiment, the antenna element is fabricated on the substrate and the IC is attached to the substrate. Further, the IC is communicatively coupled to the antenna element through an interconnect on the substrate. In an example embodiment, the integrated circuit in the RF tag may be configured to store encoded information or encoded data. In some examples the RF tag may be configured to operate in various RF frequency bands such as, but not limited to, 13.56 MHz (hereinafter High Frequency Band) or 860 MHz-960 MHz (UHF band). In some example embodiments, the RF tag may have a dedicated power source that may enable the RF tag to communicate with one or more components, such as an RF encoder and an RF reader. Such RF tags are referred to as active RF tags.

In alternative example embodiments, the RF tag may not have a dedicated power source. In such embodiments, the RF tag may have a power coupler that is capable of inducing electrical charge when the RF tag is brought in an RF field. The induced electrical charge is thereafter used to power the RF tag, itself.

The word "media" is used herein to mean a printable medium, such as a page or paper, on which content, such as graphics, text, and/or visual images, may be printable. In some embodiments, the media may correspond to a continuous media that may be loaded in an encoder apparatus in form of a roll or a stack, or may correspond to media that may be divided into a plurality of labels through perforations defined along a width of the media. Alternatively or additionally, the media may be divided into the plurality of labels through one or more marks that are defined at a predetermined distance from each other, along the length of the media. In some example embodiments, a contiguous stretch of the media, between two consecutive marks or two consecutive perforations, corresponds to a label of the media. In an example embodiment, each label of the plurality of labels includes an RF tag. In some embodiments, the media may correspond to a thermal media on which the content is printed on application of heat on the media itself.

It is commonly understood that storage mediums such as, but are not limited to, RFID tags and print medium have limited storage space, which, in turn and in some examples, limits an amount of data that can be stored on such storage mediums. To increase the amount of data that can be stored on such storage mediums, usually, the data may be encoded prior to storing it on the storage medium. In some examples, encoding the data compresses the data, thereby reducing the size of the data.

In an example embodiment, encoding data and/or otherwise compressing into an encoded form may correspond to a process where the data in a first form may be transformed into data into a second form such that, in some examples, the data in the second form (hereinafter referred to as encoded data) may consume less storage space on the storage medium in comparison to the storage space consumed by the data in the first form. For example, a string of characters may be encoded as integers (e.g., ASCII numbers) such that each integer is representative of a character in the string. In another example, a decimal integer may be encoded as binary number.

Example methods and systems described herein disclose another method for encoding the data such that the encoded data consumes less space in comparison the conventional encoded data. In some examples, to encode the data, the data is parsed to obtain a plurality of data portions. Thereafter, each data portion of the plurality of data portions may be encoded using different encoding schemes to obtain encoded data. For example, a first data portion of the plurality of data portions is encoded using a first encoding scheme, while a second data portion of the plurality of data portions is encoded using a second encoding scheme, where the first encoding scheme is different from the second encoding scheme.

Further, since different encoding schemes are used to encode the plurality of data portions, therefore, each data portion can be decoded individually. Accordingly, in some scenarios where it may be required to obtain a specific data portion of the encoded data, that specific data portion is decoded instead of complete encoded data. Accordingly, such decoding of only the specific data portion instead of complete encoded data may be less computationally intensive, may be accomplished more quickly, and/or the like.

Specifically, in some examples embodiments, the systems and methods described herein correspond to encoding data to be stored on a storage medium. The method includes parsing the data (to be stored on the storage medium) to obtain a plurality of data portions based on one or more first characteristics associated with each character in the data. In some examples, the one or more first characteristics associated with a character may include at least one of a position of the character within the data and semantic information associated with the character. For example, if the data corresponds to a string of characters "ABCD", the position of the character "C" is three. By way of further example, the semantic information associated with the character may correspond to information that the character individually, or in combination with the other characters, represent. For example, if the data corresponds to a package tracking number such as "1Z 999 AA1 01 2345 6784", character "Z" in combination with the first character "1" represents a unique ID associated with the courier organization. In some examples, the semantic information associated with the character is deterministic from the position of the character in the data. For example, the character "1" at the first position may be a part of the unique ID associated with the courier organization, which is handling the package logistics, whereas a "1" in another location in the string may be representative of a destination, a package identification, and/or the like.

In an example embodiment, during parsing of the data, the characters having at least one common first characteristic of the one or more first characteristics are classified under same data portion of the plurality of data portions. For example, the characters having same associated semantic information are classified under the same data portion of the plurality of data portions. Accordingly, the characters "1" and "Z" are classified under same data portion (e.g., a first data portion) during parsing of the data. Similarly, the characters "9", "9", "9", "A", "A", and "1" are classified in another data portion (e.g., a second data portion). Furthermore, the characters "2", "3", "4", "5", "6", "7", "8", and "4" are classified in yet another data portion (e.g., a third data portion). After parsing of the data, each of the plurality of data portions may include a first set of characters.

The method further includes determining a plurality of encoding schemes for the plurality of data portions based on the at least one common first characteristic associated with the set of characters and one or more second characteristics. In some examples, the one or more second characteristics may be associated with each data portion of the plurality of data portions, and may include a count of characters in the set of characters. For example, the count of characters in the data portion that includes the characters "999 AA1" may be "six".

In some examples, to determine the encoding scheme for a particular data portion, the method includes determining whether the count of the first set of characters in the data portion is in a first range between a first threshold count value and a second threshold count value. If it is determined that the count of the first set of characters in the data portion is in the first range between the first threshold count value and the second threshold count value, optionally, the method further determines whether the count of the first set of characters is a multiple of a first integer. In an example embodiment, the first integer is determined based on the second threshold count value and the first threshold count value. For example, the first integer is determined by dividing the second threshold count value by the first threshold count value. For instance, if the first threshold count value is two and the second threshold count value is six, then the first integer is three. If it is determined that the count of the first set of characters is divisible by the first integer, the method includes selecting a first encoding scheme for encoding the data portion.

However, if it is determined that the count of the first set of characters is not in the first range between the first threshold count value and the second threshold count value, the method proposes to determine whether the count of the first set of characters is equal to the first threshold count value. If the count of the first set of characters is equal to the first threshold count value, the method includes selecting a second encoding scheme for encoding the data portion. Further, if it is determined that the count of the first set of characters is not equal to the first threshold count value, the method includes selecting the third encoding scheme for encoding the data portion.

In some examples, the first encoding scheme is URN 40 encoding scheme, the second encoding scheme is URN 40 lite encoding scheme, and the third encoding scheme is binary encoding scheme. Various encoding schemes have been further described in conjunction with the various figures below. In some examples, the scope of the disclosure is not limited to the encoding schemes listed above. In an example embodiment, other encoding schemes may be utilized to encode the plurality of data portions, without departing from the scope of the disclosure.

For example, the first threshold count value is two and the second threshold count value is six, and the first integer is three. To this end, regarding the second data portion that includes "999AA1", the count of the first set of characters in the data portion is six, which in the first range between the first threshold count value (i.e., 2) and the second threshold count value (i.e., 6). Further, the count of the first set of characters in the data portion (i.e., 6) is divisible by the first integer (i.e., 3). Accordingly, the URN 40 encoding scheme may be selected for the data portion containing the characters "999AA1". Similarly, for the second data portion that includes "1Z", the count of first set of characters (i.e., 2) is equal to the first threshold count value (i.e., 2). Therefore, URN 40 lite encoding scheme may be selected for the second data portion that includes the first set of characters "1Z". Furthermore, for the third data portion that includes "23456784", the count of the first set of characters (i.e., 8) is not equal to the first threshold count value. Accordingly, third encoded scheme may be selected for the third data portion.

In some examples, the scope of the disclosure is not limited to selecting the plurality of encoding schemes based on the method described above. In an alternate embodiment, the plurality of encoding schemes may be determined based on the semantic information associated with the first set of characters in the data portion of the plurality of data portions. For example, the first data portion containing the set of characters representing the unique ID of the courier organization is to be encoded using second encoding scheme. Similarly, the data portion containing the first set of characters representing the zip code is to be encoded using third encoding scheme. Such mapping between the semantic information and the plurality of encoding schemes may be pre-stored in the memory of an apparatus that is capable of encoding the data and/or otherwise be accessed at the time of encoding.

After determining the plurality of encoding schemes for the plurality of data portions, the method includes encoding each data portion of the plurality of data portions using the respective encoding scheme to generate a plurality of encoded data portions. Thereafter, the method includes combining the plurality of encoded data portions to generate the encoded data.

Additionally or alternatively, the method further includes generating a data packet by adding header data and error correcting data to the encoded data. In some examples, the scope of the disclosure is not limited to adding the header data and the error correcting data after encoding the data. In some examples, the header data and the error correction data may be added to the data prior to encoding of the data. In such an embodiment, the header data and the error correction data may be encoded during encoding of the data. Additionally or alternatively, the data may be received via a packet that already includes header data and the error correction data.

After creation of the data packet, the method includes transmitting and/or otherwise causing the data packet to be transmitted to a storage medium such as the RF tag and/or the print medium, where the data packet is stored or printed. In some examples, the method include converting the data packet into binary bits prior to transmitting the data packet to the storage medium.

To decode the data from the data packet, the data packet is retrieved from the storage medium. Thereafter, the method includes parsing the data packet to retrieve the plurality of encoded data portions, based on at least a position of the binary bits (representing the encoded characters in the encoded data). As discussed, the encoding scheme, used to encode the data portion, is determined based on at least the semantic information associated with the set of characters in the data portion, which is further determined based on the position of the characters in the data. Accordingly, in the data packet, the position of the encoded characters in the data packet is deterministic of the encoding scheme that was used to generate the encoded character. In some examples, the data packet is parsed in such a manner that the encoded characters, which have been encoded using same encoding scheme, are classified as an encoded data portion. For example, the URN 40 encoded characters in the data packet are classified as the encoded data portion. In an example embodiment, each of the plurality of encoded data portions includes a set of encoded characters.

Subsequently, the plurality of encoded data portions is decoded using respective decoding schemes to obtain the plurality of data portions. Since the data packet may be parsed to obtain the plurality of encoded data portions and each of the plurality of encoded data portions can be decoded independently, therefore, in scenarios, where only the data portion needs to be retrieved from the storage medium, the complete data packet need not be decoded to retrieve the data portion. Such a process, in some examples, is less computationally intensive in comparison to decoding the complete data packet and, thereafter, retrieving the requisite data portion. Further, encoding the plurality of data portions using the plurality of encoding schemes enables the more control on the amount of storage space required to store the encoded data. For example, the type of encoding schemes selected for encoding the plurality of data portions may govern the size of the encoded data and, accordingly, governs storage space required to store the encoded data.

FIG. 1 illustrates an exemplary environment 100 depicting a warehouse 102, according to one or more embodiments described herein. The warehouse 102 includes a central server 104, one or more encoder apparatus 106a, 106b, . . . , 106d (hereinafter referred to as encoder apparatus 106), and one or more decoder apparatuses 108a, 108b, . . . 108d (hereinafter referred to as decoder apparatuses 108). In an example embodiment, the encoder apparatus 106 and the decoder apparatuses 108 are communicatively coupled to the central server 104 through the network 110.

In some examples, the encoder apparatus 106 and decoder apparatuses 108 may facilitate tracking of the packages 112 transiting through the warehouse 102. For example, the encoder apparatus 106 may facilitate generation of the encoded tags, as is described in FIG. 10, which may be attached to the packages 112. For instance, the encoder apparatus 106 may receive data from an input source 114, which is utilized to generate the encoded tags. In some examples, the input source 114 may correspond to a worker 115, or another computing device such as the central server 104 that may be capable for providing input to the encoder apparatus 106 and/or the decoder apparatus 108. For brevity, the input source 114 has been considered as the worker 115. However, those skilled in the art would understand that the input source 114 may correspond to any other manual or automated source (such as the central server 104).

In some examples, the generated encoded tags may be attached to the package 112. In some examples, the encoded tags may include a Radio frequency (RF) tag 116 that may store the encoded data or data in original form (which is used to track the package 112). In another example embodiment, the encoded tag may correspond to a print media 118 on which the encoded data is printed and is attached to the package 112.

Figure 18:
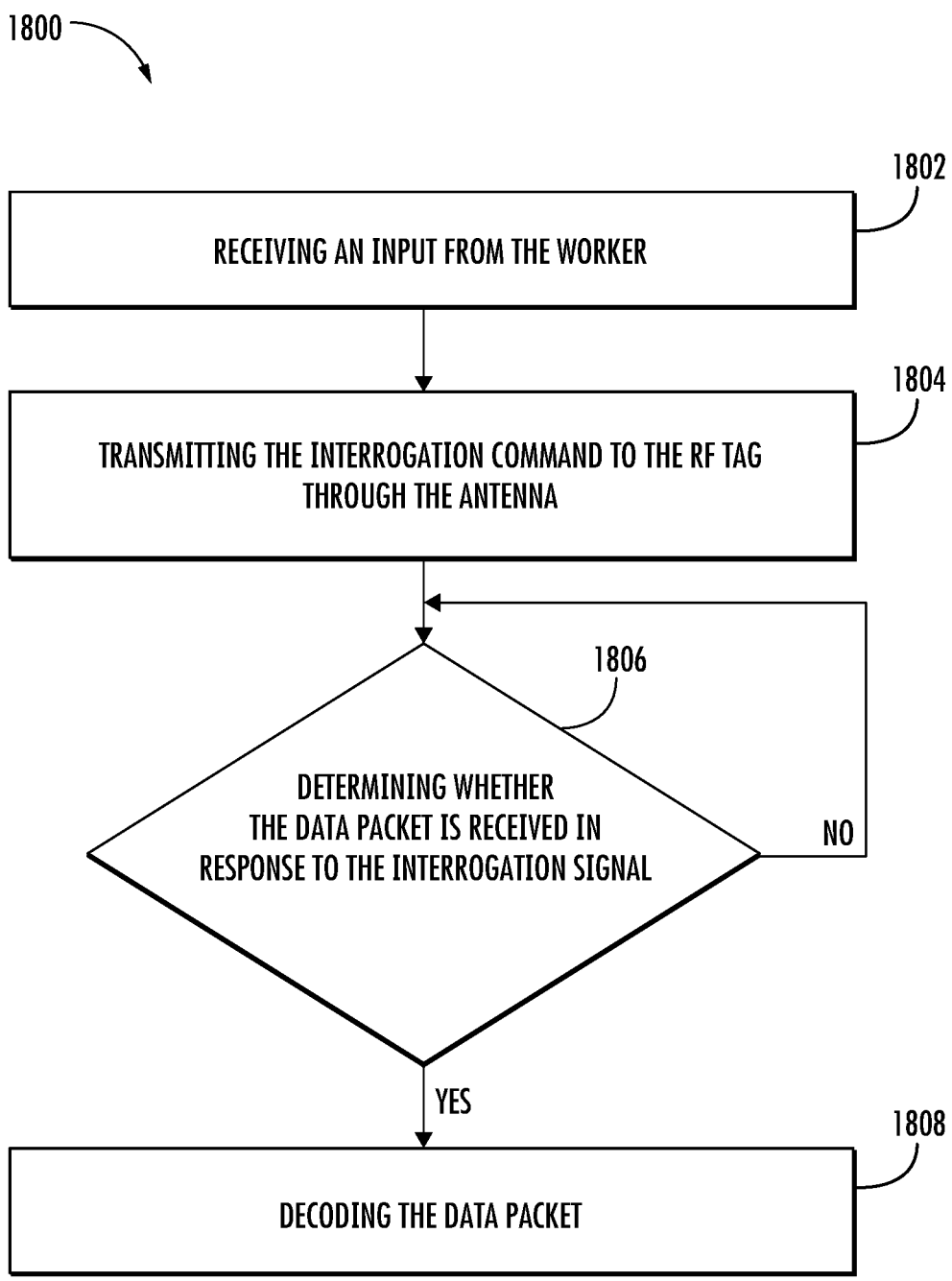
FIG. 18 illustrates a flowchart of a method for operating the decoder apparatus, according to one or more embodiments described herein.

To track the package 112 in the warehouse 102, in some examples, the worker 115 may utilize the decoder apparatuses 108 to retrieve the data from the tagged packages 116, as is further described in conjunction with FIG. 18.

The encoder apparatus 106 may include suitable logic and/or circuitry that may enable the encoder apparatus 106 to encode data. Further, the encoder apparatus 106 may store the encoded data on the RF tag 116. In an alternate embodiment, the encoder apparatus 106 may print the encoded data on the print media 118. In some examples, the encoder apparatus 106 may print the encoded data on the print media 118 in form of an indicia. The structure and operation of the encoder apparatus 106 is further described in conjunction with FIGS. 2A-2C and FIG. 10.

The decoder apparatus 108 may include suitable logic and/or circuitry that may enable the decoder apparatus 108 to retrieve the encoded data from the RF tags 116 and/or the printed media 118. In an example embodiment, the decoder apparatus 108 may further decode the encoded data to retrieve the data or portion of data. The operation and structure of the decoder apparatus 108 is described in conjunction with FIGS. 17-18.

In some examples, the scope of the disclosure is not limited to a warehouse 102. In some examples, the aspects and features of the disclosure may implemented in other environment or applications areas, such as a retail outlet, a logistics vehicle, and/or the like, without departing from the scope of the disclosure. Further, the scope of the disclosure is not limited to the data being a tracking number for the package 112. In some examples, the other types of data (depending on the application where the features of the disclosure are implemented) may encoded and stored on the print media 118 or the RF tag 116. For example, a card number, a product identifier, SKU number, and/or the like may be stored in the RF tag 116, without departing from the scope of the disclosure.

Figure 2A:
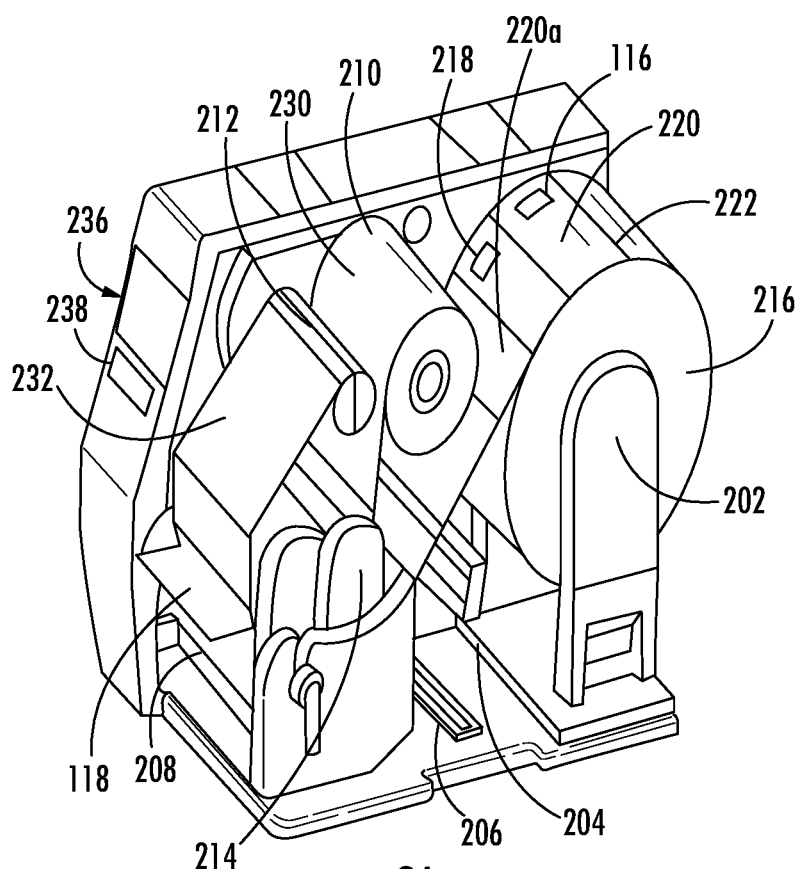
FIGS. 2A-2C illustrate an encoder apparatus, according to the one or more embodiments described herein.
Figure 2B:
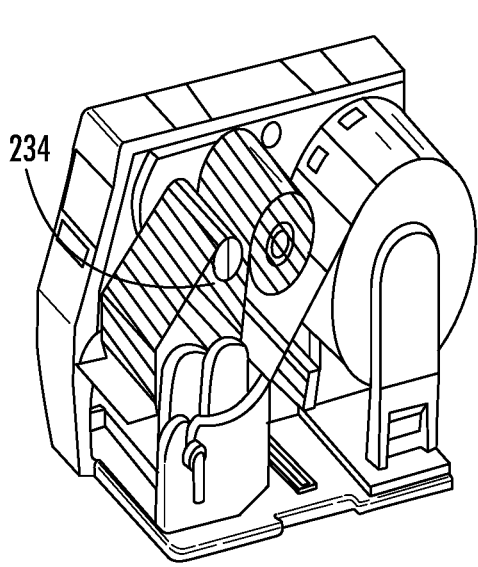
Figure 2C:
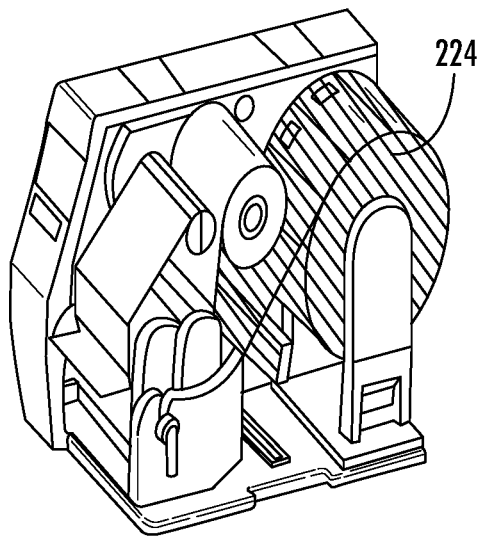

FIGS. 2A-2C illustrate an encoder apparatus 200, according to the one or more embodiments described herein. The encoder apparatus 200 may include a media hub 202, a coupler 204, a encoder apparatus control system 206, and a media output slot 208. In some examples, the encoder apparatus 200 further includes a ribbon drive assembly 210, a ribbon take-up hub 212, and a print head 214.

In some example embodiments, the media hub 202 is configured to receive a media roll 216. In some examples, the media roll 216 may correspond to a roll of a media 218 that may have a plurality of labels 220. The plurality of labels 220 may be defined on the media 218 by means of perforations 222. In alternative embodiments, the plurality of labels 220 may be defined on the media 218 by means of one or more marks (not shown). In some examples, the media hub 202 may be coupled to a first electrical drive (not shown) that actuates the media hub 202. On actuation, the media hub 202 causes the media roll 216 to rotate, which further causes the media 218 to travel/traverse along a media path 224 (as shown in the shaded portion in FIG. 2C).

In some example embodiments, the scope of the disclosure is not limited to the media hub 202 facilitating the traversal of the media 218 along the media path 224. In alternative embodiment, the encoder apparatus 200 may further include a platen roller (illustrated in FIG. 3), in addition to the media hub 202, that may be positioned along the media path 224. In such an embodiment, the platen roller (illustrated in FIG. 3) may be coupled to the first electrical drive, which actuates the platen roller. On actuation, the platen roller may be configured to pull the media 218 from the media roll 216 (mounted on the media hub 202), causing the media 218 to travel along the media path 224. Additionally or alternately, the first electrical drive may be coupled to both the platen roller and the media hub 202 such that both the platen roller and the media hub 202 operate in sync.

The coupler 204 corresponds to an antenna element that is positioned adjacent to the media path 224. In an example embodiment, the coupler 204 may be configured to generate RF signals when a voltage signal is applied at the antenna element. For example, the coupler 204 may be configured to generate the RF signal in HF frequency band. In another example, the coupler 204 may generate the RF signal in the UHF frequency band. Some examples of the coupler 204 may include, but are not limited to, Bow tie antenna, dipole antenna, monopole antenna, loop antenna, and/or the like. In an example embodiment, the coupler 204 may facilitate transmission/reception of the encoded data to/from the RF tag 116 provided on each of the plurality of labels 220 (on the media 218).

The encoder apparatus control system 206 may include suitable logic and circuitry to control the operation of at least the encoder apparatus 106. For example, the encoder apparatus control system 206 may be configured to control the operation of the coupler 204. In some examples, the encoder apparatus control system 206 includes an encoder that may be configured to encode the data and facilitate transmission of the encoded data to the RF tag 116 through the coupler 204. Further, the encoder apparatus control system 206 may include a decoder that may facilitate reception of the encoded data from the RF tag 116 through the coupler 204. The structure and operation of the encoder apparatus control system 206 is described in conjunction with FIG. 4.

In some examples, after the encoder apparatus control system 206 causes the coupler 204 to transmit the encoded data to the RF tag 116 on the label 220a of the plurality of labels 220, the label 220a, having the encoded RF tag 116, is outputted from the media output slot 208. In an example embodiment, the media output slot 208 corresponds to a slot in a housing of the encoder apparatus 200, through which the label 220a with encoded RF tag 116 is outputted.

In addition to encoding the RF tag 116 on the label 220*a* of the plurality of labels 220, the encoder apparatus 106, in some example implementations, may print the content on the label 220*a* of the plurality of labels 220. For example, the encoder apparatus 106 may print the encoded data on the label 220*a*. To facilitate printing of the encoded data on the label 220, the encoder apparatus 200 may further include the ribbon drive assembly 210, the ribbon take-up hub 212, and the print head 214.

The ribbon drive assembly 210 may receive a ribbon roll 230 that corresponds to a roll of a ribbon 232. In an example embodiment, the ribbon 232 may correspond to an ink media that is utilized to dispose ink onto the media 218 to print content (e.g., encoded data) on the media 218 (e.g., label 220*a*). In some example implementations, the ribbon drive assembly 210 may be coupled to a second electrical drive that may be configured to actuate the ribbon drive assembly 210. On actuation, the ribbon drive assembly 210 rotates, which in turn causes the ribbon roll 230 to rotate and supply the ribbon 232 along a ribbon path 234 (as shown in the shaded in FIG. 2B). Along the ribbon path 234, the ribbon 232 traverses from the ribbon drive assembly 210 to the print head 214 and further to the ribbon take-up hub 212.

In an example embodiment, the ribbon take-up hub 212 may correspond to an assembly that may receive used ribbon (i.e., a section of the ribbon 232 from which the ink has been is disposed on the media 218). The ribbon take-up hub 212 may also be coupled to the second electrical drive that may be configured to actuate the ribbon take-up hub 212. On actuation of the second electrical drive, the ribbon take-up hub 212 pulls the ribbon 232 from the ribbon roll 230, causing the ribbon 232 to move along the ribbon path 234. In an example embodiment, the second electrical drive (coupled to both the ribbon drive assembly 210 and the ribbon take-up hub 212) enables synchronized operation of the ribbon drive assembly 210 and the ribbon take-up hub 212 such that the amount of ribbon released by the ribbon roll 230 is equal to the amount of ribbon received by the ribbon take-up hub 212. For example, a length of the ribbon 232 released by the ribbon roll 230 is same as the length of the ribbon 232 received by the ribbon take-up hub 212.

The print head 214 may correspond to a component that is configured to print the content on the media 218 (e.g., label 220*a*). In an example embodiment, the print head 214 is provided on the media path 224 and the ribbon path 234. The print head 214 includes a plurality of heating elements (not shown) that are energized and pressed against the ribbon 232 to perform a print operation. During the print operation, the print head 214 concurrently applies heat on a section of the ribbon 232 and presses the ribbon 232 against the media 218 to transfer the ink on the media 218. In some examples, after the print operation, the media 218 and the ribbon 232 traverse along the media path 224 and the ribbon path 234, respectively, such that the printed media is outputted from the media output slot 208 and the used ribbon 232 traverses to the ribbon take-up hub 212.

In some examples, where the media 218 corresponds to thermal media, the ribbon 232 may not be required. In such an example, the print head 214 may directly apply heat on the media 218 to print content on the media 218.

In an example embodiment, the encoder apparatus 200 may be configured to operate in one or more modes. The one or more modes may include, but are not limited to, a calibration mode and an encoding mode. In an example embodiment, in the calibration mode, the encoder apparatus 200 is configured to calibrate itself, as further described in conjunction with FIG. 6. In an example embodiment, in the encoding mode, the encoder apparatus 200 is configured to perform an encoding operation as is further described in conjunction with FIG. 10.

In some example embodiments, the encoder apparatus 200 may further include an input panel 236 that includes one or more buttons 238 (e.g., one or more physical buttons and/or one or more virtual buttons on a screen). The one or more buttons 238 may correspond to input devices through which a user of the encoder apparatus 200 may provide inputs, causing the encoder apparatus 200 to perform a predetermined operation. For example, the user of the encoder apparatus 200 may provide input through the one or more buttons 238 to configure the encoder apparatus 200 to operate in the calibration mode. Some examples of the one or more buttons 238 may include, but are not limited to push buttons, soft push buttons, touch buttons, virtual buttons, and/or the like.

Figure 3A:
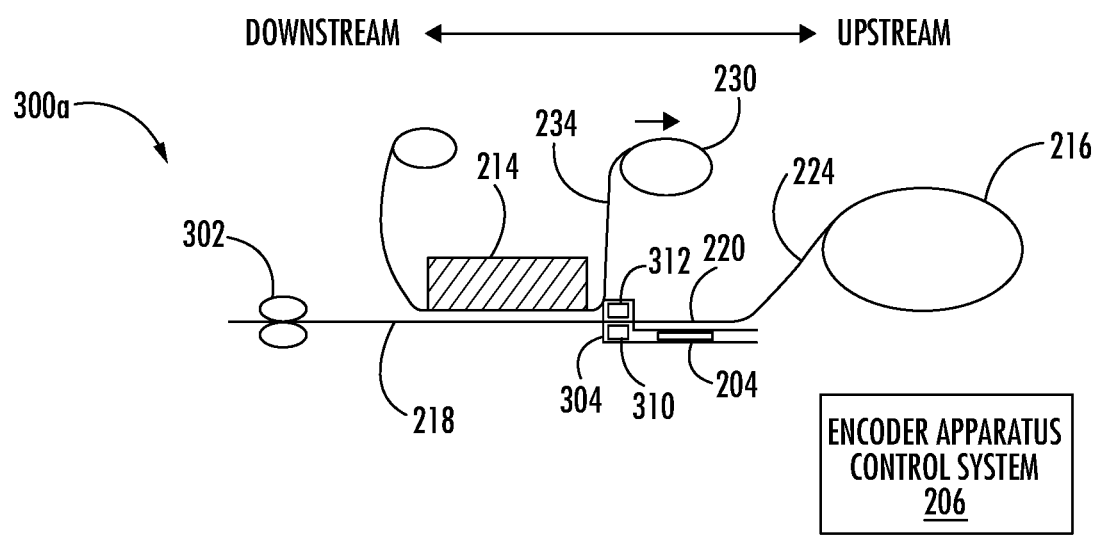
FIGS. 3A and 3B illustrate schematics of the encoder apparatus, according to one or more embodiments described herein.
Figure 3B:
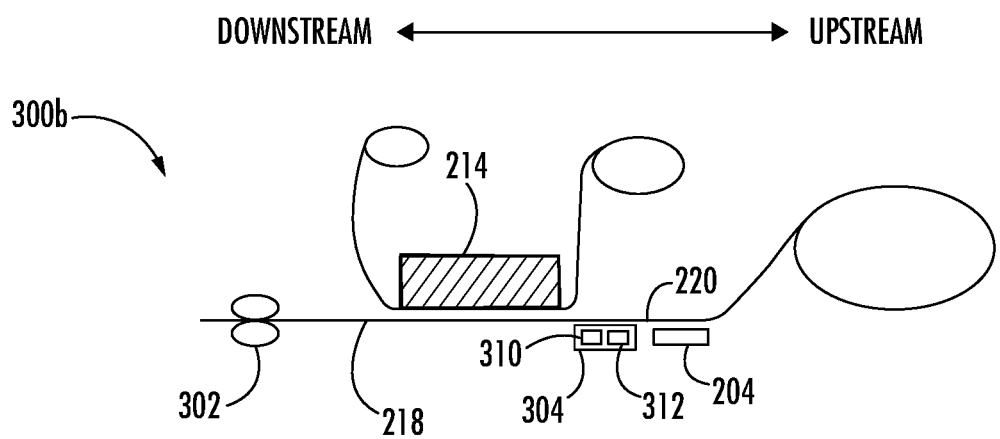

FIGS. 3A and 3B illustrate schematics 300*a* and 300*b* of the encoder apparatus 106, according to one or more embodiments described herein. The schematics 300*a* and 300*b* of the encoder apparatus 106 illustrate that the encoder apparatus 106 may further include a platen roller 302, a media sensor 304, and the encoder apparatus control system 206 in some embodiments. The schematics 300*a* and 300*b* of the encoder apparatus 106 further depicts the media path 224, and the ribbon path 234. Further, the schematics 300*a* and 300*b* illustrate that the coupler 204 is positioned adjacent to the media path 224 such that the coupler 204 is pointed towards the media 218 on the media path 224. Further, the coupler 204 is positioned upstream of the print head 214 and the media sensor 304. In an example embodiment, the term "upstream" according to the one or more embodiments described herein corresponds to a direction opposite to media traversal direction along the media path 224 during encoding of the RF tag 116 on the plurality of labels 220. In an example embodiment, the term "downstream" according to the one or more embodiments described herein corresponds to a direction same as the media traversal direction along the media path 224 during encoding of the RF tag 116 on the plurality of labels 220.

The print head 214 is positioned downstream of the media roll 216 along the media path 224, and downstream of the ribbon roll 230 along the ribbon path 234.

In an example embodiment, the print head 214 is positioned on top of both the ribbon path 234 and the media path 224 such that the ribbon path 234 is positioned between the print head 214 and the media path 224. Further, the ribbon path 234 is proximate to the print head 214 in comparison to the media path 224. During the print operation, the print head 214 moves in a vertically downward direction to press the ribbon 232 against the media 218 to perform the print operation.

In an example embodiment, the platen roller 302 is positioned downstream of the print head 214 along the media path 224. As discussed above, the platen roller 302 is coupled to the first electrical drive that enables the platen roller 302 to rotate and urge, cause, and/or otherwise pull the media 218 from the media roll 216 such that it travels along the media path 224.

The media sensor 304 may correspond to a sensor that is configured to detect a presence of the media 218 on the media path 224. In an example embodiment, the media sensor 304 is positioned upstream of the print head 214 and downstream of the coupler 204. In some example embodiments, the media sensor 304 may be configured to detect the presence of the media 218 by determining transmissivity and/or reflectivity of the media 218. In an example embodiment, the transmissivity of the media 218 may correspond to a measure of an intensity of a light signal that the media 218 allows to pass through it. In an example embodiment, the reflectivity of the media 218 may correspond to a measure of an intensity of light signal that is reflected from a surface of the media 218.

In an example embodiment, the media sensor 304 includes a light transmitter 310 and a light receiver 312. The light transmitter 310 may correspond to a light source, such as a Light Emitting Diode (LED), a LASER, and/or the like. The light transmitter 310 may be configured to direct the light signal on the media path 224.

The light receiver 312 may correspond to at least one of a photodetector, a photodiode, or a photo resistor. The light receiver 312 may generate an input signal based on an intensity of the light signal received by the light receiver 312. In an example embodiment, the input signal may correspond to a voltage signal, where one or more characteristics of the voltage signal, such as the amplitude of the voltage signal and frequency of the voltage signal, are directly proportional to the intensity of the portion of the light signal received by the light receiver 312.

In operation, the light transmitter 310 of the media sensor 304 may be configured to direct the light signal on the media path 224. If the media 218 is present on the media path 224, a portion of light signal may be reflected from the surface of the media 218. To detect the portion of the light signal reflected from the surface of the media 218, the light receiver 312 and the light transmitter 310 may be, in some examples, positioned in the same plane, as is depicted in the schematic 300b in FIG. 3B. In another example, the light receiver 312 may be positioned below the media path 224, and/or may not be positioned in the same plane as that of the light transmitter 310, without departing from the scope of the disclosure. The light receiver 312 may receive the portion of the light signal, and based on the intensity of the portion of the received light signal, the light receiver 312 generates the input signal. In some implementations, where the media 218 is not present on the media path 224, the light receiver 312 may not receive the portion of the light signal (transmitted by the light transmitter), and therefore may not generate the input signal. Accordingly, based on the input signal generated by the media sensor 304, the presence of the media 218 on the media path 224 may be determined.

Additionally or alternatively, the media sensor 304 may determine the presence of the media 218 on the media path 224 based on the transmissivity of the media 218. In such an implementation, the light receiver 312 may receive the portion of the light signal that passes through the media 218. To receive the portion of the light signal that passes through the media 218, the light receiver 312 is spaced apart from the light transmitter 310 in such a manner that the media of media roll 314 passes through a space between the light receiver 312 and the light transmitter 310. When the light transmitter 310 directs the light signal on the media 218, the portion of the light signal passes through the media 218, which is then received by the light receiver 312. The light receiver 312, thereafter, may generate the input signal in accordance with the intensity of the portion of light signal received.

In some embodiments, the media sensor 304 may be utilized to detect a start portion and an end portion of the label 220a of the plurality of labels 220 in the media 218. In an example embodiment, the start portion of the label 220a may correspond to a first perforation between the label 220a and another label preceding the label 220a. In an example embodiment, the end portion of the label 220a may correspond to a second perforation between the label 220a and a yet another label succeeding the label 220a. As discussed above, the media 218 may include the plurality of labels 220 that are separated either by perforations 222 or by the one or more marks (not shown). Therefore, when such marks or perforations 222 on the media 218 passes over the media sensor 304 during traversal of the media 218 along the media path 224, the media sensor 304 may detect a sudden increase/decrease in the measure of transmissivity/reflectivity of media 218. Such sudden increase/decrease in the measure of the transmissivity/reflectivity of media 218 is reflected in the input signal generated by the media sensor 304. For example, the input signal generated by the media sensor 304 may include peaks or valleys indicating a sudden increase or decrease in the measure of the transmissivity/reflectivity of media 218. Such peaks and valleys may be utilized to determine the start portion or the end portion of the label 220a of the plurality of labels 220.

Referring back to FIG. 2A, in some example embodiments, the scope of the disclosure is not limited to the encoder apparatus 106 that performs both the RF tag encoding and the printing operation. In some example implementations, the encoder apparatus 106 may not perform the printing operation and may only perform the RF tag encoding operation. In such implementation, the encoder apparatus 106 may not include the print head 214, the ribbon drive assembly 210, and the ribbon take-up hub 212.

Figure 4:
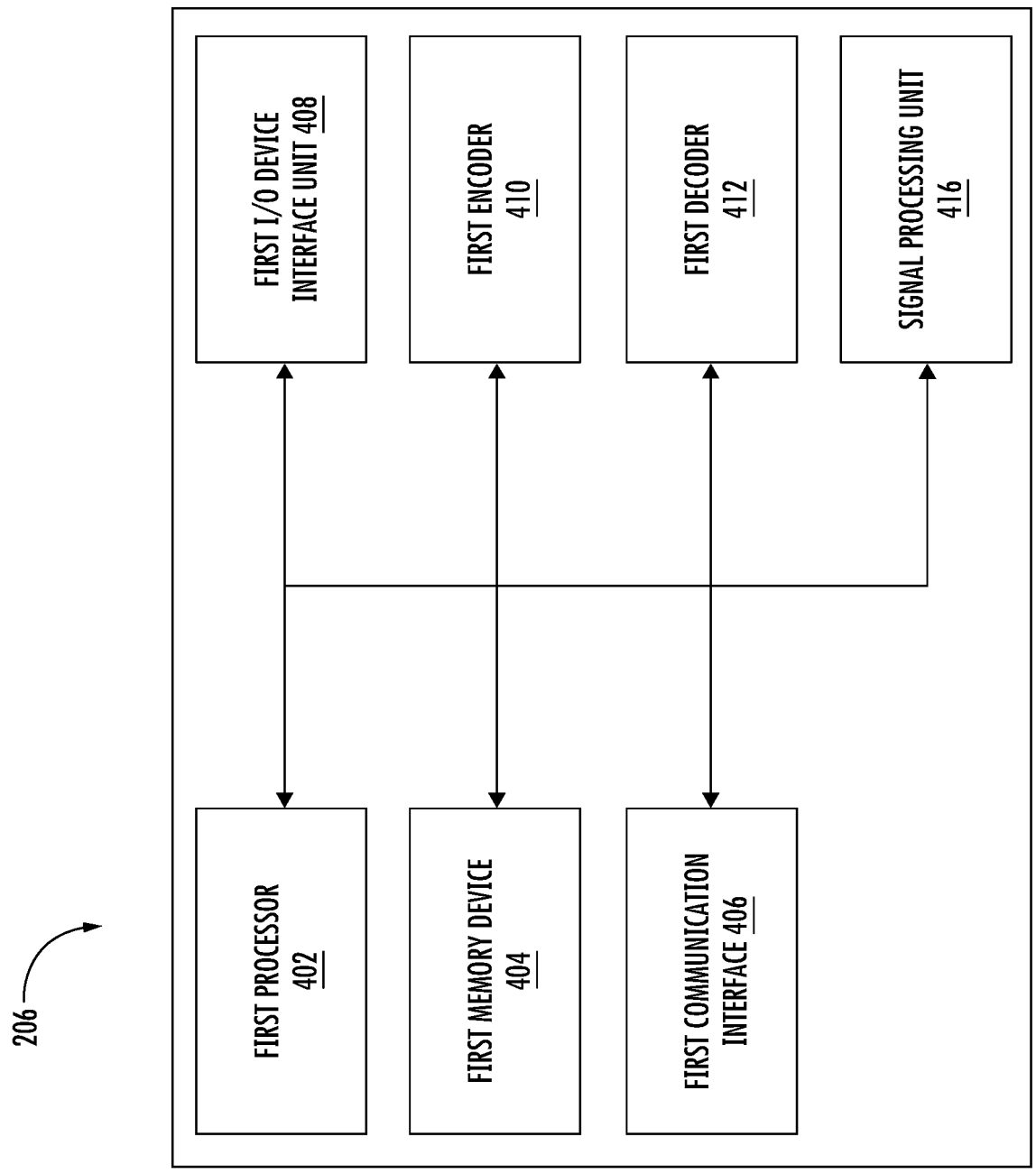
FIG. 4 illustrates a block diagram of the first control system, according to one or more embodiments described herein.

FIG. 4 illustrates a block diagram of the encoder apparatus control system 206, according to one or more embodiments described herein. The encoder apparatus control system 206 includes a first processor 402, a first memory device 404, a first communication interface 406, a first input/output (I/O) device interface unit 408, a first encoder 410, and a first decoder 412.

The first processor 402 may be embodied as means including one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an application specific integrated circuit (ASIC) or field programmable gate array (FPGA), or some combination thereof. Accordingly, although illustrated in FIG. 4 as a single processor, in an embodiment, the first processor 402 may include a plurality of processors and signal processing modules. The plurality of processors may be embodied on a single electronic device or may be distributed across a plurality of electronic devices collectively configured to function as the circuitry of the encoder apparatus control system 206. The plurality of processors may be in operative communication with each other and may be collectively configured to perform one or more functionalities of the circuitry of the encoder apparatus control system 206, as described herein. In an example embodiment, the first processor 402 may be configured to execute instructions stored in the first memory device 404 or otherwise accessible to the first processor 402. These instructions, when executed by the first processor 402, may cause the circuitry of the encoder apparatus control system 206 to perform one or more of the functionalities, as described herein.

Whether configured by hardware, firmware/software methods, or by a combination thereof, the first processor 402 may include an entity capable of performing operations according to embodiments of the present disclosure while configured accordingly. Thus, for example, when the first processor 402 is embodied as an ASIC, FPGA or the like, the first processor 402 may include specifically configured hardware for conducting one or more operations described herein. Alternatively, as another example, when the first processor 402 is embodied as an executor of instructions, such as may be stored in the first memory device 404, the instructions may specifically configure the first processor 402 to perform one or more algorithms and operations described herein.

Thus, the first processor 402 used herein may refer to a programmable microprocessor, microcomputer or multiple processor chip or chips that can be configured by software instructions (applications) to perform a variety of functions, including the functions of the various embodiments described above. In some devices, multiple processors may be provided dedicated to wireless communication functions and one processor dedicated to running other applications. Software applications may be stored in the internal memory before they are accessed and loaded into the processors. The processors may include internal memory sufficient to store the application software instructions. In many devices, the internal memory may be a volatile or nonvolatile memory, such as flash memory, or a mixture of both. The memory can also be located internal to another computing resource (e.g., enabling computer readable instructions to be downloaded over the Internet or another wired or wireless connection).

The first memory device 404 may include suitable logic, circuitry, and/or interfaces that are adapted to store a set of instructions that is executable by the first processor 402 to perform predetermined operations. Some of the commonly known memory implementations include, but are not limited to, a hard disk, random access memory, cache memory, read only memory (ROM), erasable programmable read-only memory (EPROM) & electrically erasable programmable read-only memory (EEPROM), flash memory, magnetic cassettes, magnetic tape, magnetic disk storage or other magnetic storage devices, a compact disc read only memory (CD-ROM), digital versatile disc read only memory (DVD-ROM), an optical disc, circuitry configured to store information, or some combination thereof. In an example embodiment, the first memory device 404 may be integrated with the first processor 402 on a single chip, without departing from the scope of the disclosure.

The first communication interface 406 may correspond to a communication interface 406 that may facilitate transmission and reception of messages and data to and from various devices. For example, the first communication interface 406 is communicatively coupled with a computing device (not shown). In some examples, through the first communication interface 406, the encoder apparatus 106 may be configured to receive commands/jobs from the computing device based on which the encoder apparatus 106 may perform predetermined operation. For example, through the first communication interface 406, the encoder apparatus 106 may receive the data to be encoded and stored on the RF tag 116 on the label 220a (e.g., to generated printed media 118). Examples of the first communication interface 406 may include, but are not limited to, an antenna, an Ethernet port, a USB port, a serial port, or any other port that can be adapted to receive and transmit data. The first communication interface 406 transmits and receives data and/or messages in accordance with the various communication protocols, such as, I2C, TCP/IP, UDP, and 3G, 4G, 4G or 5G communication protocols.

The first I/O device interface unit 408 may include suitable logic and/or circuitry that may be configured to communicate with the one or more components of the encoder apparatus 106, in accordance with one or more device communication protocols such as, but not limited to, I2C communication protocol, Serial Peripheral Interface (SPI) communication protocol, Serial communication protocol, Control Area Network (CAN) communication protocol, and 1-Wire® communication protocol. In an example embodiment, the first I/O device interface unit 408 may communicate with the coupler 204 for facilitating the transmission and reception of the encoded data to/from the RF tag 116, as is further described on conjunction with FIG. 10. Some examples of the first I/O device interface unit 408 may include, but not limited to, a Data Acquisition (DAQ) card, an electrical drives driver circuit, and/or the like.

Figure 10:
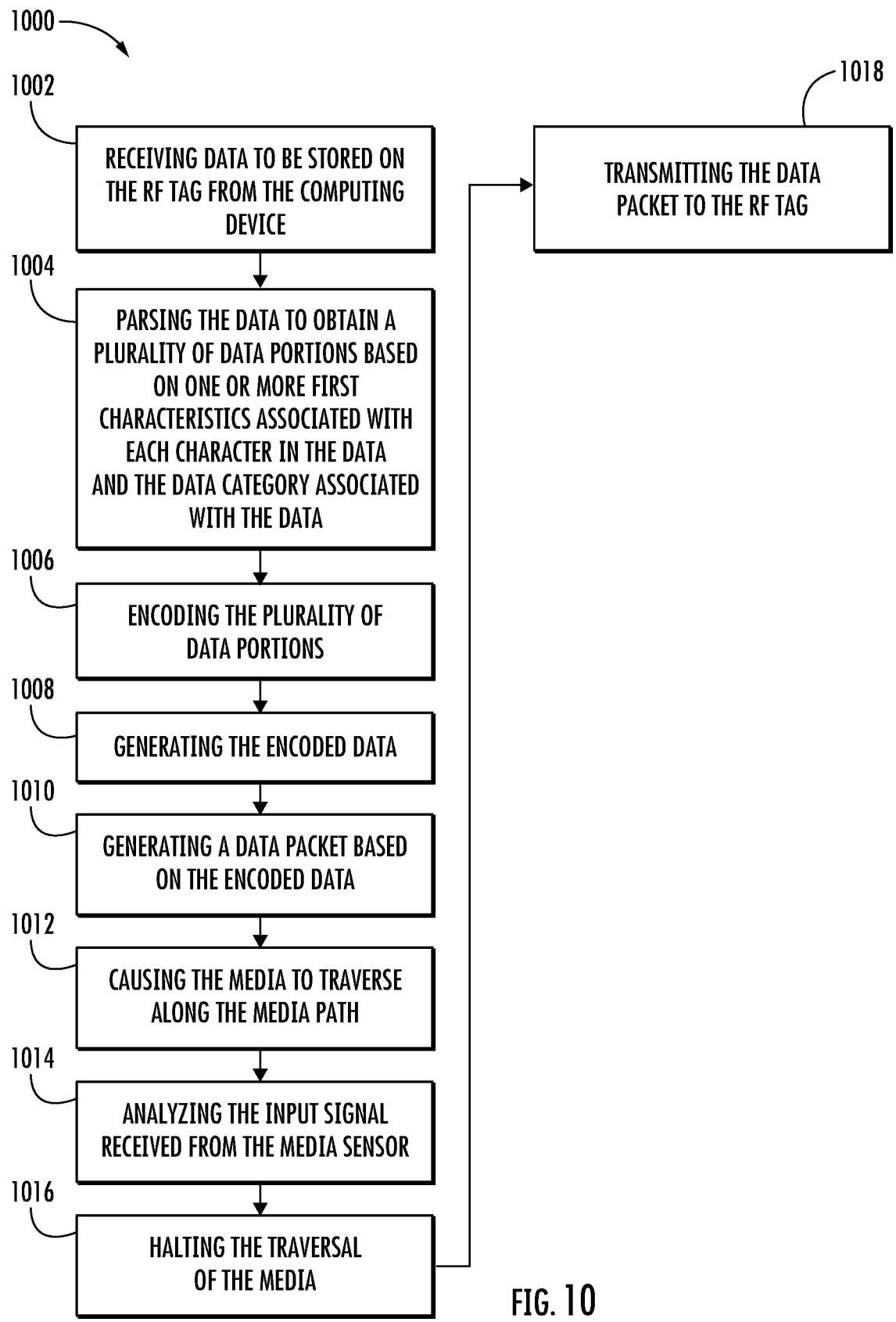
FIG. 10 illustrates a flowchart of a method for operating the encoder apparatus in the encoding mode, according to one or more embodiments described herein.

The first encoder 410 may include suitable logic and/or circuitry that may enable the encoder apparatus 106 to encode the data (to be stored on the RF tag 116) to generate encoded data, as is further described in FIG. 10. In an example embodiment, the first encoder 410 may be further configured to generate a data packet that includes the encoded data. In some examples, the first encoder 410 may be further configured to transmit the data packet to the RF tag 116 through the coupler 204. The first encoder 410 may be implemented using one or more hardware components, such as, but not limited to, FPGA, ASIC, and the like.

The first decoder 412 may include suitable logic and/or circuitry that may enable the encoder apparatus 106 to retrieve data packet from the RF tag 116, as is further described in conjunction with FIG. 18. The first decoder 412 may be further configured to decode the encoded data in the data packet, as is further described in conjunction with FIG. 18. The first decoder 412 may be implemented using one or more hardware components, such as, but not limited to, FPGA, ASIC, and the like.

Figure 6:
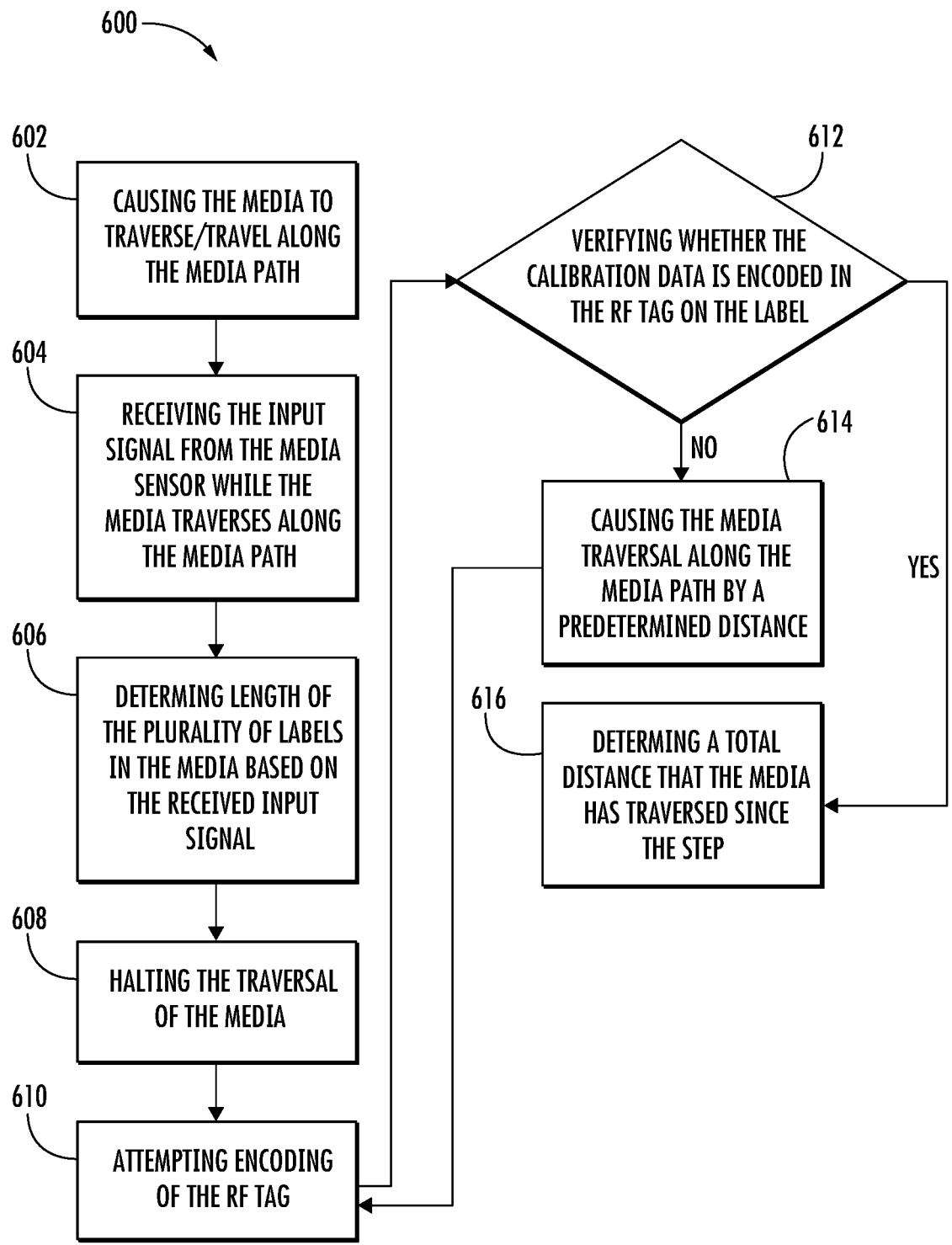
FIG. 6 illustrates a flowchart of a method for operating the encoder apparatus in the calibration mode, according to one or more embodiments described herein.

The calibration unit 414 may include suitable logic and/or circuitry for calibrating the encoder apparatus 106, as further described in conjunction with FIG. 6. In an example embodiment, the calibration unit 414 may be configured to determine one or more properties of the media 118. Some examples of the one or more properties of the media 118 may include, but are not limited to, a length of the plurality of labels 220, a type of the media 118, and/or the like. For the purpose of ongoing description, the calibration unit 414 determines the length of the plurality of labels 220 in the media 118. The calibration unit 414 may be implemented using one or more hardware components, such as, but not limited to, FPGA, ASIC, and the like.

The signal processing unit 416 may include suitable logic and/or circuitry for analyzing the input signal received from the media sensor 304. For example, the signal processing unit 416 may include a digital signal processor that may be configured to identify the peaks and the valleys in the input signal. Further, the signal processing unit 416 may utilize one or more signal processing techniques such as, but not limited to, Fast Fourier Transform (FFT), Discrete Fourier Transform (DFT), Discrete Time Fourier Transform (DTFT) to analyze the input signal. The signal processing unit 416 may be implemented using one or more hardware components, such as, but not limited to, FPGA, ASIC, and the like.

FIGS. 5, 6, 8, 9, 10, 12, 13, 16, and 17 illustrate example flowcharts of the operations performed by an apparatus, such as the encoder apparatus 106 of FIGS. 1A, 1B, and 1C, in accordance with example embodiments of the present invention. It will be understood that each block of the flowcharts, and combinations of blocks in the flowcharts, may be implemented by various means, such as hardware, firmware, one or more processors, circuitry and/or other devices associated with execution of software including one or more computer program instructions. For example, one or more of the procedures described above may be embodied by computer program instructions. In this regard, the computer program instructions which embody the procedures described above may be stored by a memory of an apparatus employing an embodiment of the present invention and executed by a processor in the apparatus. As will be appreciated, any such computer program instructions may be loaded onto a computer or other programmable apparatus (e.g., hardware) to produce a machine, such that the resulting computer or other programmable apparatus provides for implementation of the functions specified in the flowcharts' block(s). These computer program instructions may also be stored in a non-transitory computer-readable storage memory that may direct a computer or other programmable apparatus to function in a particular manner, such that the instructions stored in the computer-readable storage memory produce an article of manufacture, the execution of which implements the function specified in the flowcharts' block(s). The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowcharts' block(s). As such, the operations of FIGS. 5, 6, 8, 9, 10, 12, 13, 16, and 17, when executed, convert a computer or processing circuitry into a particular machine configured to perform an example embodiment of the present invention. Accordingly, the operations of FIGS. 5, 6, 8, 9, 10, 12, 13, 16, and 17 define algorithms for configuring one or more computers or processors to perform various example embodiments. In some cases, a general purpose computer may be provided with an instance of the processor which performs the algorithms of FIGS. 5, 6, 8, 9, 10, 12, 13, 16, and 17 to transform the general purpose computer into a particular machine configured to perform an example embodiment.

Accordingly, blocks of the flowchart support combinations of means for performing the specified functions and combinations of operations for performing the specified functions. It will also be understood that one or more blocks of the flowcharts', and combinations of blocks in the flowchart, can be implemented by special purpose hardware-based computer systems which perform the specified functions, or combinations of special purpose hardware and computer instructions.

Figure 5:
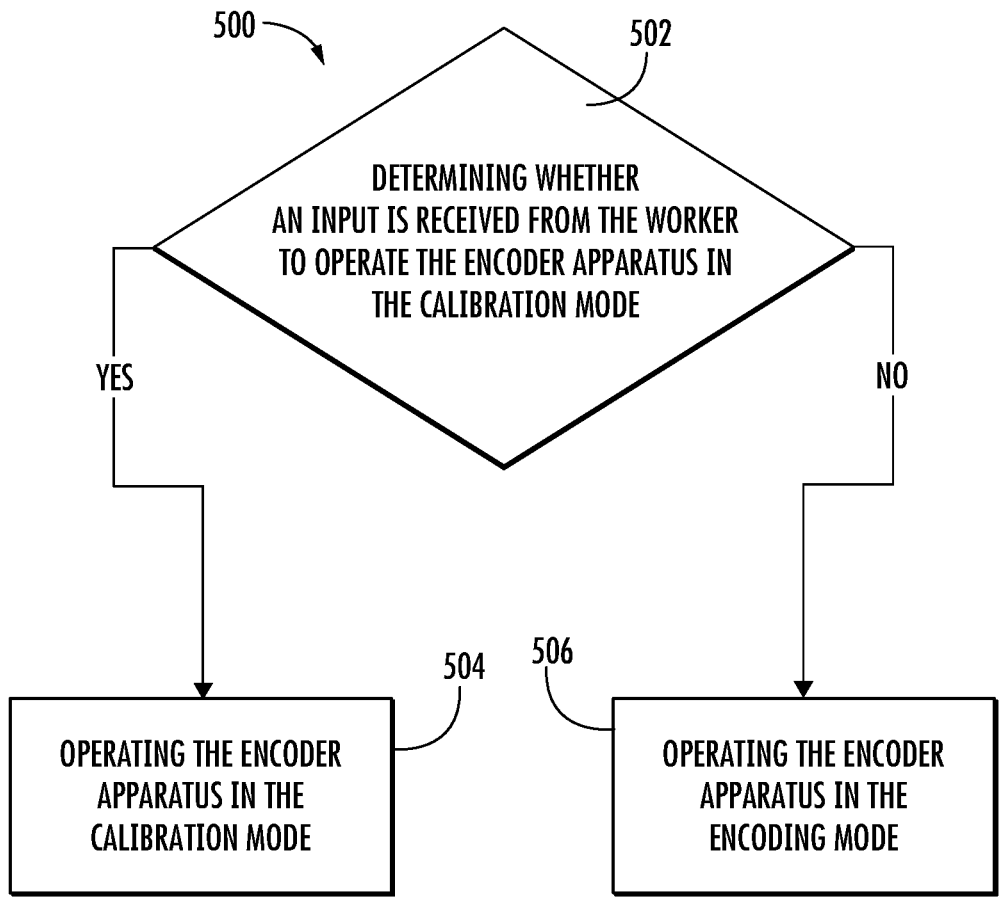
FIG. 5 illustrates an example flowchart for operating the encoder apparatus, according to the one or more embodiments described herein.

FIG. 5 illustrates an example flowchart 500 for operating the encoder apparatus 106, according to the one or more embodiments described herein.

At step 502, the encoder apparatus 106 includes means, such as the encoder apparatus control system 206, the first processor 402, the calibration unit 414, and/or the like, for determining whether an input is received, such as from the worker 115 (using the encoder apparatus 106) to operate the encoder apparatus 106 in the calibration mode. In some embodiments, the worker 115 (such as the worker 114) may provide the input (corresponding to operating the encoder apparatus 106 in the calibration mode) by pressing one or more buttons 238 provided on the input panel 236 of the encoder apparatus 106 in a predetermined pattern. In an example embodiment, the predetermined pattern may correspond to pressing the button (of the one or more buttons 238) in a predetermined sequence or for a predetermined time duration. For example, the user may keep the button (of the one or more buttons 238) pressed for 10 seconds. In some example embodiments, the predetermined pattern may be pre-configured during manufacturing of the encoder apparatus 106.

If the first processor 402 determines that the input to operate the encoder apparatus 106 in the calibration mode is received, the first processor 402 may be configured to perform the step 504. At step 504, the encoder apparatus 106 includes means, such as the encoder apparatus control system 206, the first processor 402, the calibration unit 414, and/or the like, for operating the encoder apparatus 106 in the calibration mode. Additionally or alternately, the calibration unit 414 may be configured to automatically configure to the encoder apparatus 106 in the calibration mode in certain instances such as, but not limited to, when the encoder apparatus 106 is first booted up. The operation of the encoder apparatus 106 in the calibration mode is further described in conjunction with FIG. 6.

If at step 502, if the first processor 402 determines that the input to operate the encoder apparatus 106 in the calibration mode is not received, the first processor 402 may be configured to perform the step 506. At step 506, the encoder apparatus 106 includes means, such as the encoder apparatus control system 206, the first processor 402, the first encoder 410, and/or the like, for operating the encoder apparatus 106 in the encoding mode. The operation of the encoder apparatus 106 in the encoding mode is described later in conjunction with FIG. 10.

FIG. 6 illustrates a flowchart 600 of a method for operating the encoder apparatus 106 in the calibration mode, according to one or more embodiments described herein.

At step 602, the encoder apparatus 106 includes means such as the encoder apparatus control system 206, the first processor 402, the calibration unit 414, the first I/O device interface unit 408, and/or the like for causing the media 218 to traverse/travel along the media path 224. In an example embodiment, the calibration unit 414 may be configured to instruct the first I/O device interface unit 408 to actuate the first electrical drive coupled to the media hub 202 and the platen roller 302. The actuation of the first electrical drive causes the media hub 102 and the platen roller 202 to rotate, which in turn causes the media roll 216 to supply the media 218 along the media path 224. As the media 218 traverses along the media path 224, the media 218 also traverses with respect to the coupler 204 and the media sensor 304.

In some examples, the first I/O device interface unit 408 may be configured to actuate the first electrical drive at a predetermined angular velocity. In an example embodiment, actuating the first electrical drive at the predetermined angular velocity causes the media 218 to traverse along the media path 224 at a determined linear speed. In an example embodiment, the mathematical relationship between the predetermined angular velocity and the linear speed of the media traversal along the media path 224 is stored in the first memory device 404. Accordingly, the first I/O device interface unit 408 may be configured to utilize the mathematical relationship between the predetermined angular velocity and the linear speed of media traversal to cause the media 218 to traverse along the media path at the determined linear speed.

At step 604, the encoder apparatus 106 includes means, such as the encoder apparatus control system 206, the first processor 402, the calibration unit 414, the first I/O device interface unit 408, and/or the like, for receiving the input signal from the media sensor 304 while the media 218 traverses along the media path 224. As discussed above, the input signal corresponds to the voltage signal that is representative of the transmissivity/reflectivity of the media 218. Further, as discussed above, the transmissivity/reflectivity of the media 218 is determined based on the intensity of the portion of the light signal reflected from the surface of the media 218 or transmitted through the media 218. Therefore, the input signal generated by the media sensor 304 is representative of the intensity of the portion of the light signal (i.e., the portion of the light signal passing through the media 218 or reflected from the surface of the media 218) received by the media sensor 304. More specifically, the one or more characteristics of the input signal (such as the amplitude and frequency of the input signal) are representative of the intensity of the portion of the light signal received by the media sensor 304. For example, if the intensity of the portion of light signal received at a first time instant is greater than the intensity of the portion of the light signal received at a second time instant, the amplitude of the input signal received at the first time instant is greater than the intensity of the input signal received at the second time instant.

In an example embodiment, because the media 218 is not stationary with respect to the media sensor 304 and different sections of the media 218 passes over the media sensor 304, the measure of the transmissivity/reflectivity varies as the media 218 traverses along the media path 224. Further, as discussed above, the media 218 has the plurality of labels 220 that are either separated by means of perforations 222 or by means of marks. When such marks/perforations 222 pass over the media sensor 304 while the media 218 traverses along the media path 224, the media sensor 304 may determine a sudden spike or sudden fall in the measure transmissivity/reflectivity of the media 116. Accordingly, the media sensor 304 generates the input signal that may be indicative of such variations in the measure of the transmissivity/reflectivity of the media 218. For example, such variations are reflected in the one or more characteristics of the input signal (such as amplitude and frequency). One such example input signal is described in conjunction with FIG. 7.

Figure 7:
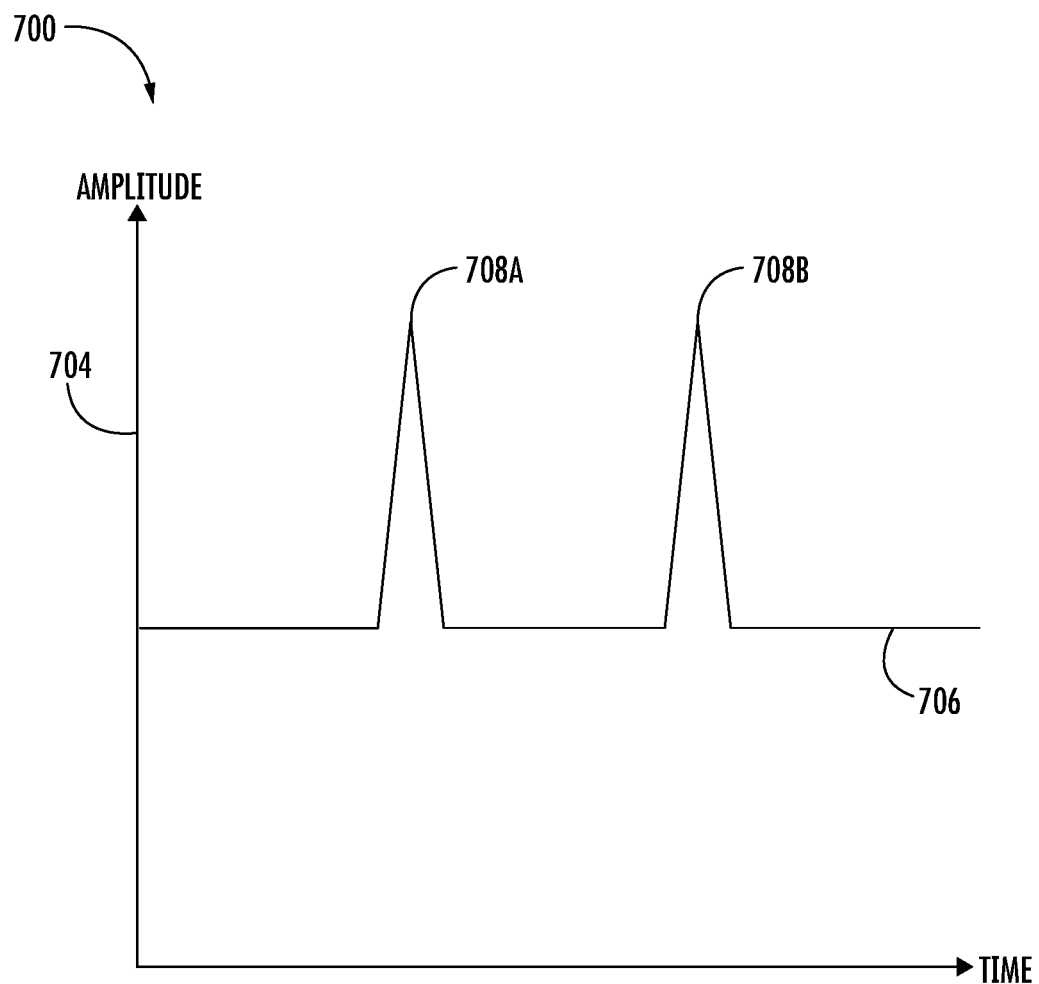
FIG. 7 illustrates a graphical representation an example input signal, according to one or more embodiments described herein.

FIG. 7 illustrates a graphical representation 700 an example input signal, according to one or more embodiments described herein.

The graphical representation 700 includes an X-axis 702 and a Y-axis 704. The X-axis 702 represents the time duration for which the example input signal is received. The Y-axis 704 represents a measure of amplitude of the example input signal. The curve 706 represents the example input signal. The curve 706 includes various peaks such as 708a and 708b. The peak 708a and the peak 708b are chronologically spaced apart from each other. Further, the peaks 708a and 708b depict sudden increase in the measure of transmissivity/reflectivity of the media 218 as the media 218 traverses along the media path 224. As discussed, the sudden increase in the measure of transmissivity/reflectivity of the media 218 is due to passing of a perforation over the media sensor 204. Therefore, the peaks 708a and 708b may represent that a perforation may have passed over the media sensor 304 as the media 218 traverses along the media path 224.

Referring back to FIG. 6, at step 606, the encoder apparatus 106 includes means, such as the encoder apparatus control system 206, the first processor 402, the calibration unit 414, the signal processing unit 416, and/or the like, for determining length of the plurality of labels 220 in the media 218 based on the received input signal. The determination of the length of the plurality of labels 220 is further described in conjunction with FIG. 8.

Figure 8:
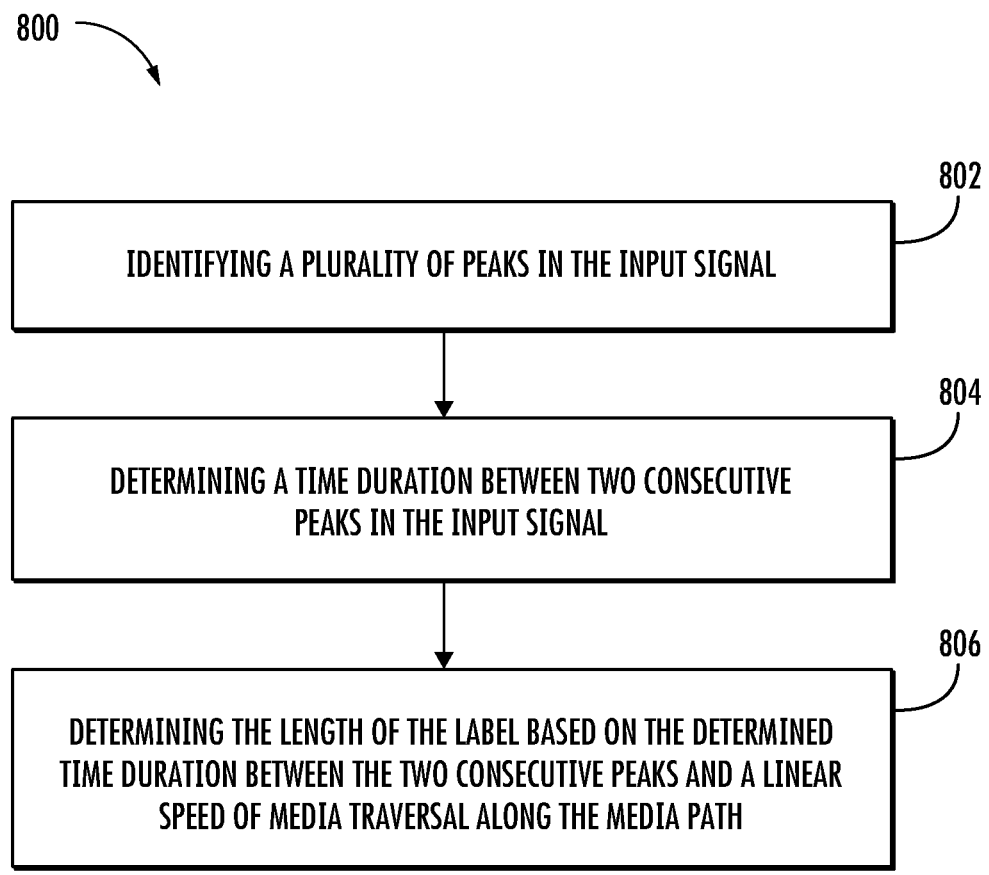
FIG. 8 illustrates a flowchart of a method for determining the length of the plurality of labels, according to the one or more embodiments described herein.

FIG. 8 illustrates a flowchart 800 of a method for determining the length of the plurality of labels 220, according to the one or more embodiments described herein.

At step 802, the encoder apparatus 106 includes means such as the encoder apparatus control system 206, the first processor 402, the signal processing unit 416, and/or the like for identifying a plurality of peaks in the input signal (e.g., based on the input signal received in the step 604). In an example embodiment, the signal processing unit 416 may be configured to utilize one or more signal processing techniques to identify the plurality peaks in the received input signal. Some examples of the signal processing techniques that may be utilized to determine the plurality of peaks may include, but are not limited to, running averages, signal smoothening, wavelet transformation, and/or the like. As discussed above, the plurality of peaks in the input signal may be representative the sudden increase in the measure of transmissivity of the media 218. Further, as discussed above, the sudden increase in the measure of transmissivity of the media 218 indicates that the perforations 222 or a mark on the media 218 has passed over the media sensor 304 during the traversal of the media 218 along the media path 224. Therefore, the plurality of peaks in the input signal may be representative of the perforations 222/marks on the media 218.

At step 804, the encoder apparatus 106 includes means such as the encoder apparatus control system 206, the first processor 402, the signal processing unit 416, and/or the like for determining a time duration between two consecutive peaks in the input signal. As discussed above, the plurality of peaks represents the perforations 222 on the media 116. Further, as discussed above, a contiguous stretch of the media 218 between two consecutive perforations 222 corresponds to the label 220a in the media 218. Accordingly, the time duration between the two consecutive peaks may correspond to a time period that the label 220a took to pass over the media sensor 304 during traversal of the media 218 along the media path 224.

At step 806, the encoder apparatus 106 includes means such as the encoder apparatus control system 206, the first processor 402, the calibration unit 414, and/or the like for determining the length of the label 220a based on the determined time duration between the two consecutive peaks and a linear speed of media traversal along the media path 224. As discussed above, the calibration unit 414 may be configured to determine the linear speed of media traversal based on the mathematical relationship between the angular velocity of the first electrical drive and the linear speed to determine the speed of media traversal.

After determining the linear speed of the media traversal, in an example embodiment, the calibration unit 414 may utilize the relationship between the speed and time to determine the length of the label 220a. Further, the calibration unit 414 may be configured to store the determined length of the label 220a in the first memory device 404.

Referring back to the flowchart 600, at step 608, the encoder apparatus 106 includes means such as the encoder apparatus control system 206, the first processor 402, the calibration unit 414, the first I/O device interface unit 408, the signal processing unit 416, and/or the like for halting the traversal of the media 218. In some examples, the first I/O device interface unit 408 may instruct the first electrical drive (associated with the media hub 202 and the platen roller 302) to halt such that that the perforation 222 is positioned above the media sensor 304. In some example embodiments, the first I/O device interface unit 408 may be configured to facilitate such halting of the media 218 (where the perforation 222 on the media 218 aligns with the media sensor 304) based on the input signal received from the media sensor 304. To facilitate such halting of traversal of the media 218, the signal processing unit 416 may be configured to monitor the one or more characteristics of the input signal (e.g., the amplitude of the input signal) received from the media sensor 304 while the media 218 traverses along the media path 224. In an instance in which the signal processing unit 416 identifies the peak in the input signal (by utilizing one or more signal processing techniques), the signal processing unit 416 may transmit an instruction to the first I/O device interface unit 408 to halt the first electrical drive, which halts the media traversal along the media path 224. Further, because the media is halted upon identification of the peak in the input signal, the perforation 222 on the media 218 aligns with the media sensor 304.

Since the perforation 222 is aligned with the media sensor 304 and the coupler 204 is positioned upstream of the media sensor 304 (see FIGS. 3A and 3B), the label 220 as is position above the coupler 204. In some examples, the position of the RF tag 116 on the label 220a varies according to the type of the media 218. For instance, length of the label 220a in a first media may be greater than the length of the label 220a in a second media. Accordingly, the position of the RF tag 116 on the label 220a of the first media may be different than the position of the RF tag 116 on the label 220a in the second media. Accordingly, in some examples, during calibration, the encoder apparatus control system 206 may be configured to determine the position of the RF tag 116 on the label 220a.

At step 610, the encoder apparatus 106 includes means such as the encoder apparatus control system 206, the first processor 402, the calibration unit 414, the first I/O device interface unit 408, the first encoder 410, and/or the like for attempting encoding of the RF tag 116. For example, the first encoder 410 may be configured to transmit an instruction to the coupler 204, through the first I/O device interface unit 408, to transmit a calibration data to the RF tag 116. In some examples, the calibration data may correspond to a test string (e.g., "test data") that is transmitted to the RF tag 116 during calibration of the encoder apparatus 106. In an example embodiment, prior to transmitting the instruction to the coupler 204, the first encoder 410 may be configured to generate a calibration data packet that includes the calibration data. For example, the first encoder 410 may utilize protocols such as, but are not limited to, EPCglobal standards, DOD standards, and/or the like to generate the calibration data packet.

After creation of the calibration data packet, the first encoder 410 may be configured to transmit the instruction to the coupler 204 through the first I/O device interface unit 408. In an example embodiment, the instruction includes the calibration data packet and a command that may instruct the RF tag 116 on the label 220a to perform a predetermined operation with the calibration data packet. For instance, the instruction may include a "Write" command that may instruct the RF tag 116 to store the calibration data packet (accompanied with the command) in the respective memory, thereby encoding the RF tag 116.

Upon receiving the instruction, the coupler 204 may be configured to modulate the calibration data packet (to be encoded) on RF carrier signals in either HF frequency band or in the UHF frequency band. In some examples, in addition to the calibration data packet, the coupler 204 may be configured to transmit the command (received in the instruction).

At step 612, the encoder apparatus 106 includes means, such as the encoder apparatus control system 206, the first processor 402, the calibration unit 414, the first decoder 412, the first I/O device interface unit 408, and/or the like, for verifying whether the calibration data is encoded in the RF tag 116 on the label 220. The verification operation is further described in conjunction with FIG. 9.

Figure 9:
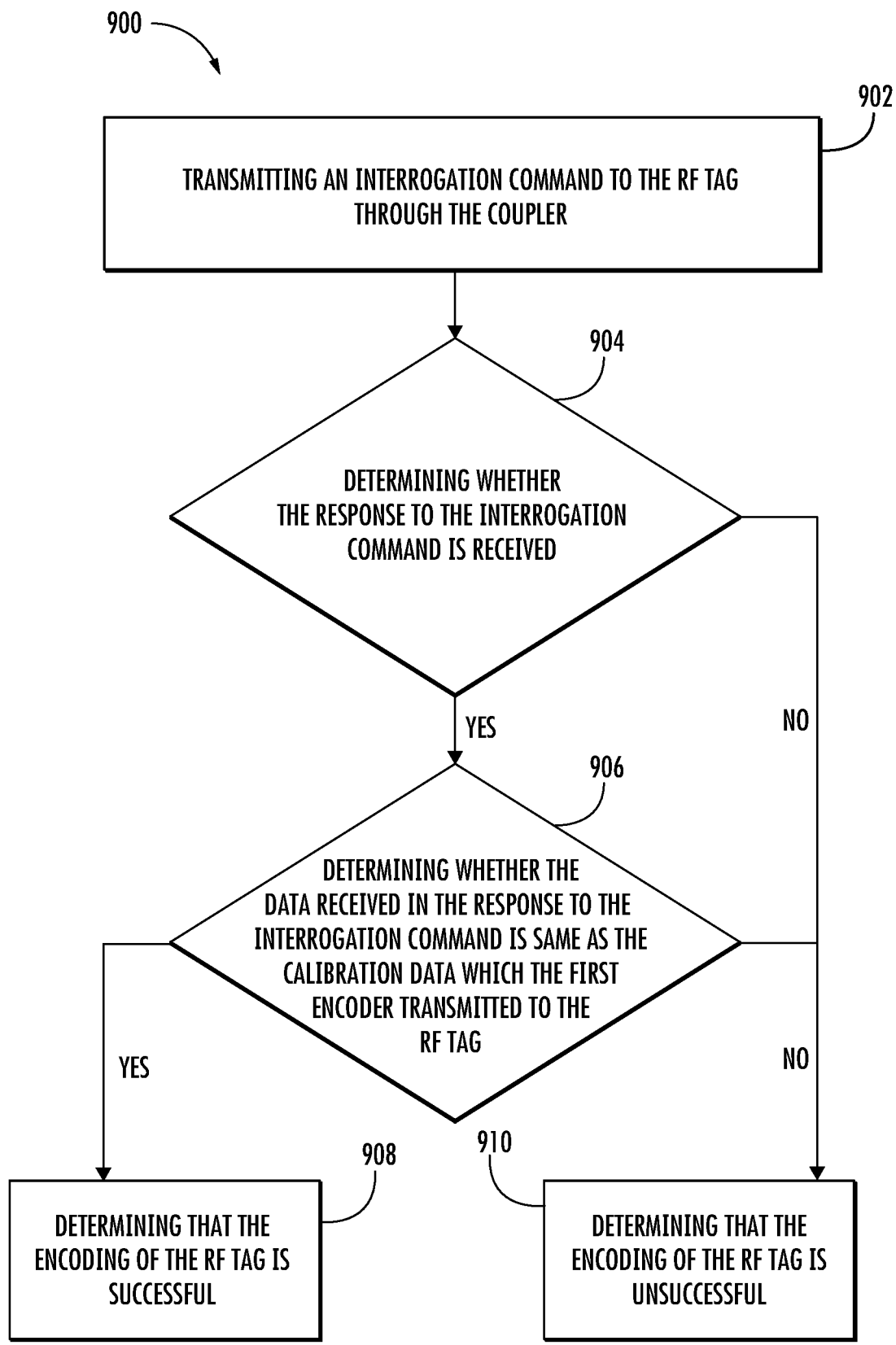
FIG. 9 illustrates a flowchart of a method for verifying whether the RF tag has been encoded, according to one or more embodiments described herein.

FIG. 9 illustrates a flowchart 900 of a method for verifying whether the RF tag 116 has been encoded, according to one or more embodiments described herein.

At step 902, the encoder apparatus 106 may include means, such as the encoder apparatus control system 206, the first processor 402, the first decoder 412, the first I/O device interface unit 408, and/or the like, for transmitting an interrogation command to the RF tag 116 through the coupler 204. Prior to transmitting the interrogation command, the first decoder 412 may instruct the coupler 204 to transmit RF signals to the RF tag 116. The RF signals may cause the RF tag 116 to induce charge, which may be used by the RF tag 116 to power itself (also referred to as power harvesting). Thereafter, first decoder 412 may instruct the coupler 204 to transmit the interrogation signal. In some examples, the RF signals and the interrogation command are transmitted simultaneously. For example, the coupler 204 may modulate the interrogation command on the RF signal. In another example, the coupler 204 may be configured to utilize known standards such as, but not limited to, EPC global standards to transmit the interrogation command.

At step 904, the encoder apparatus 106 may include means, such as the encoder apparatus control system 206, the first processor 402, the first decoder 412, the first I/O device interface unit 408, and/or the like, for determining whether the response to the interrogation command is received. In some examples, the first decoder 412 may receive the response to the interrogation command through the coupler 204. If the first decoder 412 determines that the response to the interrogation command is received through the coupler 204, the first decoder 412 may be configured to perform the step 906. However, if the response to the interrogation signal is not received, the first decoder 412 performs the step 910.

At step 906, the encoder apparatus 106 may include means, such as the encoder apparatus control system 206, the first processor 402, the first decoder 412, the first I/O device interface unit 408, and/or the like, for determining whether the data received in the response to the interrogation command is same as the calibration data which the first encoder 410 transmitted to the RF tag 126, through the coupler 204 (e.g., the calibration data transmitted in step 612). In an example embodiment and in an instance in which the verification unit 312 determines that the data received in response to the interrogation command is same as the calibration data, the first decoder 412 may be configured to perform step 908. However, if the first decoder 412 determines that the data received in response to the interrogation command is not the same as the calibration data, the first decoder 412 may be configured to perform the step 910.

At step 908, the encoder apparatus 106 may include means such as the encoder apparatus control system 206, the first processor 402, the first decoder 412, the first I/O device interface unit 408, and/or the like for determining that the encoding of the RF tag 116 is successful.

At step 910, the encoder apparatus 106 may include means such as the encoder apparatus control system 206, the first processor 402, the first decoder 412, the first I/O device interface unit 408, and/or the like for determining that the encoding of the RF tag 116 is unsuccessful.

Referring back to FIG. 6, if at step 612, the first decoder 412 determines that the encoding of the RF tag 116 is unsuccessful, the first processor 402 may be configured to perform the step 614. At step 614, the encoder apparatus 106 may include means such as the encoder apparatus control system 206, the first processor 402, the first decoder 412, the calibration unit 414, the first I/O device interface unit 408, and/or the like for causing the media traversal along the media path 224 by a predetermined distance. For example, the first I/O device interface unit 408 may activate the first electrical drive, which causes the media traversal along the media path 224 by the predetermined distance (e.g., 1 mm). Thereafter, the first processor 402 may be configured to repeat the step 610. Additionally, the first processor 614 may be configured to maintain a count of times step 614 has been performed.

If at step 612, the first decoder 412 determines that the encoding of the RF tag 116 is successful, the first processor 402 may be configured to perform the step 616. At step 616, the encoder apparatus 106 may include means such as the encoder apparatus control system 206, the first processor 402, the first decoder 412, the calibration unit 414, the first I/O device interface unit 408, and/or the like for determining a total distance that the media 218 has traversed since the step 608. For example, the if the first I/O device interface unit 408 performs the step 614 ten times, and the predetermined distance by which the media 218 traverses along the media path 224 in each iteration of the step 614 is 1 mm, the total distance traversed by the media 218 since the step 608 is 10 mm. Based on the determined total distance, the first processor 402 determines that the RF tag 116 on the label 220a aligns with the coupler 204, when the media 218 traverses by the determined total distance from a position where the perforation 222 aligns with the media sensor 304.

Accordingly, after the operation of the encoder apparatus 106 in the calibration mode, the first processor 402 in the encoder apparatus 106 determines the length of the label 220a and the position of the RF tag 116 on a label 220a (with respect to the total determined distance). The encoder apparatus 106 may be configured to utilize the determined length of the label 220a and the position of the RF tag 116 on the label 220a, while the encoder apparatus 106 operates in the encoding mode. In some examples, the first processor 402 may be configured to store the length of the label 220a and the position of the RF tag 116 on the label 220a in the first memory device 404.

In some examples, the test data being used during the calibration of the encoder apparatus 106 may be different from the data to be stored on the RF tag 116.

FIG. 10 illustrates a flowchart 1000 of a method for operating the encoder apparatus 106 in the encoding mode, according to one or more embodiments described herein.

At step 1002, the encoder apparatus 106 may include means such as the encoder apparatus control system 206, the first processor 402, the first I/O device interface unit 408, and/or the like, for receiving data to be stored on the RF tag 116 from the computing device (not shown). For example, the worker 115 may input data to be stored on the RF tag 120 through the computing device (not shown). Additionally or alternately, the computing device may receive the data from another computing device (not shown) such as the central server 104, without departing from the scope of the disclosure. After receiving the data, the computing device (not shown) may transmit the data to the encoder apparatus 106. In an example embodiment, the data may correspond to a string of characters that may represent predetermined information. For example, the predetermined information (indicated by the data) may correspond to a shipping number that may be utilized to track the package 112 in the warehouse 102 or when the package is in transit. In another example, the predetermined information (indicated by the data) may correspond to a unique product ID that may be utilized to uniquely identify a product (such as apparels) in a retail outlet. Accordingly, in an example embodiment, the predetermined information associated with data may be indicative of a data category associated with the data. Some examples of data category may include, but are not limited to, a shipping number, a unique product ID, a Stock Keeping Unit (SKU) number, and/or the like. In some examples, the first processor 402 may receive the data category associated with the data along with the data from the computing device (not shown). For example, the worker 115 may provide the input, through the computing device, pertaining to the data category associated with the data to be stored in the RF tag 116.

At step 1004, the encoder apparatus 106 may include means such as the encoder apparatus control system 206, the first processor 402, the first encoder 410, the first I/O device interface unit 408, and/or the like, for parsing the data to obtain a plurality of data portions based on one or more first characteristics associated with each character in the data and the data category associated with the data. In an example embodiment, the one or more first characteristics associated with the data may include a position of the character in the data and a semantic information associated with the character. In an example embodiment, the semantic information associated with character may be determined based on the position of the character in the data, the data category associated with the data, the contextual information linked to the data, and/or the like. The determination of the semantic information and parsing of the data is further described in conjunction with FIG. 11.

Figure 11:
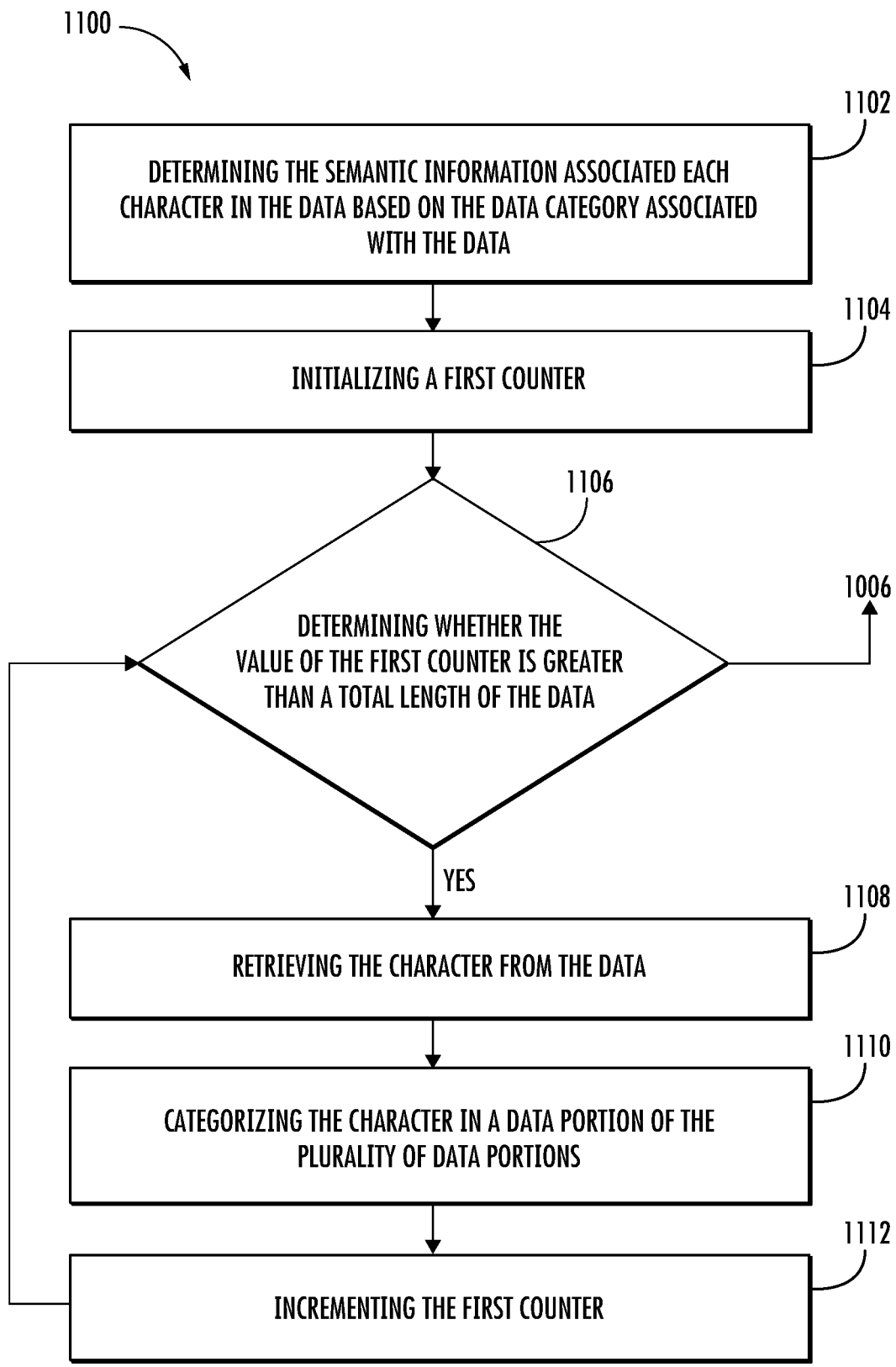
FIG. 11 illustrates a flowchart of a method for parsing the data, according to one or more embodiments described herein.

FIG. 11 illustrates a flowchart 1100 of a method for parsing the data, according to one or more embodiments described herein.

At step 1102, the encoder apparatus 106 may include means such as, the encoder apparatus control system 206, the first processor 402, the first encoder 410, and/or the like for determining the semantic information associated each character in the data based on the data category associated with the data. In an example embodiment, the encoder 402 may be configured to utilize a first look-up table (stored in the first memory device 404) to determine the semantic information associated with the character in the data. Following table illustrates an example look-up table that the first encoder 410 may utilize to determine the semantic information:

TABLE 1

A look-up table indicating the semantic information corresponding to the characters in the data.

| Data category | Semantic information |
| --- | --- |
| Shipping number | Characters 1-6: Shipper number |
|  | Characters 7-8: Service level |
|  | Characters 9-15: Identifier number |
|  | Characters 16-20: Zip code |
| SKU | Characters 1-2: Manufacture ID |
|  | Characters 3-5: type of product |
|  | Characters 6-9: year of manufacture |

For example, in an instance the data category associated with the data is shipping number, the first encoder 410 determines that first six characters represent the shipper number. Further, the first encoder 410 determines that the last five characters represent the zip code where the package 112 is to be delivered. In an example embodiment, the shipping number and the zip code are examples of the semantic information associated with the first six characters and the last five characters in the data, when the data category associated with the data is shipping number. In another example and in an instance in which the data category associated with the data is SKU, the first encoder 410 determines that the first two characters correspond to the manufacture ID. Further, the first encoder 410 determines that next three characters correspond to the type of product. In an example embodiment, the manufacture ID and the type of product correspond to semantic information associated with the characters in the data when the data category associated with the data is SKU.

At step 1104, the encoder apparatus 106 may include means such as, the encoder apparatus control system 206, the first processor 402, the first encoder 410, and/or the like for initializing a first counter. For example, the first encoder 410 may initialize the value of the first counter to be 1. At step 1106, the encoder apparatus 106 may include means such as, the encoder apparatus control system 206, the first processor 402, the first encoder 410, and/or the like for determining whether a value of the first counter is greater than a total length of the data. In an example embodiment, the total length of the data may correspond to a total number of characters in the data. For example, the total number of characters in the data may be 10.

If the first encoder 410 determines that the value of the first counter is not greater than the total length of the data, the first encoder 410 may be configured to perform the step 1108. However, if the first encoder 410 determines that the value of the first counter is greater than the total length of the data, the first encoder 410 performs the step 1006.

At step 1108, the encoder apparatus 106 may include means such as, the encoder apparatus control system 206, the first processor 402, the first encoder 410, and/or the like for retrieving the character from data. In an example embodiment, the first encoder 410 may be configured to retrieve the character from a position in the data, indicated by the first counter. For example, if the first counter's value is 1, the first encoder 410 retrieves the first character from the data. In another example, if the first counter's value is 9, the first encoder 410 may be configured to retrieve ninth character from the data.

At step 1110, the encoder apparatus 106 may include means such as, the encoder apparatus control system 206, the first processor 402, the first encoder 410, and/or the like for categorizing the character in a data portion of the plurality of data portions. In an example embodiment, the first encoder 410 may be configured to categorize the character based on the semantic information associated with the position from which the character has been retrieved. For example, in an instance in which the data corresponds to the shipping number and the character retrieved from first position, the first encoder 410 may be configured to categorize the character in a first data portion, of the plurality of data portions, that corresponds to the shipper number. Similarly, in an instance in which the data corresponds to the shipping number and the character retrieved from seventh position, the first encoder 410 may be configured to categorize the character in a second data portion, of the plurality of data portions, that corresponds to the service level. Therefore, each of the plurality of data portions are configured to store a set of characters (retrieved from the data) that have same associated semantic information. For example, the first data portion includes the set of characters that represent the shipper number. Similarly, the second data portion includes the set of characters that represent the service level.

At step 1112, the encoder apparatus 106 may include means such as, the encoder apparatus control system 206, the first processor 402, the first encoder 410, and/or the like for incrementing the first counter. Thereafter, step 1106 is repeated.

Referring back to the flowchart 1000, at step 1006, the encoder apparatus 106 may include means such as, the encoder apparatus control system 206, the first processor 402, the first encoder 410, and/or the like for encoding the plurality of data portions. The encoding of the plurality of data portions is further described in conjunction with FIG. 12.

Figure 12:
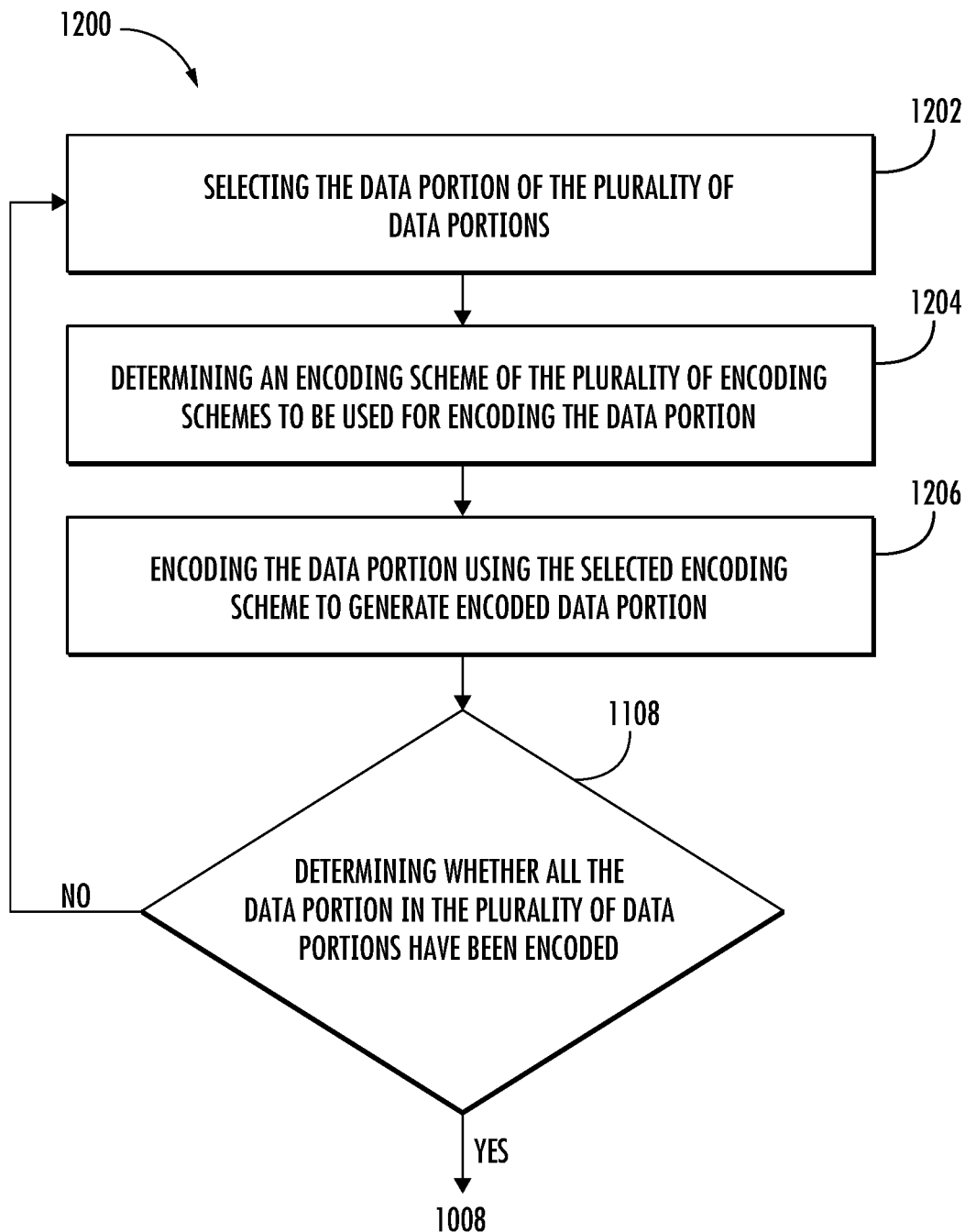
FIG. 12 illustrates a flowchart for encoding the plurality of data portions, according to one or more embodiments described herein.

FIG. 12 illustrates a flowchart 1200 for encoding the plurality of data portions, according to one or more embodiments described herein.

At step 1202, the encoder apparatus 106 may include means such as, the encoder apparatus control system 206, the first processor 402, the first encoder 410, and/or the like for selecting the data portion of the plurality of data portions. At step 1204, the encoder apparatus 106 may include means such as, the encoder apparatus control system 206, the first processor 402, the first encoder 410, and/or the like for determining an encoding scheme of the plurality of encoding schemes to be used for encoding the data portion. In an example embodiment, the first encoder 410 may be configured to determine the encoding scheme based on one or more second characteristics associated with the data portion. In some examples, the one or more second characteristics associated with the data portion may include a count of the set of characters in the data portion. Determining the encoding scheme of the plurality of encoding scheme is further described in conjunction with FIG. 13.

Figure 13:
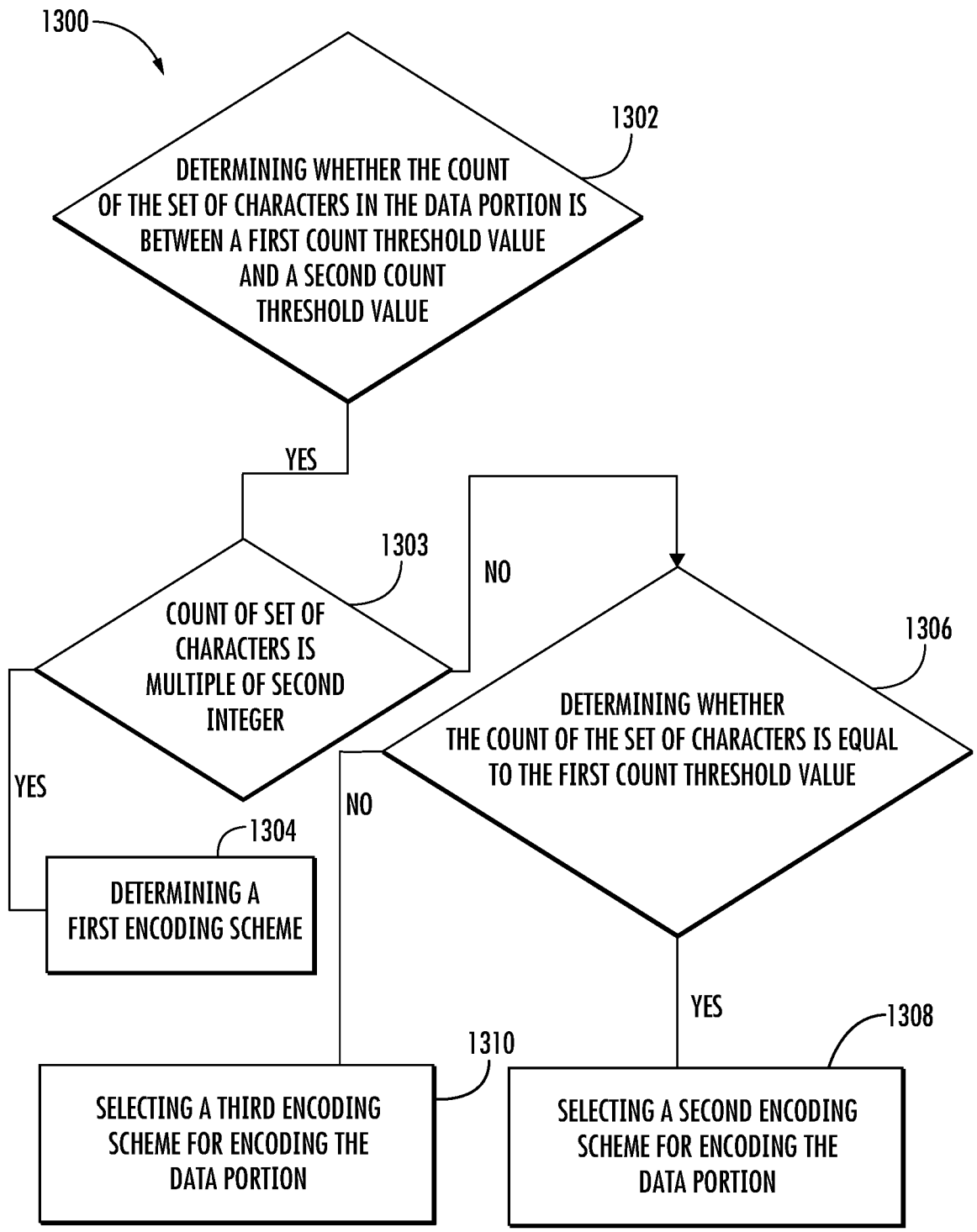
FIG. 13 illustrates a flowchart of a method for determining the encoding scheme of the plurality of encoding schemes, according to one or more embodiments described herein.

FIG. 13 illustrates a flowchart 1300 of a method for determining the encoding scheme of the plurality of encoding schemes, according to one or more embodiments described herein.

At step 1302 the encoder apparatus 106 may include means such as, the encoder apparatus control system 206, the first processor 402, the first encoder 410, and/or the like for determining whether the count of the set of characters in the data portion is in a first range between a first threshold count value and a second threshold count value. In some examples, the first range includes the first threshold count value and the second threshold count value. For example, if the first range is between 2 and 6, then the first range includes 2 and 6. In some examples, the first count threshold value and the second count threshold value may be pre-stored in the first memory device 404 during manufacturing of the encoder apparatus 106. In another embodiment, the first count threshold value and the second count threshold value may be inputted by the worker 115 during the operation of the encoder apparatus 106 in the calibration mode. In some examples, the first count threshold value may be a value that may be a multiple of a first integer and the second count threshold value may be value that is multiple of a second integer. In an example embodiment, the first integer and the second integer may be determined based on Highest Common Factor (HCF) of the first threshold count value and the second threshold count value, respectively. For example, if the first threshold count value is 2 and the second threshold count value is 6, the first integer and the second integer may be two and three, respectively.

If the first encoder 410 determines that the count of the set of characters in the data portion is in the first range between the first threshold count value and the second count threshold value, the first encoder 410 may perform the step 1303. However, if the first encoder 410 determines that the count of the set of characters in the data portion is not in the first range between the first threshold count value and the second count threshold value, the first encoder 410 may be configured to perform the step 1306.

At step 1303 the encoder apparatus 106 may include means such as, the encoder apparatus control system 206, the first processor 402, the first encoder 410, and/or the like for determining whether the count of the set of characters in the data portion is a multiple of the second integer. If the first encoder 410 determines the count of the set of characters in the data portion is a multiple of the second integer (e.g., three), the first encoder 410 may be configured to perform the step 1304. However, if the first encoder 410 determines that the count of the set of characters in the data portion is not a multiple of the second integer, the first encoder 410 may be configured to perform the step 1306.

At step 1304, the encoder apparatus 106 may include means such as, the encoder apparatus control system 206, the first processor 402, the first encoder 410, and/or the like for determining a first encoding scheme for encoding the data portion.

At step 1306, the encoder apparatus 106 may include means such as, the encoder apparatus control system 206, the first processor 402, the first encoder 410, and/or the like for determining whether the count of the set of characters is equal to the first count threshold value. If the first encoder 410 determines that the count of the set of characters is equal to the first count threshold value, the first encoder 410 may be configured to perform the step 1308. However, if the first encoder 410 determines that the count of the set of characters is not equal to the first count threshold value, the first encoder 410 may be configured to perform the step 1310.

At step 1308, the encoder apparatus 106 may include means such as, the encoder apparatus control system 206, the first processor 402, the first encoder 410, and/or the like for determining a second encoding scheme for encoding the data portion. In an example embodiment, the second encoding scheme is different from the first encoding scheme.

At step 1310, the encoder apparatus 106 may include means such as, the encoder apparatus control system 206, the first processor 402, the first encoder 410, and/or the like for determining a third encoding scheme for encoding the data portion. In an example embodiment, the third encoding scheme is different from the second encoding scheme and the first encoding scheme.

In some examples, the scope of the disclosure is not limited to determining the encoding scheme of the plurality of encoding schemes based on the count of the set of characters in the data portion, the first threshold count value, and the second count threshold count value. An alternate method of determining the encoding scheme is further described in conjunction with FIG. 14.

Figure 14:
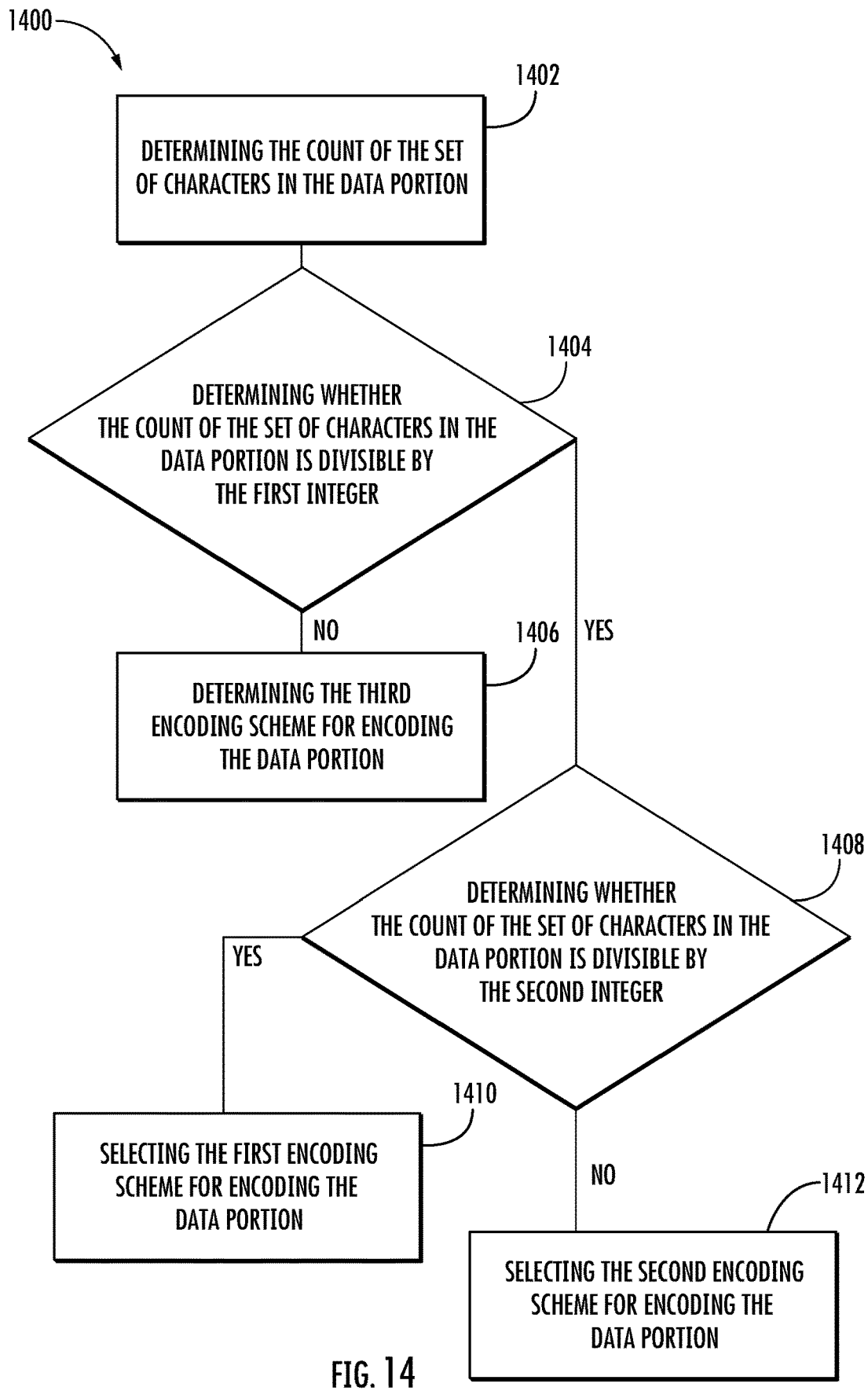
FIG. 14 illustrates another flowchart of a method for determining the encoding scheme for encoding the data portion, according to one or more embodiments described herein.

FIG. 14 illustrates another flowchart 1400 of a method for determining the encoding scheme for encoding the data portion, according to one or more embodiments described herein.

At step 1402, the encoder apparatus 106 may include means such as, the encoder apparatus control system 206, the first processor 402, the first encoder 410 and/or the like for determining the count of the set of characters in the data portion. At step 1404, the encoder apparatus 106 may include means such as, the encoder apparatus control system 206, the first processor 402, the first encoder 410 and/or the like for determining whether the count the set of characters in the data portion is divisible by the first integer. For example, the first encoder 410 may determine whether the count of the set of characters in the data portion is divisible by two (an example of the first integer). If the first encoder 410 determines that the count of the set of characters is divisible by the first integer, the first encoder 410 may be configured to perform the step 1408. However, if the first encoder 410 determines that the count of characters is not divisible by the first integer, the first encoder 410 may be configured to perform the step 1406.

At step 1406, the encoder apparatus 106 may include means such as, the encoder apparatus control system 206, the first processor 402, the first encoder 410 and/or the like for determining the third encoding scheme for encoding the data portion.

At step 1408, the encoder apparatus 106 may include means such as, the encoder apparatus control system 206, the first processor 402, the first encoder 410 and/or the like for determining whether the count of the set of characters in the data portion is divisible by the second integer. For example, the first encoder 410 may determine whether the count of the set of characters in the data portion is divisible by three (an example of the second integer). If the first encoder 410 determines that the count of the set of characters is divisible by the second integer, the first encoder 410 may be configured to perform the step 1410. However, if the first encoder 410 determines that the count of the set of characters is not divisible by the second integer, the first encoder 410 may be configured to perform the step 1412.

At step 1410, the encoder apparatus 106 may include means such as, the encoder apparatus control system 206, the first processor 402, the first encoder 410 and/or the like for determining the first encoding scheme for encoding the data portion.

At step 1412, the encoder apparatus 106 may include means such as, the encoder apparatus control system 206, the first processor 402, the first encoder 410 and/or the like for determining the second encoding scheme for encoding the data portion.

In some examples, the scope of the disclosure is not limited to the aforementioned techniques to determine the plurality of encoding schemes for the plurality of data portions. In an example embodiment, the encoding scheme may be determined based on the data category received from the worker 115 (in step 1102). In such a scenario, the first look-up table includes the information pertaining to the plurality of encoding schemes to be used to encode the plurality of data portions. Following table illustrates a modified first look-up table that includes the information pertaining to the plurality of encoding schemes to be used to encode the plurality of data portions:

TABLE 2

Another example of the first look-up table containing the information pertaining to plurality of encoding schemes.

| Data category | Semantic information | Encoding scheme |
|---|---|---|
| Shipping number | Characters 1-6: Shipper number | First Encoding scheme |
| | Characters 7-8: Service level | Second Encoding Scheme |
| | Characters 9-15: Identifier number | Third Encoding scheme |
| | Characters 16-20: Zip code | Third Encoding scheme |

TABLE 2-continued

Another example of the first look-up table containing the information pertaining to plurality of encoding schemes.

| Data category | Semantic information | Encoding scheme |
| --- | --- | --- |
| SKU | Characters 1-2: Manufacture ID | Second Encoding scheme |
| | Characters 3-5: type of product | First Encoding scheme |
| | Characters 6-9: year of manufacture | First Encoding scheme |

In an example embodiment, the first encoder 410 may be configured to determine the first encoding scheme based on the semantic information depicted by the plurality of data portions. For example, the first encoder 410 may be configured to select the first encoding scheme for encoding the first data portion, where the first data portion includes the set of characters having associated semantic information as the shipper number. Similarly, the first encoder 410 may be configured to select the second encoding scheme for the second data portion which include the set of characters having associated semantic information as the service level.

Referring back to flowchart 1200, at step 1206, the encoder apparatus 106 may include means such as, the encoder apparatus control system 206, the first processor 402, the first encoder 410, and/or the like for encoding the data portion using the selected encoding scheme to generate encoded data portion. At step 1208 the encoder apparatus 106 may include means such as, the encoder apparatus control system 206, the first processor 402, the first encoder 410, and/or determining whether all the data portion in the plurality of data portions have been encoded. If the first encoder 410 determines that all the data portions have been encoded, the first encoder 410 may be configured to perform the step 1008. However, if the first encoder 410 determines that not all data portions of the plurality data portions have been encoded, the first encoder 410 may be configured to repeat the step 1202.

Referring back to the flowchart 1000, at step 1008, the encoder apparatus 106 may include means such as, the encoder apparatus control system 206, the first processor 402, the first encoder 410, and/or the like for generating the encoded data. In an example embodiment, the first encoder 410 may be configured to concatenate the plurality of encoded data portions to generate the encoded data. In some examples, the first encoder 410 may be configured to concatenate the plurality of encoded data portions in accordance with the position of the characters categorized within the plurality data portions (from which the plurality of encoded data portions have been obtained). For example, the first encoder 410 categorizes the data into two data portion such that the first data portion includes first two characters and the second data portion includes next three characters. In such a scenario, the first encoder 410 concatenates the encoded first data portion with the second encoded data portion such that, in the encoded data, the first encoded data portion precedes the second encoded data portion.

At step 1010, the encoder apparatus 106 may include means such as, the encoder apparatus control system 206, the first processor 402, the first encoder 410, and/or the like for generating a data packet based on the encoded data. In an example embodiment, the first encoder 410 may be configured to concatenate additional data to the encoded data to generate the data packet. In some examples, the additional data may include, but not limited to, header data and error correction data. The header data, in some examples, may correspond to routing information, packet information, and/or a unique ID that may uniquely identify the organization that has generated the encoded data. Further, the error correction data may be used to detect and correct error in the encoded data. In an example embodiment, the first encoder 410 may be configured to generate the error correction data using known error correction algorithms such as parity, checksum, cyclic redundancy check (CRC), and/or the like. In some examples, the error correction data may be generated based on the unencoded data. In alternate embodiment, the error correction data may be generated based on the encoded data.

Prior to concatenating the additional data to the encoded data, the first encoder 410 may be configured to encode the additional data. For example, the first encoder 410 may encode the header data and the error correction data using the third encoding scheme to generate the encoded header data and the encoded error correction data (together referred to as encoded additional data). Thereafter, the first encoder 410 may concatenate the encoded additional data to the encoded data to generate the data packet. In some examples, the first encoder 410 may not encode the header data and may directly convert the header data into hexadecimal form prior to concatenating the additional data to the encoded data. An example structure of the data packet is illustrated in FIG. 15.

Figure 15:
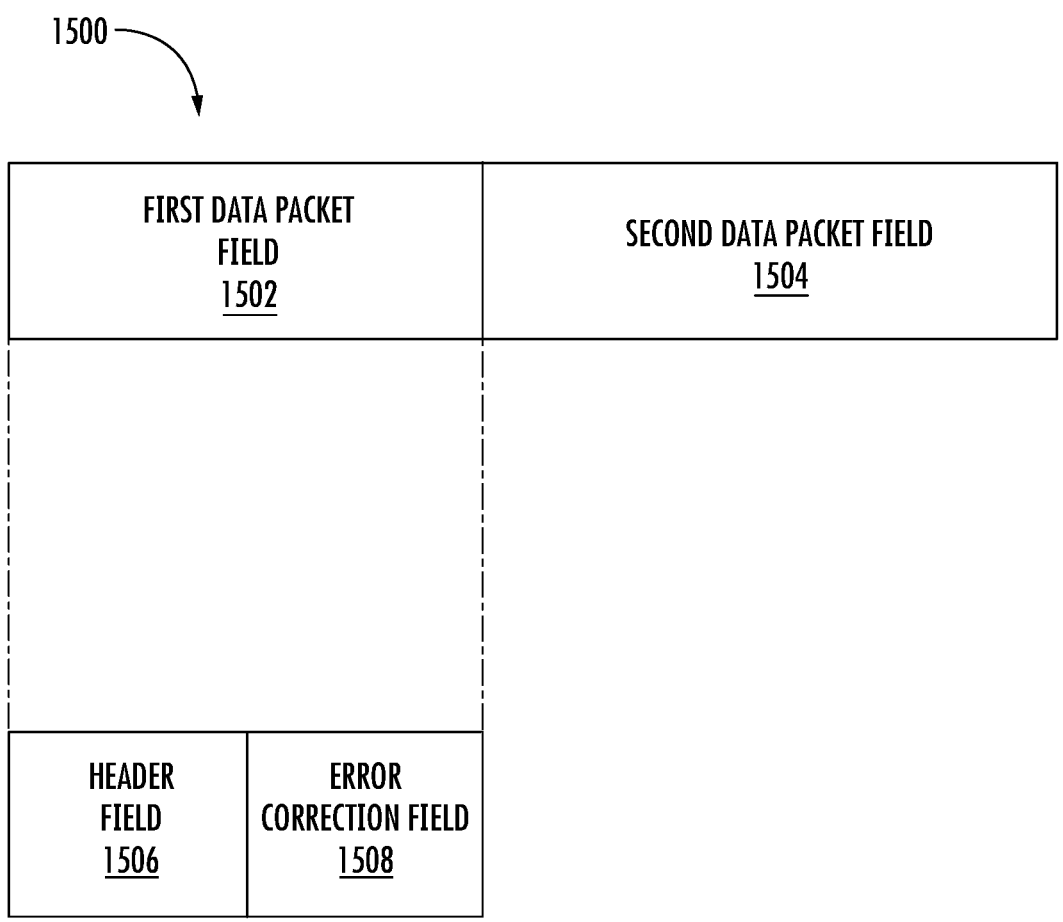
FIG. 15 illustrates an example data packet, according to one or more embodiments described herein.

FIG. 15 illustrates an example data packet 1500, according to one or more embodiments described herein. The example data packet 1500 includes a first data packet field 1502 and a second data packet field 1504. In an example embodiment, the first data packet field further includes a header field 1506 and an error correction data field 1508. The header field 1506 is configured to store the encoded header data and the error correction data field 1508 is configured to the encoded error correction data. In an example embodiment, the second data packet field 1504 is configured to store the encoded data.

In some examples, the scope of the disclosure is not limited to appending the additional data to the encoded data to generate the data packet. In an alternate embodiment, the data (received from the computing device in step 1002) may originally include a header data portion and an error correction data portion. In such an embodiment, the first encoder 410 may be configured to utilize a first look-up table (e.g., table 3) to determine the semantic information associated with the characters in the received data.

TABLE 3

Another example for the first look-up table indicating the semantic information.

| Data category | Semantic information |
| --- | --- |
| Shipping number | Characters 1-2: Header |
| | Character 3: Check digit |
| | Characters 4-9: Shipper number |
| | Characters 10-11: Service level |
| | Characters 12-18: Identifier number |
| | Characters 19-23: Zip code |

Accordingly, the first encoder 410 utilizes the table 3 to determine that the semantic information associated with the first two characters of the data is "header data". Further, the first encoder 410 determines that the semantic information associated with the third character of the data is "error correction data". Accordingly, the first encoder 410 may be configured to parse the data to obtain the plurality of data portions such that the plurality of data portions includes the header data portion and the error correction data portion. Thereafter, the first encoder 410 may be configured to perform the steps illustrated in the flowchart 1400 or in the flowchart 1300, to encode the data to obtain the encoded data. Alternatively, the first encoder 410 may encode the header data portion and the error correcting data portion in accordance with the methods described above to encode the additional data. Since the data (originally received) includes the header data portion and the error correction data portion, the encoded data obtained by encoding the data includes the encoded header data portion and the encoded error correction portion. Accordingly, the encoded data corresponds to or is otherwise correlated with the data packet.

Further, in an embodiment, where the data originally includes the header data portion and the error correction data portion, the encoder apparatus 106 may not receive the data category as the input from the worker 115. In such an embodiment, the encoder apparatus 106 may automatically determine the data category associated with the data. For example, the encoder apparatus 106 may refer to the second look-up table (illustrated in table 4) below to determine the data category associated with the data.

Referring back to the flowchart 1000, at step 1012, the encoder apparatus 106 may include means such as, the encoder apparatus control system 206, the first processor 402, the first I/O device interface unit 408, and/or the like for causing the media 218 to traverse along the media path 224. In an example embodiment, the first I/O device interface unit 408 may instruct the first electrical drive to cause rotation of the media hub 202 and/or the platen roller 302, which in turn causes the media 218 to traverse along the media path 224.

At step 1014, the encoder apparatus 106 may include means such as, the encoder apparatus control system 206, the first processor 402, the first I/O device interface unit 408, the signal processing unit 416 and/or the like for analyzing the input signal received from the media sensor 304, while the media 218 traverses along the media path 224. In some examples, the signal processing unit 416 may analyze the input signal to detect the peak in the input signal.

In response to detecting the peak in the input signal, at step 1014, the encoder apparatus 106 may include means such as, the encoder apparatus control system 206, the first processor 402, the first I/O device interface unit 408, and/or the like for continuing the traversal of the media for the total distance. In an example embodiment, the first I/O device interface unit 408 may be configured to utilize the relationship between the linear speed of the media traversal and the angular speed of the first electrical drive to traverse the media 218 by the total distance.

After the traversal of the media 218 by the total distance, at step 1016, the encoder apparatus 106 may include means such as, the encoder apparatus control system 206, the first processor 402, the first I/O device interface unit 408, and/or the like for halting the traversal of the media 218. Since the media 218 is halted after the media 218 has traversed the total distance (from the instance when the signal processing unit 416 detected the peak in the input signal), the RF tag 116 on the label 220a gets aligned with the coupler 204.

At step 1018, the encoder apparatus 106 may include means such as, the encoder apparatus control system 206, the first processor 402, the first I/O device interface unit 408, the first encoder 410, and/or the like for transmitting the data packet to the RF tag 116. In an example embodiment, the first encoder 410 may be configured to transmit an instruction to the coupler 204, through the first I/O device interface unit 408, to transmit the data packet to the RF tag 116. In an example embodiment, the instruction further the command that may instruct the RF tag 116 on the label 220a to perform a predetermined operation with the data packet. For instance, the instruction may include a "Write" command that may instruct the RF tag 116 to store the data packet (accompanied with the command) in the corresponding memory, thereby encoding the RF tag 116.

Upon receiving the instruction, the coupler 204 may be configured to modulate the data packet (to be encoded) on RF carrier signals in either HF frequency band or in the UHF frequency band and transmit the data packet to the RF tag 116. In some examples, in addition to the data packet, the coupler 204 may be configured to transmit the command (received in the instruction) to the RF tag 116.

In some examples, the first encoder 410 may be configured to convert the data packet into a binary bit stream, prior to transmitting the data packet to the RF tag 116. Further, upon receiving the data packet (in form of binary bit stream), the RF tag 116 may be configured to store the data packet in form of binary bits in the respective memory. An example scenario of encoding data is further illustrated in FIG. 21.

In some examples, the scope of the disclosure is not limited to the storing the data packet in the RF tag 116. In an example embodiment, the encoder apparatus 106 may be configured to additionally or alternatively print the data packet on the label 120 instead of storing it on the RF tag 116. In such an embodiment, the first encoder 410 may be configured to convert the data packet to an indicia (for example, a barcode). Thereafter, the first processor 402 may be configured to instruct the print head 214 to print the indicia on the label 220a. In yet another embodiment, the encoder apparatus 106 may be configured to store the data packet on the RF tag 116 and may print the data packet (in form of indicia) on the label 220a (having the RF tag 116).

After the RF tag 116 is encoded with the data packet, in some examples, the worker 115 may be configured to attach the label 220a (with the RF tag 116) on the package 112. Thereafter, the worker 115 may either store the package 112 in the storage in the warehouse 102 and/or transfer the package 112 to another warehouse. In an alternative embodiment, the package 112 may be automatically transferred to storage in the warehouse or another warehouse by means of robotic vehicles or conveyors. In some examples, the worker 115 may require the track the package 112 within the storage of the warehouse 102 or during transit of the package 112. In some examples, usually, the package 112 is tracked by retrieving the data packet from the RF tag 116 attached to the package 112. In such a scenario, the worker 115 may utilize the decoder apparatus 108 for retrieving the data packet from the RF tag 116. The structure of the decoder apparatus 108 is further described in conjunction with FIG. 16.

Figure 16:
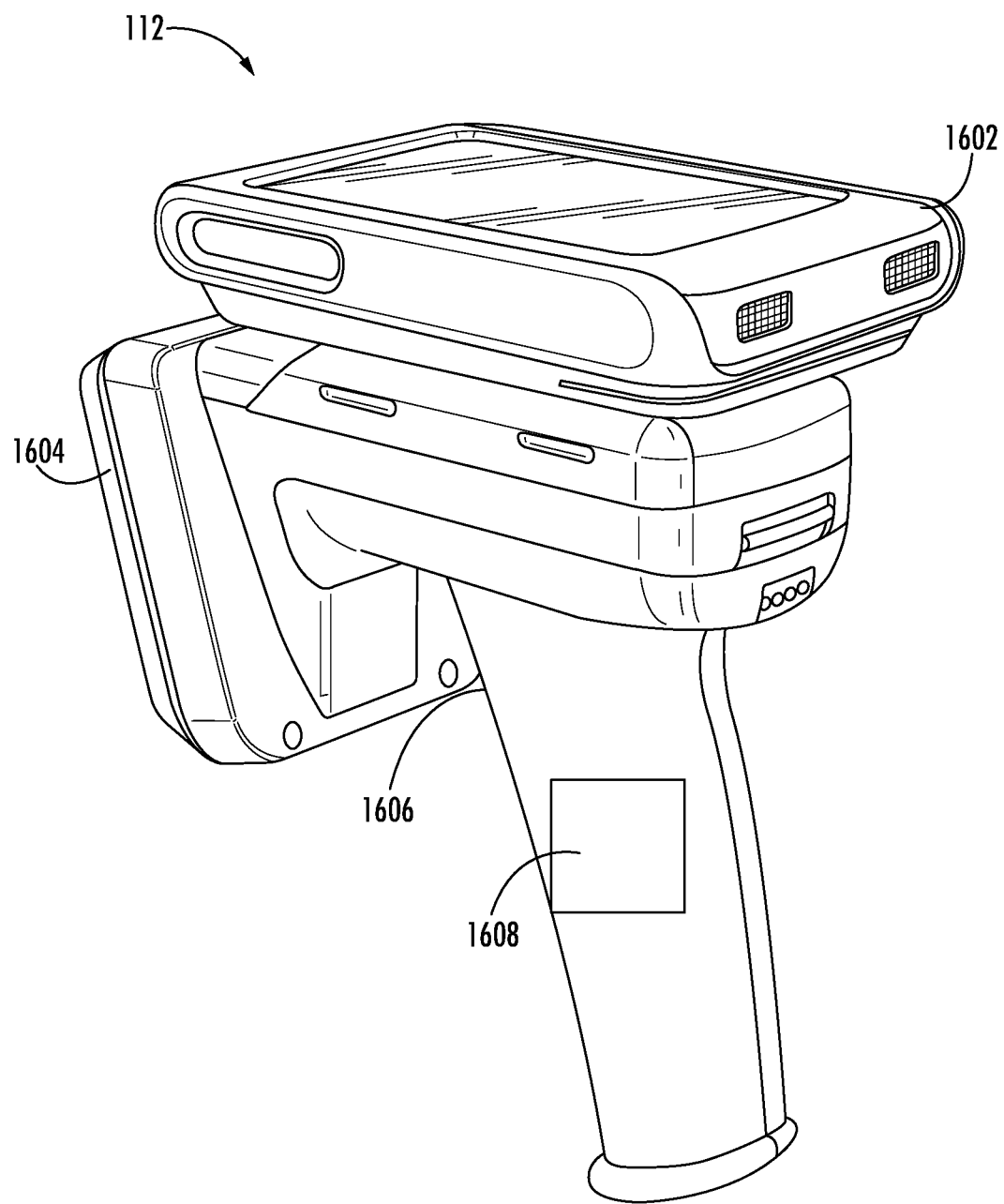
FIG. 16 illustrates the decoder apparatus, according to one or more embodiments described herein.

FIG. 16 illustrates the decoder apparatus 108, according to one or more embodiments described herein. In an example embodiment, the decoder apparatus 108 includes a display screen 1602, an antenna 1604, and a decoder apparatus control system 1608. In some examples, the display screen 1602, the antenna 1604, and the decoder apparatus control system 1608 are communicatively coupled with each other.

The display screen 1602 may include suitable logic, circuitry, interfaces, and/or code that may facilitate rendering or displaying of the content on the display screen 1602. In an example embodiment, the display screen 1602 may be realized through several known technologies such as, Cathode Ray Tube (CRT) based display, Liquid Crystal Display (LCD), Light Emitting Diode (LED) based display, Organic LED display technology, and Retina display technology. In some embodiments, the display screen 1602 may further include a touch panel, such as a thermal touch panel, a capacitive touch panel, and/or a resistive touch panel, which may enable the operator 108 to provide inputs to the decoder apparatus 108.

The antenna 1604 corresponds to an active element that may be configured to generate RF signals when a voltage signal is applied at the antenna element. For example, the antenna 1604 may be configured to generate the RF signal in HF frequency band. In another example, the antenna 1604 may generate the RF signal in the UHF frequency band. Some examples of the antenna 1604 may include, but are not limited to, Bow tie antenna, dipole antenna, monopole antenna, loop antenna, and/or the like.

The trigger button 1606 may include suitable logic and/or circuitry that may facilitate the worker 115 to provide input to the decoder apparatus 108. In an example embodiment, the trigger button 1606 may either be an electro-mechanical button that may be configured to generate an electrical signal when the trigger button 1606 is pressed. Further, the trigger button 1606 may be communicatively coupled to the decoder apparatus control system 1608. In some examples, the scope of the disclosure is not limited to the trigger button 1606 being an electro-mechanical button. In an alternate embodiment, the trigger button 1606 may be a touch-sensitive button, or a gesture based button 1608.

The decoder apparatus control system 1608 may include suitable logic and/or circuitry that may enable the decoder apparatus control system 1608 to control one or more operations of the decoder apparatus 108. For example, the decoder apparatus control system 1608 may be configured to transmit an interrogation signal to the RF tag 116, as is further described in conjunction with FIG. 18. Further, the decoder apparatus control system 1608 may be configured to decode the data packet received from the RF tag 116. The structure and operation of the decoder apparatus control system 1608 is further described in conjunction with FIG. 17.

Figure 17:
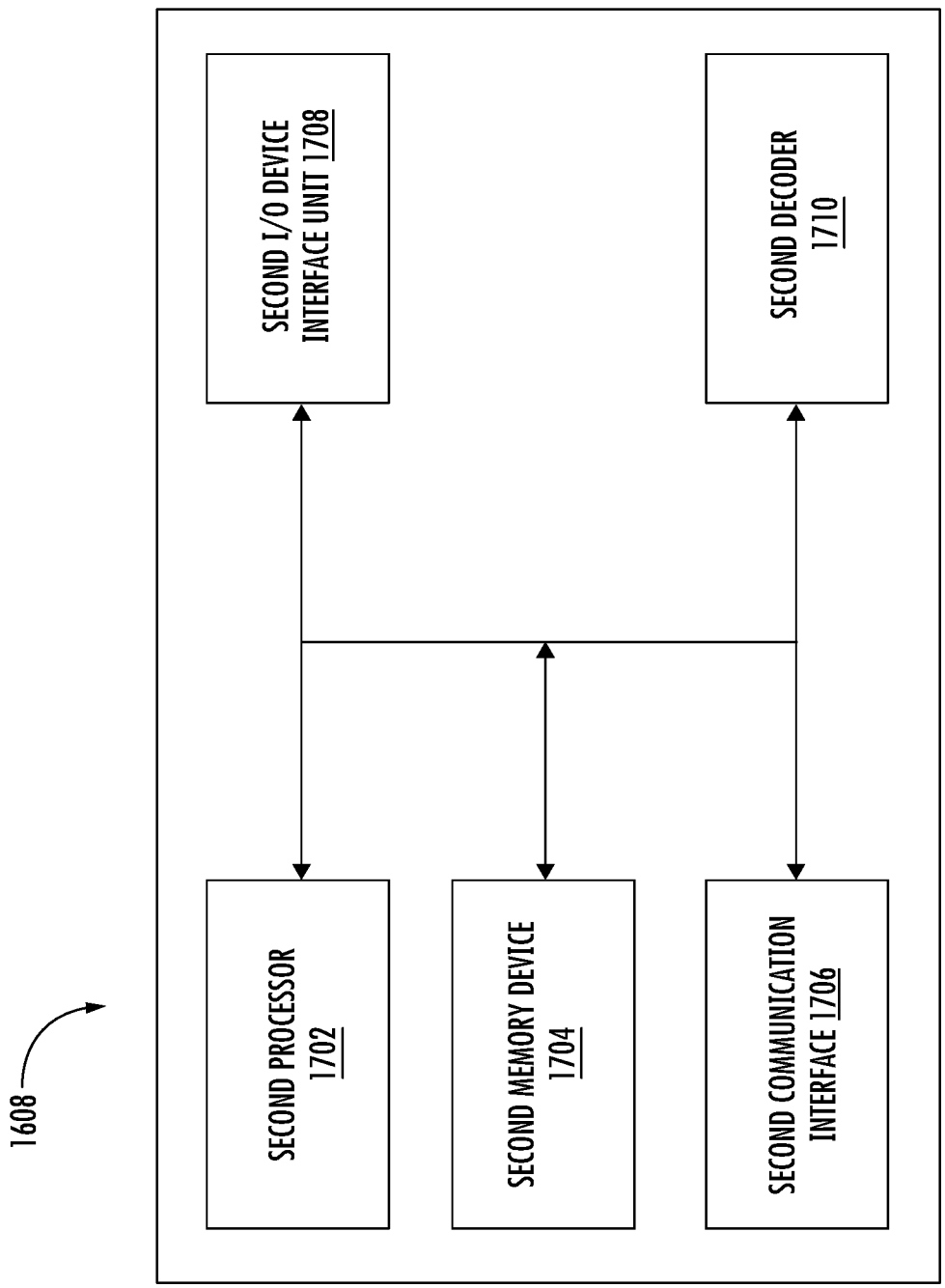
FIG. 17 illustrates a block diagram of the second control system, according to one or more embodiments described herein.

FIG. 17 illustrates a block diagram of the decoder apparatus control system 1608, according to one or more embodiments described herein. The decoder apparatus control system 1608 includes a second processor 1702, a second memory device 1704, a second communication interface 1706, a second I/O device interface unit 1708, and a second decoder 1710.

The second processor 1702 may be embodied as means including one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an application specific integrated circuit (ASIC) or field programmable gate array (FPGA), or some combination thereof. Accordingly, although illustrated in FIG. 17 as a single processor, in an embodiment, the second processor 1702 may include a plurality of processors and signal processing modules. The plurality of processors may be embodied on a single electronic device or may be distributed across a plurality of electronic devices collectively configured to function as the circuitry of the decoder apparatus control system 1608. The plurality of processors may be in operative communication with each other and may be collectively configured to perform one or more functionalities of the circuitry of the second control system 1606, as described herein. In an example embodiment, the second processor 1702 may be configured to execute instructions stored in the second memory device 1704 or otherwise accessible to the second processor 1702. These instructions, when executed by the second processor 1702, may cause the circuitry of the encoder apparatus control system 206 to perform one or more of the functionalities, as described herein.

Whether configured by hardware, firmware/software methods, or by a combination thereof, the second processor 1702 may include an entity capable of performing operations according to embodiments of the present disclosure while configured accordingly. Thus, for example, when the second processor 1702 is embodied as an ASIC, FPGA or the like, the second processor 1702 may include specifically configured hardware for conducting one or more operations described herein. Alternatively, as another example, when the second processor 1702 is embodied as an executor of instructions, such as may be stored in the second memory device 1704, the instructions may specifically configure the second processor 1702 to perform one or more algorithms and operations described herein.

Thus, the second processor 1702 used herein may refer to a programmable microprocessor, microcomputer or multiple processor chip or chips that can be configured by software instructions (applications) to perform a variety of functions, including the functions of the various embodiments described above. In some devices, multiple processors may be provided dedicated to wireless communication functions and one processor dedicated to running other applications. Software applications may be stored in the internal memory before they are accessed and loaded into the processors. The processors may include internal memory sufficient to store the application software instructions. In many devices, the internal memory may be a volatile or nonvolatile memory, such as flash memory, or a mixture of both. The memory can also be located internal to another computing resource (e.g., enabling computer readable instructions to be downloaded over the Internet or another wired or wireless connection).

The second memory device 1704 may include suitable logic, circuitry, and/or interfaces that are adapted to store a set of instructions that is executable by the second processor 1702 to perform predetermined operations. Some of the commonly known memory implementations include, but are not limited to, a hard disk, random access memory, cache memory, read only memory (ROM), erasable programmable read-only memory (EPROM) & electrically erasable programmable read-only memory (EEPROM), flash memory, magnetic cassettes, magnetic tape, magnetic disk storage or other magnetic storage devices, a compact disc read only memory (CD-ROM), digital versatile disc read only memory (DVD-ROM), an optical disc, circuitry configured to store information, or some combination thereof. In an example embodiment, the second memory device 1704 may be integrated with the second processor 1702 on a single chip, without departing from the scope of the disclosure.

The second communication interface 1706 may correspond to a communication interface that may facilitate transmission and reception of messages and data to and from various devices. For example, the second communication interface 1706 is communicatively coupled with a computing device (not shown). For example, through the second communication interface 1706, the decoder apparatus 108 may be configured to receive commands/jobs from the computing device based on which the decoder apparatus 108 may perform predetermined operation. Examples of the second communication interface 1706 may include, but are not limited to, an antenna, an Ethernet port, a USB port, a serial port, or any other port that can be adapted to receive and transmit data. The second communication interface 1706 transmits and receives data and/or messages in accordance with the various communication protocols, such as, I2C, TCP/IP, UDP, and 3G, 4G, 4G or 5G communication protocols.

The second I/O device interface unit 1708 may include suitable logic and/or circuitry that may be configured to communicate with the one or more components of the decoder apparatus 108, in accordance with one or more device communication protocols such as, but not limited to, I2C communication protocol, Serial Peripheral Interface (SPI) communication protocol, Serial communication protocol, Control Area Network (CAN) communication protocol, and 1-Wire® communication protocol. In an example embodiment, the second I/O device interface unit 1708 may communicate with the display screen 1602, the antenna 1604, and a trigger button 1608, for facilitating retrieval of the data packet from the RF tag 116, as is further described in conjunction with FIG. 18. Some examples of the second I/O device interface unit 1708 may include, but not limited to, a Data Acquisition (DAQ) card, an electrical drives driver circuit, and/or the like.

The second decoder 1710 may include suitable logic and/or circuitry that may enable the encoder apparatus 106 to retrieve data packet from the RF tag 116, as is further described in conjunction with FIG. 18. The first decoder 412 may be further configured to decode the encoded data in the data packet, as is further described in conjunction with FIG. 18. The first decoder 412 may be implemented using one or more hardware components, such as, but not limited to, FPGA, ASIC, and the like.

The operation of the decoder apparatus 108 and the decoder apparatus control system 1608 is described in conjunction with FIG. 18.

FIG. 18 illustrates a flowchart 1800 of a method for operating the decoder apparatus 108, according to one or more embodiments described herein.

At step 1802, the decoder apparatus 108 may include means such as the decoder apparatus control system 1608, the second processor 1702, the second I/O device interface unit 1708, the second decoder 1710, and/or the like for receiving an input from the worker 118. In an example embodiment, the worker 115 may provide the input through the trigger button 1606. As discussed, when the trigger button 1606 is pressed, the trigger button 1606 generates an electrical signal that is transmitted to the second I/O device interface unit 1708. In some examples, prior to receiving the input through the trigger button 1606, the I/O device interface unit 408 may receive another input from the worker 118, through the display screen 1602, pertaining to the data category of the data that the worker 115 intends to retrieve from the RF tag 116. The second I/O device interface unit 408 may be configured to store the data category in the second memory device 1704.

In some examples, step 1802 may be optional. In such an embodiment, the worker 115 may provide input only once. Thereafter, the decoder apparatus 108 perform the step 1804 without any intervention from the worker 118.

At step 1804, the decoder apparatus 108 may include means such as the decoder apparatus control system 1608, the antenna 1604, the second processor 1702, the second I/O device interface unit 1708, the second decoder 1710, and/or the like for transmitting the interrogation command to the RF tag 116 through the antenna 1604. Prior to transmitting the interrogation command, the second decoder 1710 may instruct the antenna 1604 to transmit the RF signals to the RF tag 116. The RF signals may cause the RF tag 116 to induce charge, which may be used by the RF tag 116 to power itself (also referred to as power harvesting). Thereafter, the second decoder 1710 may instruct the antenna 1604 to transmit the interrogation signal. In some examples, the second decoder 1710 may cause the antenna 1604 to transmit the RF signals and the interrogation command simultaneously. In such an example scenario, the antenna 1604 may modulate the interrogation command on the RF signal.

At step 1806, the decoder apparatus 108 may include means such as the decoder apparatus control system 1608, the antenna 1604, the second processor 1702, the second I/O device interface unit 1708, the second decoder 1710, and/or the like for determining whether the data packet is received in response to the interrogation signal. If the second decoder 1710 determines that the data packet is not received, the second decoder 1710 may be configured to repeat the step 1806. However, if the second decoder 1710 received the data packet in response to the interrogation signal, the second decoder 1710 may be configured to perform the step 1808.

At step 1808, the decoder apparatus 108 may include means such as the decoder apparatus control system 1608, the second processor 1702, the second I/O device interface unit 1708, the second decoder 1710, and/or the like for decoding the data packet. The process of decoding the data packet is further described in conjunction with FIG. 19.

Figure 19:
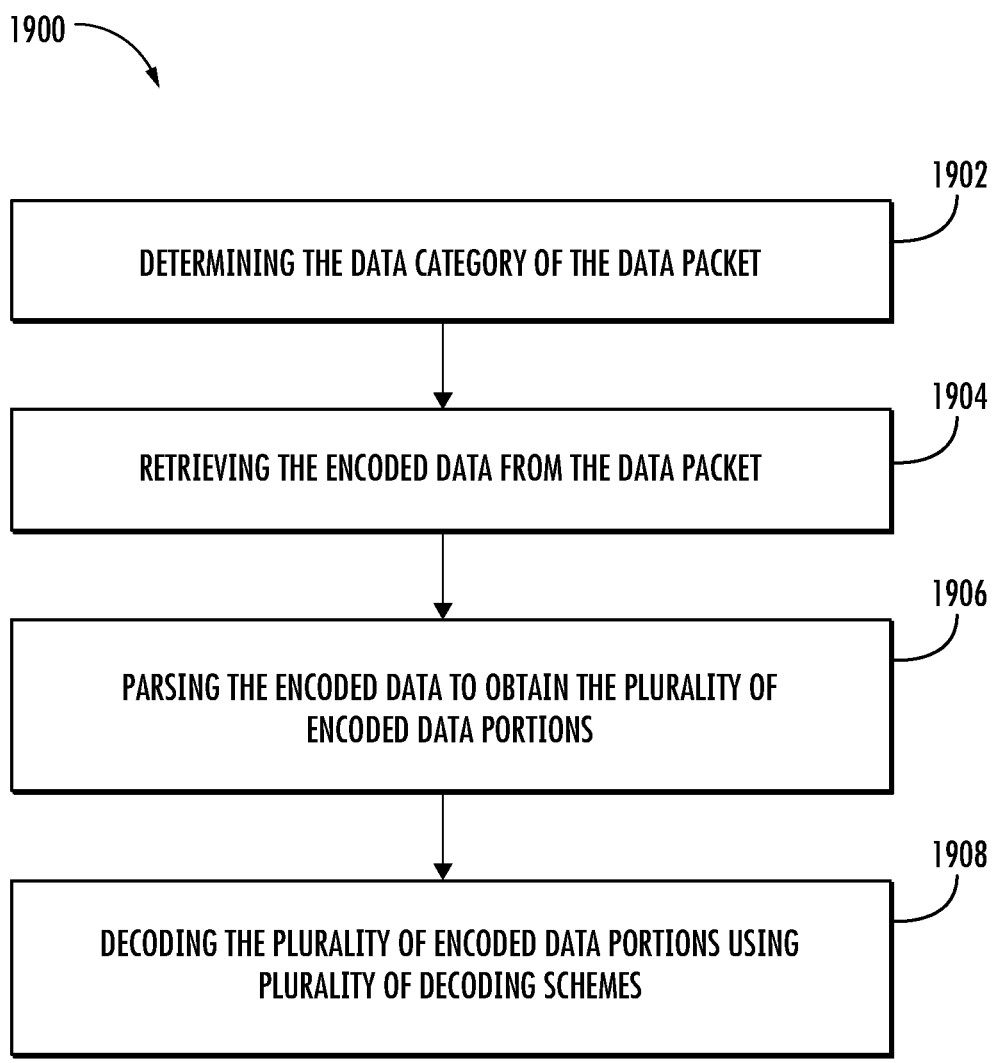
FIG. 19 illustrates another flowchart for decoding the data packet, according to one or more embodiments described herein.

FIG. 19 illustrates another flowchart 1900 for decoding the data packet, according to one or more embodiments described herein.

At step 1902, the decoder apparatus 108 may include means such as the decoder apparatus control system 1608, the second processor 1702, the second decoder 1710, and/or the like for determining the data category of the data packet (received from the RF tag 116). As discussed in the step 1802, the second I/O device interface unit 1708 may receive the other input from the worker 115 pertaining to the data category, which the second I/O device interface unit 1708 stores in the second memory device 1704. Accordingly, the second decoder 1710 may be configured to retrieve the data category from the second memory device 1704.

In an alternate embodiment, the second decoder 1710 may be configured to determine the data category of the data packet from the data packet. The determination of the data category from the data packet is further described in conjunction with FIG. 20.

Figure 20:
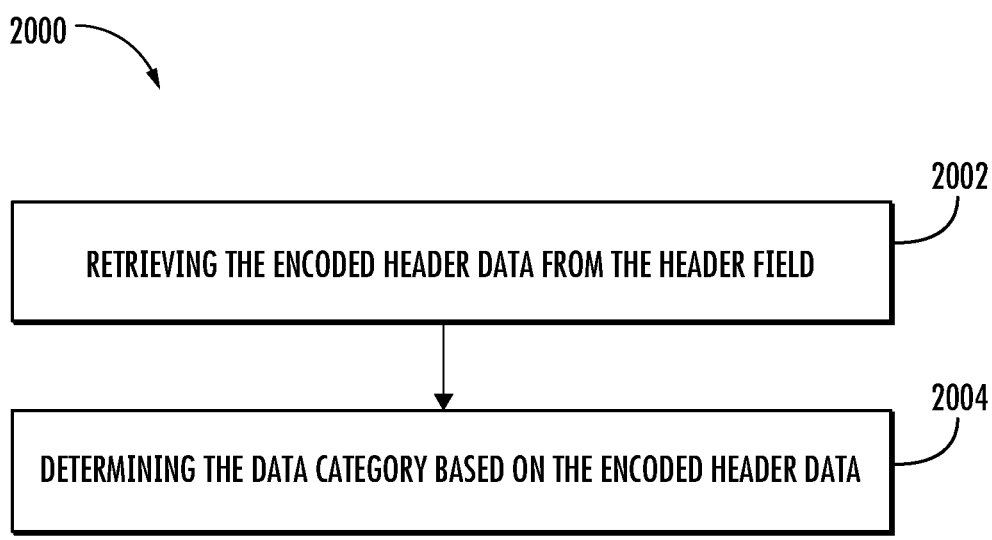
FIG. 20 illustrates a flowchart of a method for determining the data category, according to one or more embodiments described herein.

FIG. 20 illustrates a flowchart 2000 of a method for determining the data category, according to one or more embodiments described herein.

At step 2002, the decoder apparatus 108 may include means such as the decoder apparatus control system 1608, the second processor 1702, the second decoder 1710, and/or the like for retrieving the encoded header data from the header field (e.g., header field 1506) in the first data packet field of the data packet.

At step 2004, the decoder apparatus 108 may include means such as the decoder apparatus control system 1608, the second processor 1702, the second decoder 1710, and/or the like for determining the data category based on the encoded header data. In an example embodiment, the second decoder 1710 may be configured to refer to a second look-up table (stored in the second memory device 1704) to determine the data category. An example of the second look-up table is illustrated below:

TABLE 4

Second look-up table illustrating the correspondence between
the encoded header data and the data category.

| Header data | Data category |
|---|---|
| 1A, 3Z, 4R . . . | Shipping number |
| GHX | SKU |

For example, if the second decoder 1710 determines that the encoded header data is "1A", the second decoder 1710 may determine that the data category associated with the data packet is "Shipping number". Similarly, if the second decoder 1710 determines that the encoded header data is "GHX", the second decoder 1710 determines that the data category associated with data packet is "SKU number".

Referring back to flowchart 1900, at step 1904, the decoder apparatus 108 may include means such as the decoder apparatus control system 1608, the second processor 1702, the second decoder 1710, and/or the like for retrieving the encoded data from the data packet. As discussed, the second data packet field of the data packet includes the encoded data. Accordingly, the second decoder 1710 may be configured to retrieve the encoded data from the second data packet field of the data packet. As discussed above, the RF tag 116 stores the data packet in form of binary bits. Accordingly, the encoded data in the data packet also include binary bits (hereinafter referred as a plurality of binary bits).

Referring back to flowchart 1900, at step 1906, the decoder apparatus 108 may include means such as the decoder apparatus control system 1608, the second processor 1702, the second decoder 1710, and/or the like for parsing the encoded data to obtain the plurality of encoded data portions. In some examples, the second decoder 1710 may utilize similar methodologies as described in the flowchart 1100. For example, the second decoder 1710 may be configured to retrieve a binary bit of the plurality of binary bits from the encoded data. Thereafter, the second decoder 1710 may be configured to refer to a third look-up table to categorize the binary bit into an encoded data portion of the plurality of encoded data portions, based on the one or more third characteristics associated with the binary bit. In an example embodiment, the one or more third characteristics associated with the binary bit may include a position of the binary bit in the encoded data. In an example embodiment, the position of the binary bit in the encoded data may be representative of the semantic information associated with the binary bit. In an example embodiment, the third look-up table illustrates a relation between a position of the binary bit and the semantic information. An example of the third look-up table is illustrated below:

TABLE 5

Third Look-up table illustrating the relation between
position of the binary bits in the encoded data
and the corresponding semantic information.

| Data Category | Semantic information | Encoding scheme used for encoding the corresponding data portion |
|---|---|---|
| Shipper number | Bits 1-32: encoded shipper number | First encoding scheme |
| | Bits 33-43: encoded service level | Second encoding scheme |
| | Bits 44-67: Encoded identifier number | Third encoding scheme |
| | Bits 68-84: Encoded zip code. | Third encoding scheme |
| SKU | Bits 1-8: Manufacture ID | Second encoding scheme |
| | Bits 9-24 Product ID | First encoding scheme |
| | Bits 25-57 Year of manufacture | Second encoding scheme |

For example, the first 32 bits of the encoded data represents encoded shipping number. Similarly, the next 11 bits of the encoded data represents the encoded service level.

Referring to the third look-up table, the second decoder 1710 may be configured to categorize the first 32 bits of the encoded data in a first encoded data portion such that a set of binary bits in the first encoded data portion represent the encoded shipper number. Similarly, the second decoder 1710 categorizes the next 11 bits of the encoded data in to a second encoded data portion such that the set of binary bits in the second encoded data portion represents the encoded service level. Additionally, or alternatively, the second decoder 1710 may be further configured to determine the encoding schemes that were utilized by the encoder apparatus 106 to obtain the plurality of encoded data portions. For example, the second decoder 1710 may determine that the set of binary bits in the first encoded data portion and the second encoded data portions were generated by encoding the set of characters in the first data portion and the second data portion using the first encoding scheme and the second encoding scheme, respectively.

At step 1908, the decoder apparatus 108 may include means such as the decoder apparatus control system 1608, the second processor 1702, the second decoder 1710, and/or the like for decoding the plurality of encoded data portions using plurality of decoding schemes. In an example embodiment, the second decoder 1710 may utilize different decoding schemes for plurality of encoded data portions. For example, the second decoder 1710 may utilize a first decoding scheme for decoding the first encoded data portion (encoded using first encoding scheme). In an example embodiment, the second decoding scheme complementary to the second encoding scheme. In another example, the second decoder 1710 may utilize a second decoding scheme for decoding the second encoded portion (encoded using second encoding scheme). In an example embodiment, the second decoding scheme complementary to the second encoding scheme. An example decoding scenario is further illustrated FIG. 22.

Figure 21:
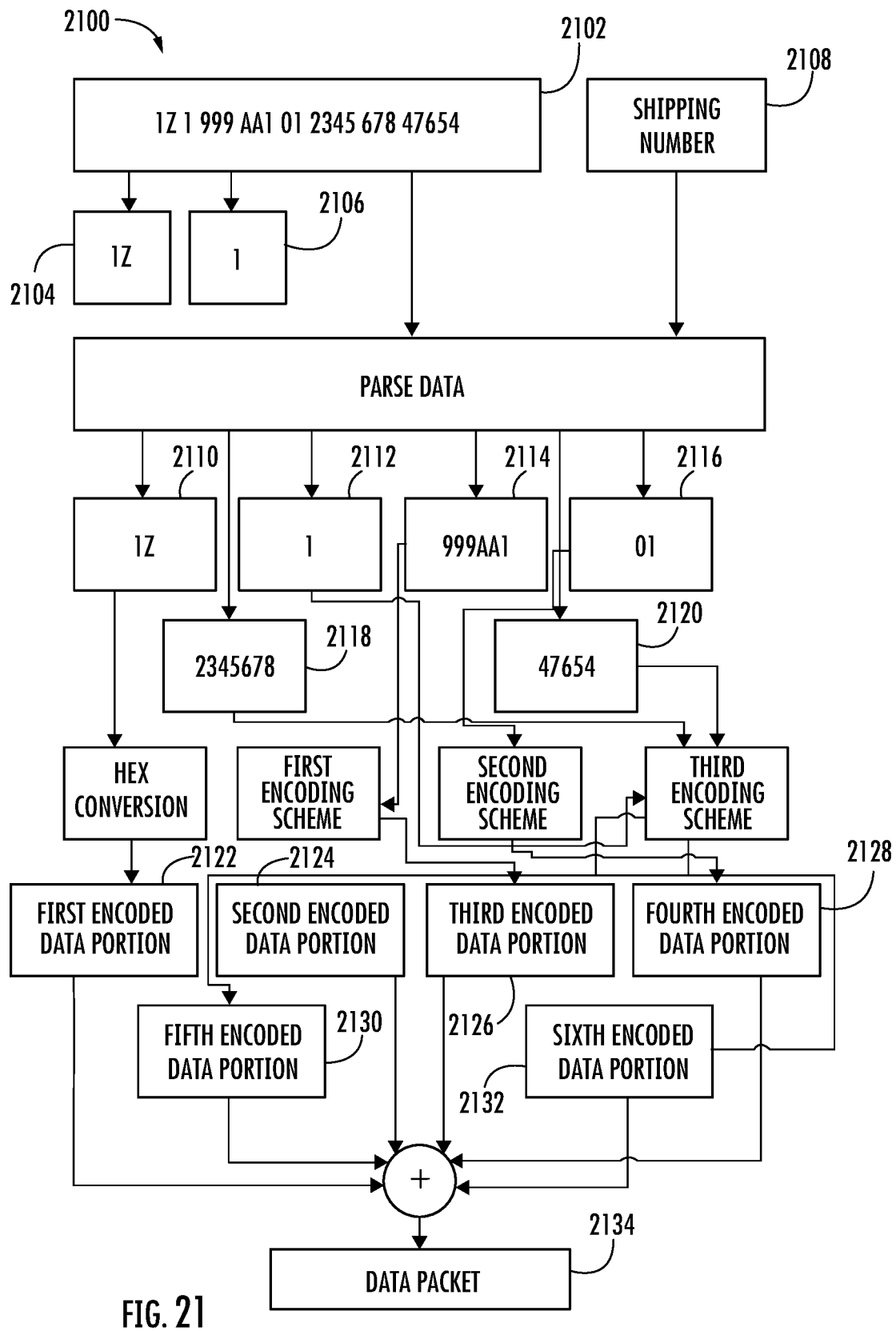
FIG. 21 illustrates an example scenario of encoding the data, according to one or more embodiments described herein.

FIG. 21 illustrates an example scenario 2100 of encoding the data, according to one or more embodiments described herein. The example scenario 2100 is described in conjunction with FIG. 10.

As depicted by the example scenario 2100, the encoder apparatus 106 receives the data "1Z 1 999 AA1 01 2345 678 47654" (depicted by 2102) from the computing device (not shown). Further, the data (depicted by 2102) includes the header data (depicted by 2104) and the error correction data (depicted by 2106). For instance, the header data 2104 in the received data is "1Z" and the error correction data 2106 in the received data 2102 is "1". In some examples, the encoder apparatus 106 further receives information pertaining to the data category (depicted by 2108) associated with the received data. For example, the encoder apparatus 106 receives the data category as "shipping number" (depicted by 2108).

Thereafter, the first encoder 410 may be configured to parse the data 2106 to obtain the plurality of data portions based on the data category associated with the data. The first encoder 410 may utilize the first look-up table (table 1, table 2, table 3) to parse the data, as is described in the step 1102. Accordingly, the first encoder 410 parses the data (depicted by 2102) to obtain six data portions, as illustrated below:

TABLE 6

Six data portion obtained from the data 2102

| Data portion | Content |
| --- | --- |
| First data portion (depicted by 2110) | 1Z |
| Second data portion (depicted by 2112) | 1 |
| Third data portion (depicted by 2114) | 999AA1 |
| Fourth data portion (depicted by 2116) | 01 |
| Fifth data portion (depicted by 2118) | 2345678 |
| Sixth data portion (depicted by 2120) | 47654 |

The first data portion 2110 includes the set of characters representing the header data 2104. Further, the second data portion 2112 includes the set of characters representing the error correction data 2106.

Thereafter, the first encoder 410 may be configured to encode each of the six data portions (2110-2120) by utilizing the steps described in the flowcharts 1000, 1300 or 1400. Prior to encoding the plurality of data portions, the first encoder 410 may be configured to determine the plurality encoding schemes to be used to encode the plurality of data portions (e.g., the six data portions). In some examples, the first encoder 410 may be configured to utilize the other example of the first look-up table (table 2) to determine the plurality of encoding schemes. For example, the first encoder 410 may determine that the third data portion is to be encoded using the first encoding scheme. Similarly, the first encoder 410 may determine that the fourth data portion may be encoded using the second encoding scheme. In another example, as described in step 1010, the first encoder 410 may determine that the first data portion (that includes the set of characters representing the header data 2104) is to be converted to Hex during encoding of the six data portions (2110-2120). Further, the first encoder 410 may be configured to determine that the second data portion is to be encoded using binary encoding scheme during encoding of the six data portions (2110-2120). After determination of the plurality of encoding schemes, the first encoder 410 may be configured to encode the six data portions (2110-2120) using the respective encoding schemes to generate the six encoded data portions (2122-2132). Thereafter, the first encoder 410 concatenates the six of encoded data portions (2122-2132) to generate the data packet (depicted by 2134).

In an example embodiment, the first encoding scheme is URN 40 encoding scheme, the second encoding scheme is URN 40 lite encoding scheme and the third encoding scheme is binary encoding scheme, respectively. In some examples, the scope of the disclosure is not limited to the aforementioned encoding schemes. In an example, the embodiment, other encoding schemes such as ASCII encoding scheme, HEX encoding scheme, and/or the like, without departing from the scope of the disclosure. The encoding of the third data portion 2114 using the URN 40 encoding scheme is further described in conjunction with FIG. 22.

Figure 22:
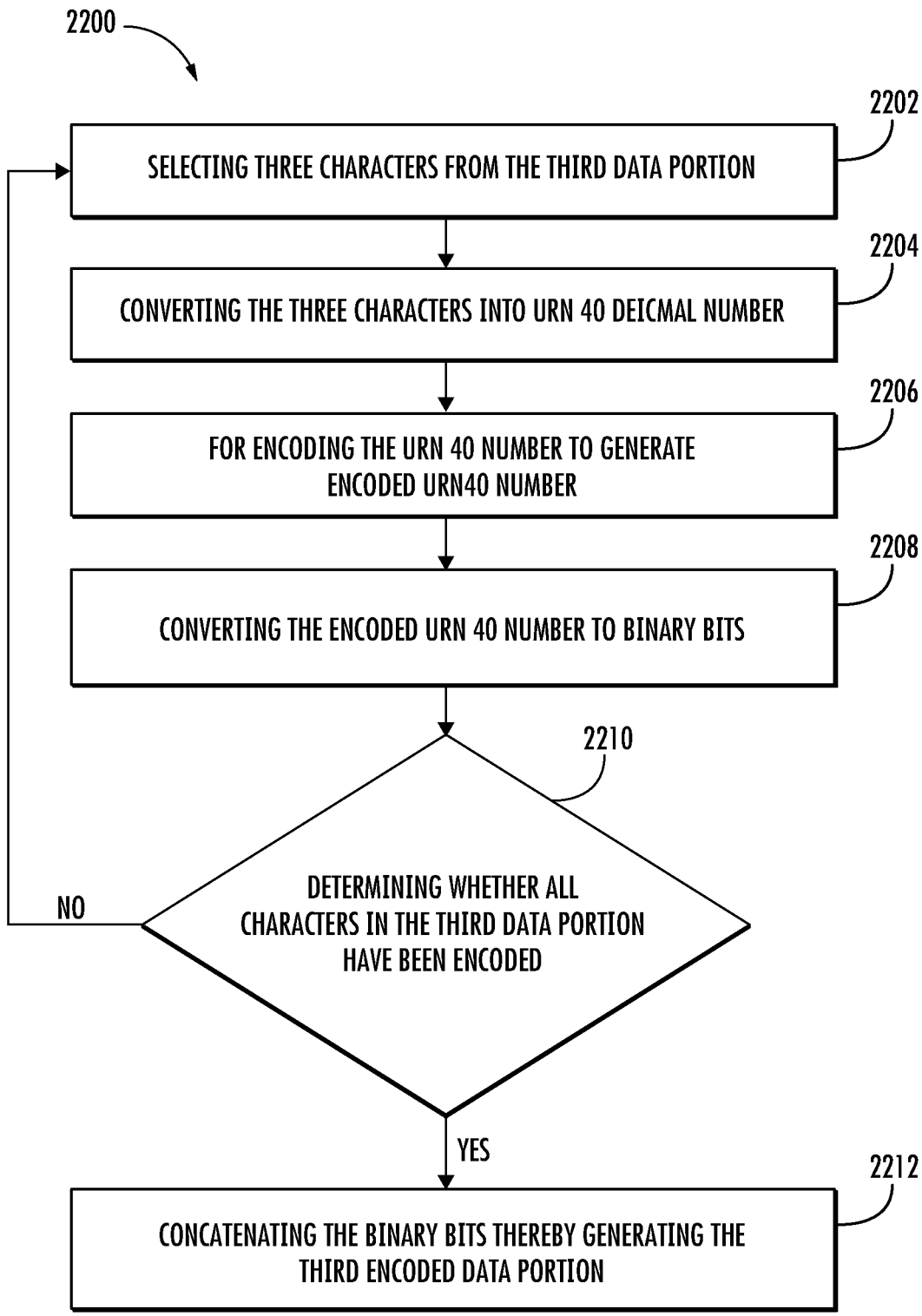
FIG. 22 illustrates a flowchart of a method for encoding the third data portion using the URN 40 encoding scheme, according to one or more embodiments described herein.

FIG. 22 illustrates a flowchart 2200 of a method for encoding the third data portion 2114 using the URN 40 encoding scheme, according to one or more embodiments described herein.

At step 2202, the encoder apparatus 106 includes means such as, the encoder apparatus control system 206, the first processor 402, the first encoder 410, and/or the like for selecting three characters from the third data portion (depicted by 2114). In some examples, the first encoder 410 may select the three characters in accordance with the position of the characters in the data. For instance, in the first iteration, the first encoder 410 may select the three characters as "999", as the characters "999" precedes the other characters in the data.

At step 2204, the encoder apparatus 106 includes means such as, the encoder apparatus control system 206, the first processor 402, the first encoder 410, and/or the like for converting the three characters into URN 40 decimal number. In an example embodiment, the first encoder 410 may utilize following fourth look-up table to convert each character into URN 40 decimal number to generate a URN 40 number:

TABLE 7

Depicting mapping between characters in a data portion and URN 40 decimal number

| Character in third data portion | URN Code 40 (decimal) |
| --- | --- |
| PAD | 0 |
| A | 1 |
| B | 2 |
| ... | ... |
| Z | 26 |
| — | 27 |
|   | 28 |
| : | 29 |
| 0 | 30 |
| 1 | 31 |
| ... | ... |
| 9 | 39 |

Accordingly, during first iteration, the first encoder 410 may convert "999" to "393939".

Thereafter, at step 2206, the encoder apparatus 106 includes means such as, the encoder apparatus control system 206, the first processor 402, the first encoder 410, and/or the like for encoding the URN 40 number to generate encoded URN 40 number. In an example embodiment, the first encoder 410 may be configured to utilize the following equation to encode the URN 40 number:

$$(1600*C1)+(40*C2)+C3+1 \qquad (1)$$

Where,
C1: URN 40 decimal number (e.g., 39) corresponding a first character of the three characters;
C2: URN 40 decimal number (e.g., 39) corresponding a second character of the three characters; and
C3: URN 40 decimal number (e.g., 39) corresponding a third character of the three characters.

For example, the first encoder 410 may apply equation 1 on URN 40 number "393939" to generate encoded URN 40 number "63964".

At step 2208, the encoder apparatus 106 includes means such as the encoder apparatus control system 206, the first processor 402, the first encoder 410, and/or the like for converting the encoded URN 40 number to binary bits. For example, the first encoder 410 may convert the encoded URN 40 number "63964" to binary bits "1111100111011100".

At step 2210, the encoder apparatus 106 includes means such as, the encoder apparatus control system 206, the first processor 402, the first encoder 410, and/or the like for determining whether all characters in the third data portion 2114 have been encoded. If the first encoder 410 determines that all the characters of the third data portion (depicted 2114) have been encoded, the first encoder 410 may be configured to perform the step 2212. However, if the first encoder 410 determines that all the characters of the third data portion (depicted 2114) have not been encoded, the first encoder 410 may be configured to repeat the step 2202.

At step 2210, the encoder apparatus 106 includes means such as, the encoder apparatus control system 206, the first processor 402, the first encoder 410, and/or the like for concatenating the binary bits (generated in step 2208) thereby generating the third encoded data portion. In an example embodiment, the third encoded data portion includes 32 binary bits.

Referring back to FIG. 21, the first encoder 410 may encode the fourth data portion (depicted by 2116) using URN 40 lite (which corresponds to the second encoding scheme).

To encode the fourth data portion (depicted by 2116), the first encoder 410 may be configured to convert the characters in the fourth data portion (depicted by 2116) to URN 40 number, as is described in the step 2202. For instance, the first encoder 410 converts fourth data portion (depicted by 2116) "01" to URN 40 number "3031". Thereafter, the first encoder 410 may be configured to utilize following equation to generate encoded URN 40 number:

$$(40*C4)+C5+1 \quad (2)$$

Where,

C4: URN 40 decimal number (e.g., 30) corresponding a first character of the two characters; and C5: URN 40 decimal number (e.g., 31) corresponding a second character of the two characters.

For example, the first encoder 410 may convert the URN 40 number "3031" to encoded URN 40 number "1232". Further, the first encoder 410 may convert the encoded URN 40 number "1232" to binary bits "10011010000". In an example embodiment, the fourth encoded data portion includes 11 binary bits.

For the remaining two data portions (i.e., the fifth data portion 2118 and the sixth data portion 2120), the first encoder 410 utilizes the binary encoding scheme to encode the fifth data portion 2118 and the sixth data portion 2120.

Figure 23:
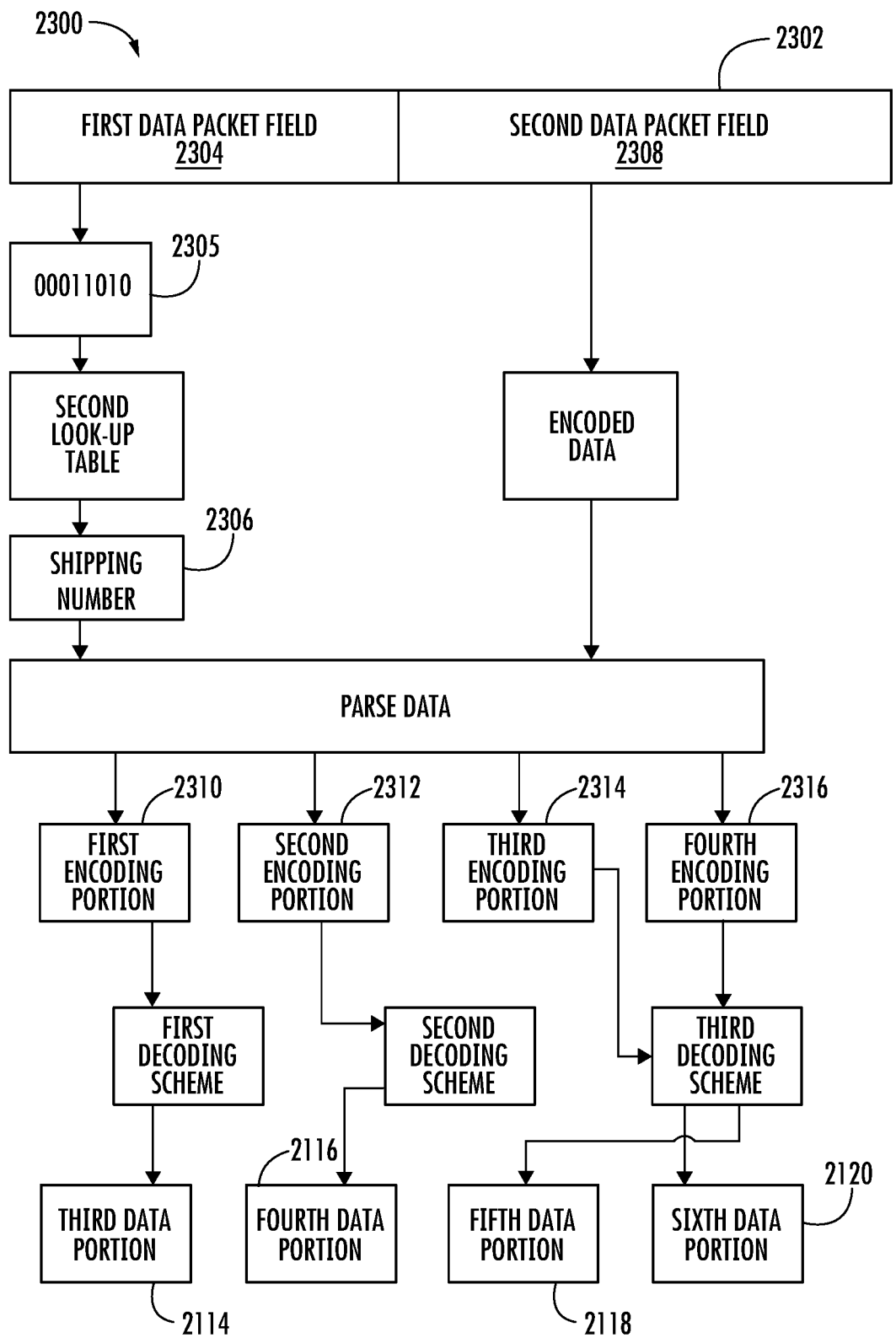
FIG. 23 illustrates an example scenario of decoding of the data packet, according to one or more embodiments described herein.

FIG. 23 illustrates an example scenario 2300 of decoding of the data packet, according to one or more embodiments described herein.

The decoder apparatus 108 receives the data packet (depicted by 2302) from the RF tag 116. The second decoder 1710 in the decoder apparatus 108 may utilize the second look-up table (table 4) to determine the data category associated with the data packet. To determine the data category, the second decoder 1710 may be configured to retrieve the header data from the first data packet field 2304. Thereafter, the second decoder 1710 may be configured to utilize the second look-up table to determine the data category associated with the data packet 2302, as is described in the step 2004. For example, the header data is "00011010" (depicted by 2305), which in hex corresponds to "1A". The second decoder 1710 refers the second lookup table to determine that the encoded data packet corresponds to the "shipping number" (depicted by 2306). Thereafter, the second decoder 1710 may be configured to extract the encoded data from second data packet field 2308 of the data packet 2302.

Thereafter, the second decoder 1710 may be configured to parse the encoded data to obtain the plurality of encoded data portions based on the data category associated with the data packet 2302, as is described in the step 1906. Since the data category associated with the data packet 2302 is "shipping number" (depicted by 2306), the second decoder 1710 may utilize the third look-up table (table 5) to parse the binary bits in the encoded data based on the position of the binary bits in the encoded data and categorize the binary bits in the plurality of encoded data portions. For example, the second decoder 1710 may categorize the first 32 bits of the encoded data in the first encoded data portion (depicted by 2310). Further, the second decoder 1710 may categorize the next 11 bits of the encoded data in the second encoded data portion 2312. In some examples, the second decoder 1710 may categorize the binary bits in the encoded data into four encoded data portions (2310-2316) based on the third look-up table (e.g., table 5). Further, the second decoder 1710 may be configured to determine, for each of the plurality of encoded data portions (2310-2316), the respective encoding schemes that was used by the encoder apparatus 106 to generate the plurality of encoded data portions (2310-2316), as is described in the step 1906. For example, the second decoder 1710 may determine the first encoding scheme (i.e., URN 40 encoding scheme) was used to obtain the first encoded data portion 2310. Further, the second decoder 1710 determines that the URN 40 lite encoding scheme was used to obtain the second encoded data portion 2312.

Thereafter, the second decoder 1710 may be configured to apply the plurality of decoding schemes complementary to the plurality of encoding schemes used to generate the plurality of data portions (2114-2120). For example, the second decoder 1710 may be configured to decode the first encoded data portion 2310 using URN 40 decoding scheme to generate the third data portion. Further, the second decoder 1710 may be configured to decode the second encoded data portion 2312 using URN 40 lite decoding scheme to generate the fourth data portion 2116. Furthermore, the second decoder 1710 may be configured to decode remaining encoded data portions (the third encoded data portion 2314 and the fourth encoded data portion 2316) using binary decoding scheme. The URN 40 decoding scheme and the URN 40 lite decoding scheme are further described in conjunction with FIG. 24.

Figure 24:
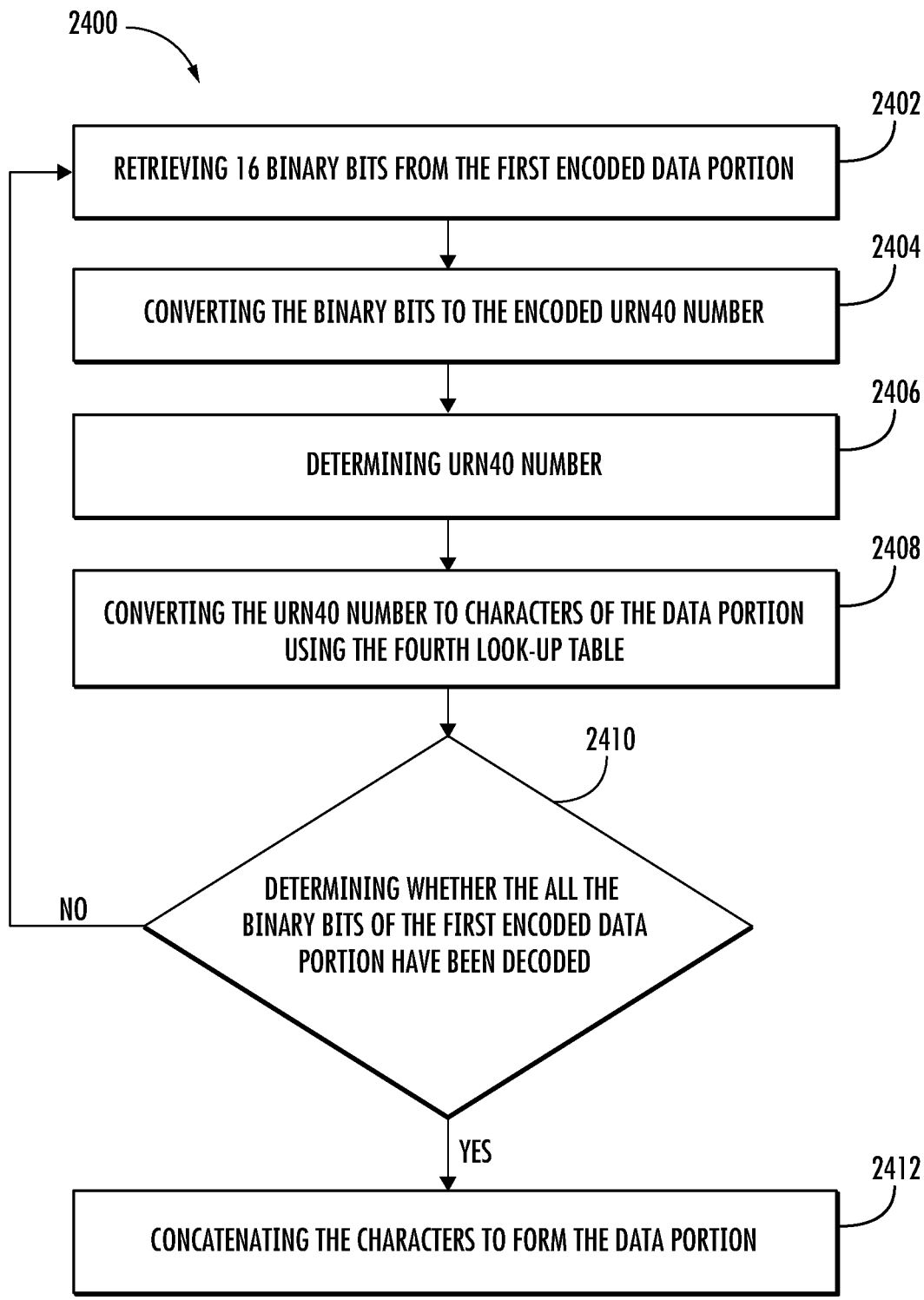
FIG. 24 illustrates a flowchart of a method for decoding the first encoded data portion using URN 40 decoding scheme, according to one or more embodiments described herein.

FIG. 24 illustrates a flowchart 2400 of a method for decoding the first encoded data portion 2310 using URN 40 decoding scheme, according to one or more embodiments described herein.

At step 2402, the decoder apparatus 108 includes means such as, the decoder apparatus control system 1608, the second processor 1702, the second decoder 1710, and/or the like for retrieving 16 binary bits from the first encoded data portion 2310. As discussed above in conjunction with FIGS. 21 and 22, the encoding of the third data portion 2114 generates 32 binary bits. Accordingly, during first iteration, the second decoder 1710 retrieves first 16 bits from the first encoded data portion (depicted by 2310) during first iteration.

At step 2404, the decoder apparatus 108 includes means such as, the decoder apparatus control system 1608, the second processor 1702, the second decoder 1710, and/or the like for converting the binary bits to the encoded URN 40 number. For example, the second decoder 1710 converts the binary bits "1111100111011100" to encoded URN 40 number "63964".

At step 2406, the decoder apparatus 108 includes means such as, the decoder apparatus control system 1608, the second processor 1702, the second decoder 1710, and/or the like for determining URN 40 number by utilizing following equations:

$$C3 = (\text{Encoded\_value}-1) \text{modulo } 40 \quad (3)$$

$$C2 = \{(\text{Encoded\_value}-C3-1) \text{modulo } 1600\}/40 \quad (4)$$

$$C1 = (\text{Encoded\_value}-C2*40-C3A-1)/1600 \quad (5)$$

Where,
Encoded_value: Encoded URN 40 number

For example, using the equations 3-5, the second decoder 1710 may be configured to decode the encoded URN 40 number "63964" to URN 40 number "393939".

At step 2406, the decoder apparatus 108 includes means such as, the decoder apparatus control system 1608, the second processor 1702, the second decoder 1710, and/or the like for converting the URN 40 number to characters of the data portion using the fourth look-up table. For example, the second decoder 1710 may be configured to retrieve the first two digits of the URN 40 number "39" and may refer to the fourth look-up table to determine the first character "9" of the data portion. Similarly, the second decoder 1710 may determine other characters of the data portion.

At step 2408, the decoder apparatus 108 includes means such as, the decoder apparatus control system 1608, the second processor 1702, the second decoder 1710, and/or the like for determining whether the all the binary bits of the first encoded data portion 2310 have been decoded. If the second decoder 1710 determines that not all the binary bits of the first encoded data portion 2310 have been decoded, the second decoder 1710 may be configured to repeat the step 2402. However, if the second decoder 1710 determines that all the binary bits of the first encoded data portion 2310 have been decoded, the second decoder 1710 may be configured to perform the step 2410. At step 2410, the decoder apparatus 108 includes means such as, the decoder apparatus control system 1608, the second processor 1702, the second decoder 1710, and/or the like for concatenating the characters to form the data portion.

To decode the second encoded data portion 2312 encoded using the URN 40 lite, the second decoder 1710 may be configured to convert the 11 binary bits (obtained by encoding of the fourth data portion 2116) to the corresponding encoded URN 40 lite decimal number. For example, the second decoder 1710 may convert the binary bits "10011010000" to "1232". Thereafter, the second decoder 1710 may be configured to utilize the following equations to obtain the URN 40 number.

$$C4 = (\text{Encoded\_value}-1) \text{modulo } 40 \quad (6)$$

$$C5 = (\text{Encoded\_value}-C4-1)/40 \quad (7)$$

For example, the second decoder 1710 may be configured to decode "1232" using the equations 6 and 7 to obtain URN 40 number as "3031". thereafter, the second decoder 1710 may be configured to convert the URN 40 number to the characters in the fourth data portion 2116 using the fourth look-up table. For example, the second decoder 1710 may convert the URN 40 number "3031" to "01".

Since the second decoder 1710 is capable of parsing the encoded data into plurality of encoded data portions and decode each of the plurality of encoded data portion independently, therefore, in example scenarios, the second decoder 1710 may be capable of retrieving a particular data portion instead of retrieving the complete encoded data to retrieve the particular data portion. Such capability of the second decoder 1710 is advantageous in scenarios, where the multiple RF tags have been installed (e.g., the storage section 106 of the warehouse 102) and the worker 115 may wish to identify RF tag 116 of the multiple RF tags that includes the particular data portion. On such method of identifying the RF tag 116 storing the particular data portion is further described in conjunction with FIG. 25.

Figure 25:
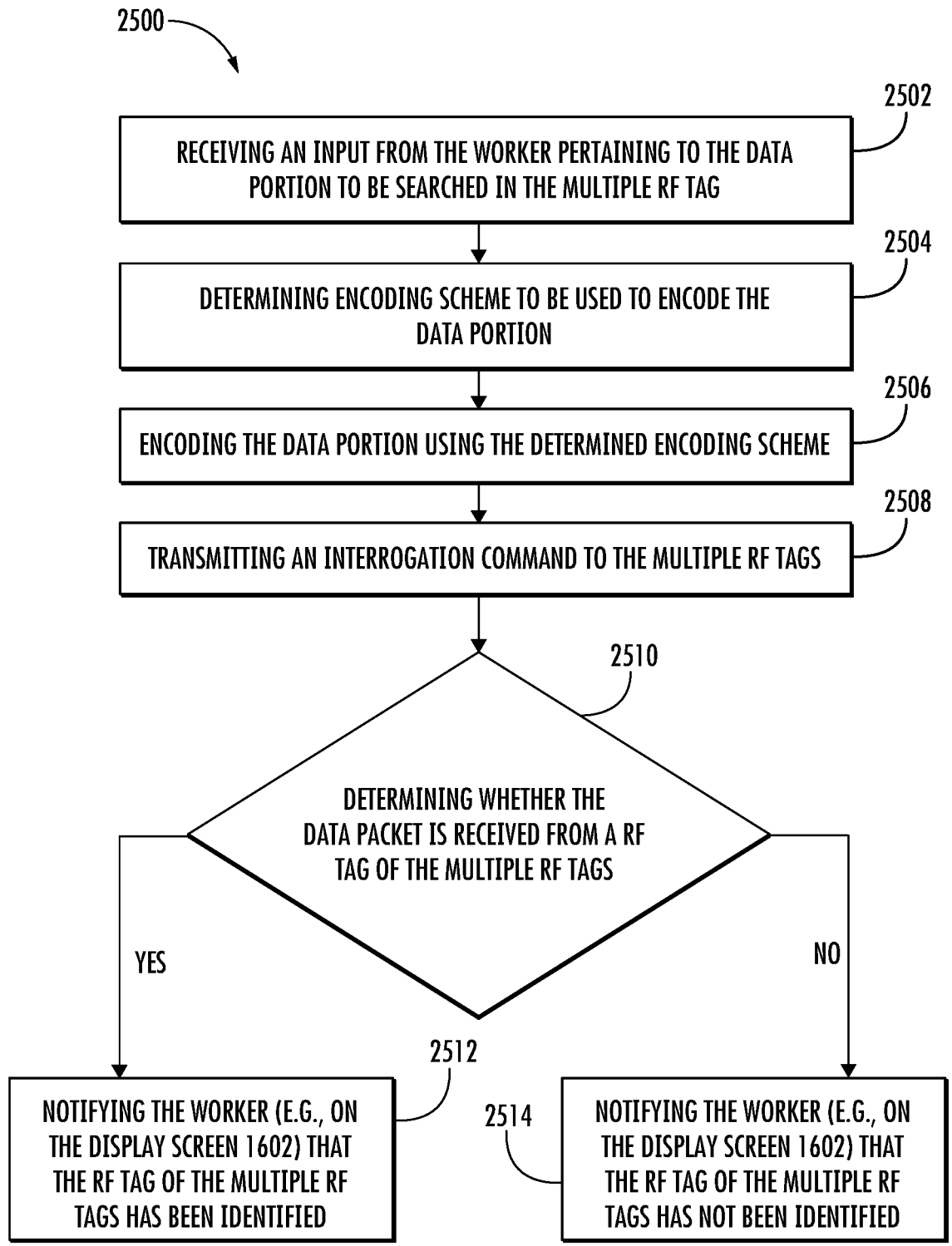
FIG. 25 illustrates a method for identifying the RF tag storing a particular data portion, according to one or more embodiments described herein.

FIG. 25 illustrates a method for identifying the RF tag storing the particular data portion, according to one or more embodiments described herein.

At step 2502, the decoder apparatus 108 includes means such as the decoder apparatus control system 1608, the second processor 1702, the second I/O device interface unit 1708, the antenna 1604, second decoder 1710, and/or the like for receiving an input from the worker 115 pertaining to the data portion to be searched in the multiple RF tag 116. In some examples, the second I/O device interface unit 1708 may further receive input pertaining to the semantic information associated with the data portion. In some examples, the data portion received from the worker 115 may only correspond to a portion of the data stored in the multiple RF tags. For example, if the multiple RF tags store the shipping number, the data portion to be searched may correspond to the service level in the shipping number. Further, the service level may correspond to the semantic information associated with the data portion. Therefore, the first I/O device interface unit 408 may receive the data portion (to be searched) and the "service level" as the semantic information.

In some examples, the scope of the disclosure is not limited to receiving an input from the worker 115 pertaining to the data portion to be searched in the multiple RF tag 116. In an alternative embodiment, the second processor 1702 may receive the input (pertaining to the data portion to be searched in the multiple RF tag 116) from a remote computer or an application running on the remote computer.

At step 2504, the decoder apparatus 108 includes means such as the decoder apparatus control system 1608, the second processor 1702, the second I/O device interface unit 1708, the antenna 1604, second decoder 1710, and/or the like for determining encoding scheme to be used to encode the data portion. To encode the data portion, the second processor 1702 may be configured to determine an encoding scheme of the plurality of encoding schemes to be used for encoding the data portion. In some examples, the second processor 1702 may be configured to determine the encoding scheme using the first look-up table (table 2) based on the semantic information associated with the data portion. For example, the second processor 1702 may determine (using the first look-up table (table 2)) that the data portion that represents the service level is to be encoded using the second encoding scheme.

Accordingly, at step 2506, the decoder apparatus 108 includes means such as the decoder apparatus control system 1608, the second processor 1702, the second I/O device interface unit 1708, the antenna 1604, second decoder 1710, and/or the like for encoding the data portion using the determined encoding scheme. For example, the second processor 1702 may be configured to encode the data portion using the second encoding scheme (hereinafter referred to as encoded data portion).

At step 2508, the decoder apparatus 108 includes means such as the decoder apparatus control system 1608, the second processor 1702, the second I/O device interface unit

1708, the antenna 1604, second decoder 1710, and/or the like for transmitting an interrogation command to the multiple RF tags. In some examples, the second decoder 1710 may be configured to transmit the interrogation command to the RF tag 116 using the method described in the step 1802. In an example embodiment, the interrogation command may include the encoded data portion.

Upon receiving the interrogation signal, each RF tag in the multiple RF tags may be configured to compare the encoded data portion with the data portion in the data packet to determine whether the encoded data portion is present in the RF tag. If the encoded data portion is present in the RF tag, the RF tag may response by transmitting the data packet. If the encoded data portion is not present in the RF tag, the RF tag does nothing.

At step 2510, the decoder apparatus 108 includes means such as the decoder apparatus control system 1608, the second processor 1702, the second I/O device interface unit 1708, the antenna 1604, second decoder 1710, and/or the like for determining whether the data packet is received from a RF tag of the multiple RF tags. If the second decoder 1710 receives the data packet from the RF tag, the second decoder 1710 may be configured to perform the step 2512. However, if the second decoder 1710 does not receive the data packet in response to the transmission of the interrogation signal, the second decoder 1710 may be configured to perform the step 2514.

At step 2512, the decoder apparatus 108 includes means such as the decoder apparatus control system 1608, the second processor 1702, the second I/O device interface unit 1708, the antenna 1604, second decoder 1710, and/or the like for notifying the worker 115 (e.g., on the display screen 1602) that the RF tag of the multiple RF tags has been identified. At step 2514, the decoder apparatus 108 includes means such as the decoder apparatus control system 1608, the second processor 1702, the second I/O device interface unit 1708, the antenna 1604, second decoder 1710, and/or the like for notifying the worker 115 (e.g., on the display screen 1602) that the RF tag of the multiple RF tags has not been identified.

Figure 26:
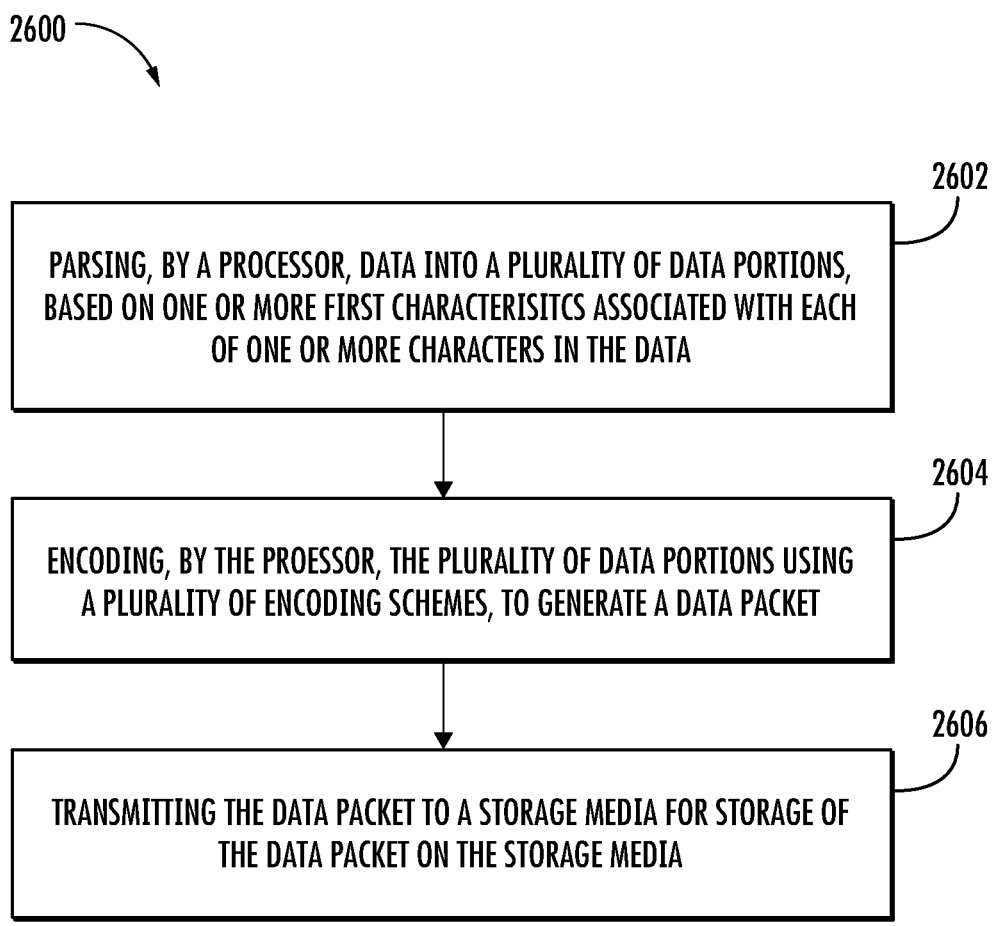
FIG. 26 illustrates a flowchart of a method for encoding data, according to one or more embodiments described herein.

FIG. 26 illustrates a flowchart 2600 of a method for encoding data, according to one or more embodiments described herein.

At step 2602, the encoder apparatus 106 includes means such as, the encoder apparatus control system 206, the first processor 402, the first encoder 410, and/or the like for parsing, by a processor, data into a plurality of data portions, based on one or more first characteristics associated with each of one or more characters in the data, wherein the one or more first characteristics include at least a position of the one or more characters in the data.

At step 2604, the encoder apparatus 106 includes means such as, the encoder apparatus control system 206, the first processor 402, the first encoder 410, and/or the like for encoding, by the processor, the plurality of data portions using a plurality of encoding schemes, to generate a data packet, such that a first data portion of the plurality of data portions is encoded using a first encoding scheme of the plurality of encoding schemes and a second data portion of the plurality of data portions is encoded using a second encoding scheme of the plurality of encoding schemes, wherein the first encoding scheme is different from the second encoding scheme.

At step 2606, the encoder apparatus 106 includes means such as, the encoder apparatus control system 206, the first processor 402, the first encoder 410, and/or the like for transmitting the data packet to a storage media for storage of the data packet on the storage media.

Figure 27:
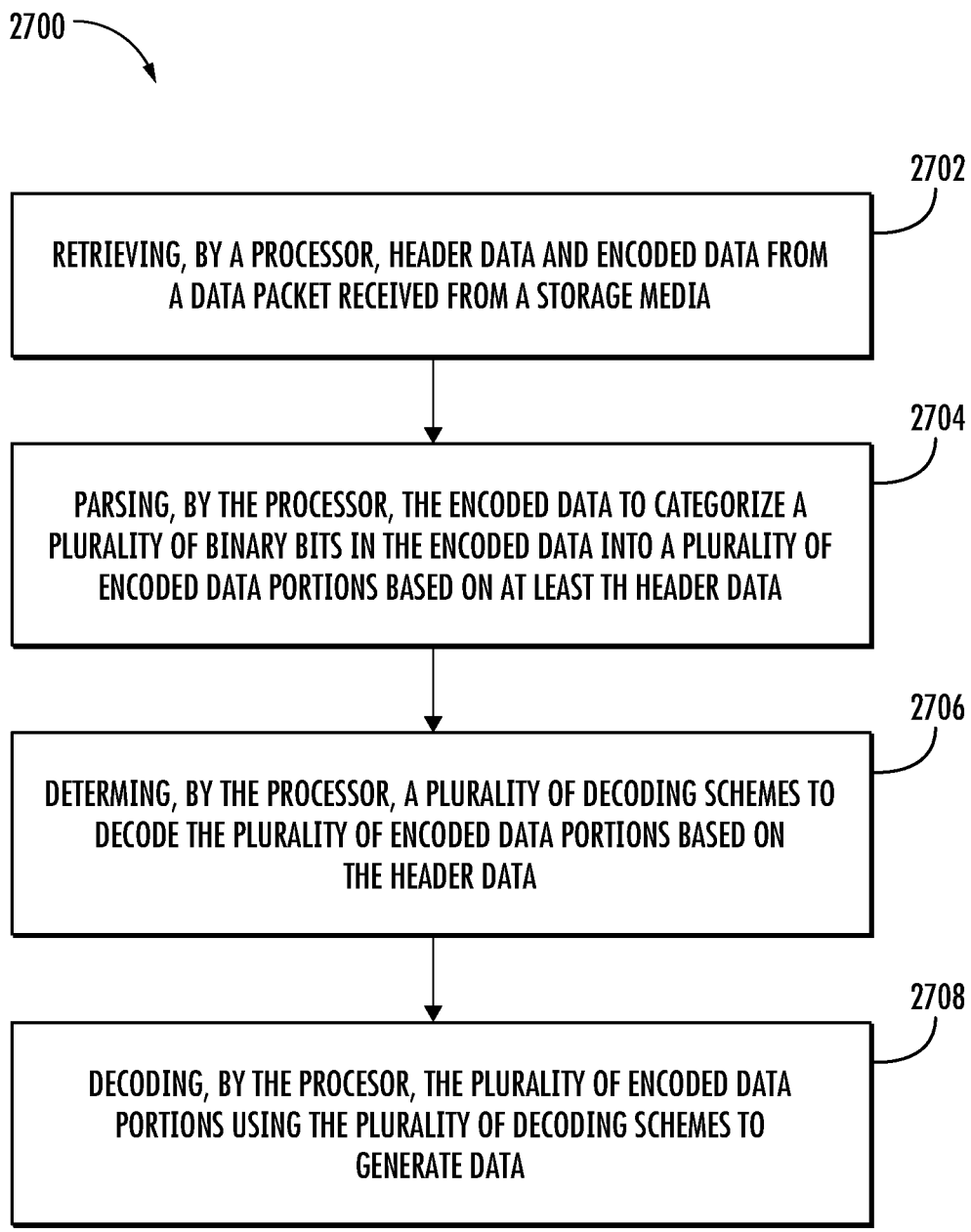
FIG. 27 illustrates a flowchart of a method for decoding data packet, according to one or more embodiments described herein.

FIG. 27 illustrates a flowchart 2700 of a method for decoding data packet, according to one or more embodiments described herein.

At step 2702, the decoder apparatus 108 includes means such as the decoder apparatus control system 1608, the second processor 1702, the second I/O device interface unit 1708, the antenna 1604, second decoder 1710, and/or the like for retrieving, by a processor, header data and encoded data from a data packet received from a storage media.

At step 2704, the decoder apparatus 108 includes means such as the decoder apparatus control system 1608, the second processor 1702, the second I/O device interface unit 1708, the antenna 1604, second decoder 1710, and/or the like for parsing, by the processor, the encoded data to categorize a plurality of binary bits in the encoded data into a plurality of encoded data portions based on at least the header data.

At step 2706, the decoder apparatus 108 includes means such as the decoder apparatus control system 1608, the second processor 1702, the second I/O device interface unit 1708, the antenna 1604, second decoder 1710, and/or the like for determining, by the processor, a plurality of decoding schemes to decode the plurality of encoded data portions based on the header data.

At step 2708, the decoder apparatus 108 includes means such as the decoder apparatus control system 1608, the second processor 1702, the second I/O device interface unit 1708, the antenna 1604, second decoder 1710, and/or the like for decoding, by the processor, the plurality of encoded data portions using the plurality of decoding schemes to generate data, wherein a first encoded data portion of the plurality of encoded data portions is decoded using a first decoding scheme of the plurality of decoding schemes and a second encoded data portion of the plurality of encoded data portions is decoded using a second decoding scheme of the plurality of decoding schemes, and wherein the first decoding scheme is different from the second decoding scheme.

In some example embodiments, certain ones of the operations herein may be modified or further amplified as described below. Moreover, in some embodiments additional optional operations may also be included. It should be appreciated that each of the modifications, optional additions or amplifications described herein may be included with the operations herein either alone or in combination with any others among the features described herein.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The hardware used to implement the various illustrative logics, logical blocks, modules, and circuits described in connection with the aspects disclosed herein may include a general purpose processor, a digital signal processor (DSP), a special-purpose processor such as an application specific integrated circuit (ASIC) or a field programmable gate array (FPGA), a programmable logic device, discrete gate or transistor logic, discrete hardware components, or any combination thereof designed to perform the functions described herein. A general-purpose processor may be a microprocessor, but, in the alternative, the processor 402 may be any processor, controller, or state machine. A processor 402 may also be implemented as a combination of computing devices, e.g., a combination of a DSP and a microprocessor, a plurality of microprocessors, one or more microprocessors in conjunction with a DSP core, or any other such configuration. Alternatively or in addition, some steps or methods may be performed by circuitry that is specific to a given function.

In one or more example embodiments, the functions described herein may be implemented by special-purpose hardware or a combination of hardware programmed by firmware or other software. In implementations relying on firmware or other software, the functions may be performed as a result of execution of one or more instructions stored on one or more non-transitory computer-readable media and/or one or more non-transitory processor 402-readable media. These instructions may be embodied by one or more processor 402-executable software modules that reside on the one or more non-transitory computer-readable or processor 402-readable storage media. Non-transitory computer-readable or processor 402-readable storage media may in this regard comprise any storage media that may be accessed by a computer or a processor 402. By way of example but not limitation, such non-transitory computer-readable or processor 402-readable media may include RAM, ROM, EEPROM, FLASH memory, disk storage, magnetic storage devices, or the like. Disk storage, as used herein, includes compact disc (CD), laser disc, optical disc, digital versatile disc (DVD), floppy disk, and Blu-ray Disc™, or other storage devices that store data magnetically or optically with lasers. Combinations of the above types of media are also included within the scope of the terms non-transitory computer-readable and processor 402-readable media. Additionally, any combination of instructions stored on the one or more non-transitory processor 402-readable or computer-readable media may be referred to herein as a computer program product.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components may be used in conjunction with the supply management system. Therefore, it is to be understood that the inventions are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

The invention claimed is:

1. A method for decoding data packet comprising:
retrieving, by a processor, header data and encoded data from a data packet received from a storage media;
parsing, by the processor, the encoded data to categorize a plurality of binary bits in the encoded data into a plurality of encoded data portions based on at least the header data, wherein parsing the encoded data comprises determining semantic information associated with the encoded data based on the header data, wherein the encoded data is categorized into the plurality of encoded data portions based on the semantic information;
determining, by the processor, a plurality of decoding schemes to decode the plurality of encoded data portions based on the header data; and
decoding, by the processor, at least one of the plurality of encoded data portions using the plurality of decoding schemes to generate at least one of a first data portion and a second data portion, wherein a first encoded data portion of the plurality of encoded data portions is decoded using a first decoding scheme of the plurality of decoding schemes and a second encoded data portion of the plurality of encoded data portions is decoded using a second decoding scheme of the plurality of decoding schemes different from the first decoding scheme.

2. The method of claim 1, wherein the first encoded data portion is encoded using a first encoding scheme and the second encoded data portion is encoded using a second encoding scheme, wherein the first encoding scheme is determined in response to determining that a count of characters in the first data portion is a multiple of an integer in a first range between a first threshold count value and a second count threshold value.

3. The method of claim 1, wherein parsing, by the processor, the encoded data further comprises:
retrieving a binary bit of the plurality of binary bits from the encoded data; and
categorizing the binary bit into an encoded data portion of the plurality of encoded data portions based on one or more characteristics associated with the binary bit, wherein the one or more characteristics includes a position of the binary bit in the encoded data that is representative of semantic information associated with the binary bit, and wherein the semantic information associated with the position of each of one or more characters in the encoded data comprises a shipping number, a service level, an identifier number, and a zip code.

4. The method of claim 1, wherein the storage media corresponds to at least one of a print media, or a Radio Frequency (RF) tag.

5. The method of claim 2, further comprising:
categorizing a first set of binary bits of the encoded data into the first encoded data portion and a second set of binary bits of the encoded data into the second encoded data portion; and
determining that the first set of binary bits in the first encoded data portion and the second set of binary bits in the second encoded data portion are generated by encoding a first set of characters in the first data portion and a second set of characters in the second data portion using the first encoding scheme and the second encoding scheme, respectively.

6. The method of claim 1, further comprising determining a data category based on the header data, wherein the data category is at least one of: shipping number or SKU.

7. The method of claim 1, wherein the first decoding scheme is a Uniform Resource Names (URN) 40 decoding scheme, and wherein the second decoding scheme is a URN 40 lite decoding scheme.

8. The method of claim 2, wherein the first encoding scheme is a Uniform Resource Names (URN) 40 encoding scheme, and wherein the second encoding scheme is a URN 40 lite encoding scheme.

9. An apparatus comprising:
a memory device comprising a set of executable instructions;
a processor communicatively coupled to the memory device, the processor configured to:
receive data packet to be decoded from a storage media, wherein the data packet comprises a first data packet field and a second data packet field;
retrieve header data and encoded data from the first data packet field and the second data packet field, respectively;
parse the encoded data to categorize a plurality of binary bits in the encoded data into a plurality of encoded data portions based on at least the header data, wherein parsing the encoded data comprises determining semantic information associated with the encoded data based on the header data, wherein the encoded data is categorized into the plurality of encoded data portions based on the semantic information;
determine a plurality of decoding schemes to decode the plurality of encoded data portions based on the header data; and
decode at least one of the plurality of encoded data portions using the plurality of decoding schemes to generate at least one of a first data portion and a second data portion, wherein a first encoded data portion of the plurality of encoded data portions is decoded using a first decoding scheme of the plurality of decoding schemes and a second encoded data portion of the plurality of encoded data portions is decoded using a second decoding scheme of the plurality of decoding schemes different from the first decoding scheme.

10. The apparatus of claim 9, wherein the first encoded data portion is encoded using a first encoding scheme and the second encoded data portion is encoded using a second encoding scheme, and wherein the first encoding scheme is determined in response to determining that a count of characters in the first data portion is a multiple of an integer in a first range between a first threshold count value and a second count threshold value.

11. The apparatus of claim 9, wherein the processor is further configured to:
retrieve a binary bit of the plurality of binary bits from the encoded data; and
categorize the binary bit into an encoded data portion of the plurality of encoded data portions based on one or more characteristics associated with the binary bit, wherein the one or more characteristics include a position of the binary bit in the encoded data that is representative of semantic information associated with the binary bit.

12. The apparatus of claim 11, wherein the semantic information associated with the position of each of one or more characters in the encoded data comprises a shipping number, a service level, an identifier number, and a zip code.

13. The apparatus of claim 9, wherein the storage media corresponds to at least one of a print media, or a Radio Frequency (RF) tag.

14. The apparatus of claim 10, wherein the processor is further configured to:
categorize a first set of binary bits of the encoded data into the first encoded data portion and a second set of binary bits of the encoded data into the second encoded data portion; and
determine that the first set of binary bits in the first encoded data portion and the second set of binary bits in the second encoded data portion are generated by encoding a first set of characters in the first data portion and a second set of characters in the second data portion using the first encoding scheme and the second encoding scheme, respectively.

15. The apparatus of claim 10, wherein the first encoding scheme is a Uniform Resource Names (URN) 40 encoding scheme, and wherein the second encoding scheme is a URN 40 lite encoding scheme.

16. The apparatus of claim 9, wherein the processor is further configured to determine a data category based on the header data, wherein the data category is one of: shipping number or SKU.

17. The apparatus of claim 9, wherein the first decoding scheme is a Uniform Resource Names (URN) 40 decoding scheme, and wherein the second decoding scheme is a URN 40 lite decoding scheme.

18. A computer-readable medium, comprising a memory that stores computer-executable instructions and a processor that executes the computer-executable instructions to perform operations, comprising:
retrieve header data and encoded data from a data packet received from a storage media;
parse the encoded data to categorize a plurality of binary bits in the encoded data into a plurality of encoded data portions based on at least the header data, wherein parsing the encoded data comprises determining semantic information associated with the encoded data based on the header data, wherein the encoded data is categorized into the plurality of encoded data portions based on the semantic information;
determine a plurality of decoding schemes to decode the plurality of encoded data portions based on the header data; and
decode at least one of the plurality of encoded data portions using the plurality of decoding schemes to generate at least one of a first data portion and a second data portion, wherein a first encoded data portion of the plurality of encoded data portions is decoded using a first decoding scheme of the plurality of decoding schemes and a second encoded data portion of the plurality of encoded data portions is decoded using a second decoding scheme of the plurality of decoding schemes different from the first decoding scheme.

19. The computer-readable medium of claim 18, wherein the first encoded data portion is encoded using a first encoding scheme and the second encoded data portion is encoded using a second encoding scheme, wherein the first encoding scheme is determined in response to determining that a count of characters in the first data portion is a multiple of an integer in a first range between a first threshold count value and a second count threshold value.

20. The computer-readable medium of claim 18, wherein the storage media corresponds to at least one of a print media, or a Radio Frequency (RF) tag.

* * * * *